US011249395B2

(12) United States Patent
Inoue et al.

(10) Patent No.: US 11,249,395 B2
(45) Date of Patent: Feb. 15, 2022

(54) PATTERN FORMING METHOD, METHOD FOR MANUFACTURING ELECTRONIC DEVICE, LAMINATE FILM, AND COMPOSITION FOR FORMING UPPER LAYER FILM

(71) Applicant: FUJIFILM Corporation, Tokyo (JP)

(72) Inventors: Naoki Inoue, Haibara-gun (JP); Naohiro Tango, Haibara-gun (JP); Michihiro Shirakawa, Haibara-gun (JP); Akiyoshi Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 573 days.

(21) Appl. No.: 15/994,521

(22) Filed: May 31, 2018

(65) Prior Publication Data

US 2018/0275518 A1    Sep. 27, 2018

Related U.S. Application Data

(63) Continuation of application No. PCT/JP2016/085798, filed on Dec. 1, 2016.

(30) Foreign Application Priority Data

Dec. 2, 2015   (JP) .............................. JP2015-235769

(51) Int. Cl.
| G03F 7/11 | (2006.01) |
| G03F 7/20 | (2006.01) |
| G03F 7/09 | (2006.01) |
| C08F 220/16 | (2006.01) |
| C08F 220/28 | (2006.01) |
| G03F 7/16 | (2006.01) |
| G03F 7/32 | (2006.01) |
| G03F 7/38 | (2006.01) |
| G03F 7/40 | (2006.01) |

(52) U.S. Cl.
CPC .............. *G03F 7/11* (2013.01); *C08F 220/16* (2013.01); *C08F 220/28* (2013.01); *G03F 7/091* (2013.01); *G03F 7/162* (2013.01); *G03F 7/168* (2013.01); *G03F 7/2006* (2013.01); *G03F 7/2041* (2013.01); *G03F 7/32* (2013.01); *G03F 7/38* (2013.01); *G03F 7/40* (2013.01); *C08F 220/283* (2020.02)

(58) Field of Classification Search
CPC . C08L 33/16; G03F 7/11; G03F 7/091; G03F 7/162; G03F 7/168; G03F 7/2006; G03F 7/2041; G03F 7/32; G03F 7/38; G03F 7/40

See application file for complete search history.

(56) References Cited

U.S. PATENT DOCUMENTS

| 8,088,537 B2 | 1/2012 | Hatakeyama et al. |
| 8,580,482 B2 | 11/2013 | Chiba et al. |
| 9,810,988 B2 | 11/2017 | Wang et al. |
| 2005/0014090 A1 | 1/2005 | Hirayama et al. |
| 2008/0187860 A1 | 8/2008 | Tsubaki et al. |
| 2009/0197200 A1 | 8/2009 | Hatakeyama et al. |
| 2009/0253077 A1 | 10/2009 | Shirai et al. |
| 2011/0262859 A1 | 10/2011 | Kusabiraki et al. |
| 2012/0171613 A1 | 7/2012 | Sugie et al. |
| 2013/0244180 A1 | 9/2013 | Bae et al. |
| 2013/0244438 A1 | 9/2013 | Bae et al. |
| 2014/0113223 A1 | 4/2014 | Kato et al. |
| 2017/0199461 A1* | 7/2017 | Yamamoto ............ G03F 7/2041 |

FOREIGN PATENT DOCUMENTS

| CN | 101031597 A | 9/2007 |
| CN | 104919370 A | 9/2015 |
| EP | 2 204 694 A1 | 7/2010 |
| JP | 2008-292975 A | 12/2008 |
| JP | 2009-205132 A | 9/2009 |
| JP | 2009-265647 A | 11/2009 |
| JP | 2010-128136 A | 6/2010 |

(Continued)

OTHER PUBLICATIONS

English translation of JP 2010-128136 A machine generated from Japan Platform for Patent information, Ile J-PlatPat on Jan. 23, 2020, 26 pages. (Year: 2020).*
English translation of JP 2010-134368 A machine generated from Japan Platform for Patent information, Ile J-PlatPat on Jan. 23, 2020, 35 pages. (Year: 2020).*
English translation of JP 2013-080018 A machine generated from Japan Platform for Patent information, Ile J-PlatPat on Jan. 23, 2020, 54 pages. (Year: 2020).*
English translation of text of WO 2016/052273 A1 obtained from ESPACENET on Apr. 5, 2021 (Claims and Description), 70 pages (Year: 2021).*

(Continued)

*Primary Examiner* — Peter L Vajda
*Assistant Examiner* — Richard David Champion
(74) *Attorney, Agent, or Firm* — Sughrue Mion, PLLC

(57) ABSTRACT

One embodiment of the present invention provides a pattern forming method including a step for forming an actinic ray-sensitive or radiation-sensitive film on a substrate using an actinic ray-sensitive or radiation-sensitive resin composition, a step for forming an upper layer film on the actinic ray-sensitive or radiation-sensitive film using a composition for forming an upper layer film, a step for exposing a laminate film including the actinic ray-sensitive or radiation-sensitive film and the upper layer film, and a step for developing the exposed laminate film using a developer including an organic solvent. The composition for forming an upper layer film contains a resin (XA), a resin (XB) containing fluorine atoms, a basic compound (XC), and a solvent (XD), and the resin (XA) is a resin not containing fluorine atoms, or in a case where the resin (XA) contains fluorine atoms, the resin (XA) is a resin having a lower content of fluorine atoms than that in the resin (XB), based on a mass.

10 Claims, No Drawings

(56) References Cited

FOREIGN PATENT DOCUMENTS

| | | | | |
|---|---|---|---|---|
| JP | 2010-134368 | A | 6/2010 | |
| JP | 2011-141494 | A | 7/2011 | |
| JP | 2013-033227 | A | 2/2013 | |
| JP | 2013-061647 | A | 4/2013 | |
| JP | 2013-061648 | A | 4/2013 | |
| JP | 2013-080018 | A | 5/2013 | |
| JP | 2014-056194 | A | 3/2014 | |
| TW | 200949451 | A | 12/2009 | |
| WO | 2004/068242 | A1 | 8/2004 | |
| WO | 2011/034099 | A1 | 3/2011 | |
| WO | 2016/052384 | A1 | 4/2016 | |
| WO | WO-2016052273 | A1 * | 4/2016 | ............. G03F 7/168 |

OTHER PUBLICATIONS

Office Action dated Aug. 16, 2019 issued by the Korean Intellectual Property Office in counterpart Korean Application No. 10-2018-7018076.
Office Action dated Feb. 20, 2020 from Taiwanese Patent Office in TW Application No. 105139637.
Extended European Search Report dated Aug. 23, 2018 from the European Patent Office in counterpart European Application No. 16870797.4.
International Search Report of PCT/JP2016/085798 dated Feb. 21, 2017.
Written Opinion, dated Feb. 21, 2017 from the International Bureau in counterpart International application No. PCT/JP2016/085798.
International Preliminary Report on Patentability and Translation of Written Opinion dated Jun. 5, 2018 from the International Bureau in counterpart International application No. PCT/JP2016/085798.
Office Action dated Mar. 26, 2019, from the Japanese Patent Office in counterpart Japanese application No. 2017-554188.
Office Action dated Aug. 6, 2019 from the Japanese Patent Office in counterpart Japanese Application No. 2017-554188.
Communication dated Sep. 3, 2020, from The State Intellectual Property Office of the P R. of China in Chinese Application No. 201680070315.0
Office Action dated Oct. 26, 2021 in European Application No. 16870797.4.

* cited by examiner

PATTERN FORMING METHOD, METHOD FOR MANUFACTURING ELECTRONIC DEVICE, LAMINATE FILM, AND COMPOSITION FOR FORMING UPPER LAYER FILM

CROSS-REFERENCE TO RELATED APPLICATIONS

This application is a Continuation Application of PCT Application No. PCT/JP2016/085798, filed Dec. 1, 2016, and based upon and claiming the benefit of priority from Japanese Patent Application No. 2015-235769, filed Dec. 2, 2015, the entire contents of which are incorporated herein by reference.

BACKGROUND OF THE INVENTION

1. Field of the Invention

The present invention relates to a pattern forming method and a method for manufacturing an electronic device, including the pattern forming method, and a laminate film and a composition for forming an upper layer film, both of which are suitably used in the pattern forming method.

More specifically, the present invention relates to a pattern forming method which can be used for a process for manufacturing a semiconductor such as an integrated circuit (IC), a process for manufacturing a circuit board for a liquid crystal, a thermal head, or the like, and other photofabrication processes, and a method for manufacturing an electronic device, including the pattern forming method, and a laminate film and a composition for forming an upper layer film which is used to form the laminate film.

2. Description of the Related Art

Since a resist for a KrF excimer laser (248 nm) was developed, an image forming method referred to as chemical amplification as an image forming method of a resist has been used in order to compensate for desensitization caused by light absorption. By using an example of an image forming method with positive tone chemical amplification, the method is an image forming method in which an acid generator included in an exposed area decomposes upon exposure to generate an acid; in a post-exposure bake (PEB), an alkali-insoluble group is changed into an alkali-soluble group by using the generated acid as a reaction catalyst, and the exposed area is removed by alkali development.

On the other hand, not only a positive tone image forming method has been developed, but also a negative tone image forming method (hereinafter also referred to as an "NTI process" (also referred to as a negative tone imaging: NTI)) using a developer including an organic solvent (hereinafter also referred to as an "organic solvent developer") has recently been developed (see, for example, JP2008-292975A and JP2011-141494A).

Moreover, in order to make semiconductor elements finer, the wavelength of an exposure light source has been shortened and a projection lens with a high numerical aperture (high NA) has been advanced. Thus, an exposure machine using an ArF excimer laser having a wavelength of 193 nm as a light source has been currently developed. In addition, as a technique for further improving resolving power, a so-called liquid immersion method in which a space between a projection lens and a sample is filled with a liquid having a high refractive index (hereinafter also referred to as an "immersion liquid") has been proposed from the related art.

It is pointed out that in a case where a chemically amplified resist is applied to liquid immersion exposure, a resist layer is brought into contact with an immersion liquid during exposure, and therefore, the resist layer is modified or components adversely affecting the immersion liquid are exuded from the resist layer. In WO04-068242A, an example in which resist performance changes by immersing a resist for ArF exposure in water before and after the exposure is described, and the example is pointed out as a problem in liquid immersion exposure.

As a solution for avoiding such a problem, a method in which a topcoat (hereinafter also referred to as an "upper layer film") is provided between a resist and a lens to prevent the resist and water from being into direct contact with each other is known (see, for example, JP2014-056194A, JP2013-061647A, and JP2013-061648A).

In a case where an acid is excessively generated in the resist surface layer by the decomposition of an acid generator upon exposure, there is a risk of causing an excessive deprotection reaction of an acid-decomposable group in the surface layer. In an NTI process in which an exposed area remains as a pattern after development for such a reason, the pattern is easily in a T-top shape. In a case where the pattern is in the T-top shape, for example, performance such as depth of focus (DOF) and exposure latitude (EL) is deteriorated. In this regard, for example, JP2013-061647A and JP2013-061648A disclose a technique in which a basic quencher is added to a topcoat (upper layer film) that covers a resist film for the purpose of neutralizing an excessive acid generated in the resist surface.

SUMMARY OF THE INVENTION

As a result of extensive studies conducted by the present inventors, it could be seen that an acid that is excessively generated in a resist surface layer can be neutralized upon exposure by adding a basic quencher to a topcoat (upper layer film) to solve the problems of the deterioration of depth of focus (DOF) or exposure latitude (EL) to some degrees, but further solutions are required in order to obtain desired DOF or EL.

The present invention has been developed in consideration of these circumstances, and has an object to provide a pattern forming method which is capable of forming a pattern having excellent depth of focus (DOF) and exposure latitude (EL) in an NTI process, that is, a negative tone image forming process using an organic solvent developer, and a method for manufacturing an electronic device, including the pattern forming method. The present invention has another object to provide a laminate film and a composition for forming an upper layer film, both of which are suitably used in the pattern forming method.

In one embodiment, the present invention is as follows.
[1] A pattern forming method comprising:
  a step of forming an actinic ray-sensitive or radiation-sensitive film on a substrate, using an actinic ray-sensitive or radiation-sensitive resin composition;
  a step of forming an upper layer film on the actinic ray-sensitive or radiation-sensitive film, using a composition for forming an upper layer film;
  a step of exposing a laminate film including the actinic ray-sensitive or radiation-sensitive film and the upper layer film; and a step of subjecting the exposed laminate film to development using a developer including an organic solvent,
in which the composition for forming an upper layer film contains a resin (XA), a resin (XB) containing fluorine atoms, a basic compound (XC), and a solvent (XD), and the resin (XA) is a resin not containing fluorine atoms, or in a case where the resin (XA) contains fluorine atoms, the resin (XA) is a resin having a lower content of fluorine atoms than that in the resin (XB), based on a mass.

[2] The pattern forming method as described in [1],
in which the content of the resin (XB) is 20% by mass or less with respect to the total solid content of the composition for forming an upper layer film.

[3] The pattern forming method as described in [1] or [2],
in which the composition for forming an upper layer film contains at least one secondary alcohol solvent as the solvent (XD).

[4] The pattern forming method as described in any one of [1] to [3],
in which the composition for forming an upper layer film contains at least one secondary alcohol solvent and at least one ether-based solvent as the solvent (XD).

[5] The pattern forming method as described in any one of [1] to [4],
in which the content of fluorine atoms in the resin (XA) is 0% by mass to 5% by mass.

[6] The pattern forming method as described in any one of [1] to [5],
in which the content of fluorine atoms in the resin (XB) is 15% by mass or more.

[7] The pattern forming method as described in any one of [1] to [6],
in which the difference between the content of fluorine atoms in the resin (XA) and the content of fluorine atoms in the resin (XB) is 10% by mass or more.

[8] The pattern forming method as described in any one of [1] to [7],
in which the resin (XA) is a resin not containing fluorine atoms.

[9] The pattern forming method as described in any one of [1] to [8],
in which the composition for forming an upper layer film contains at least one of an amine compound or an amide compound as the basic compound (XC).

[10] The pattern forming method as described in any one of [1] to [9],
in which the exposure is liquid immersion exposure.

[11] A method for manufacturing an electronic device, comprising the pattern forming method as described in any one of [1] to [10].

[12] A laminate film comprising:
an actinic ray-sensitive or radiation-sensitive film; and
an upper layer film on the actinic ray-sensitive or radiation-sensitive film,
in which the upper layer film is a film formed using a composition for forming an upper layer film, containing a resin (XA), a resin (XB) containing fluorine atoms, a basic compound (XC), and a solvent (XD), and the resin (XA) is a resin not containing fluorine atoms, or in a case where the resin (XA) contains fluorine atoms, the resin (XA) is a resin having a lower content of fluorine atoms than that in the resin (XB), based on a mass.

[13] A composition for forming an upper layer film formed on an actinic ray-sensitive or radiation-sensitive film, comprising:
a resin (XA);
a resin (XB) containing fluorine atoms;
a basic compound (XC); and
a solvent (XD),
in which the resin (XA) is a resin not containing fluorine atoms, or in a case where the resin (XA) contains fluorine atoms, the resin (XA) is a resin having a lower content of fluorine atoms than that in the resin (XB), based on a mass.

According to the present invention, it is possible to provide a pattern forming method which is capable of forming a pattern having excellent depth of focus (DOF) and exposure latitude (EL) in a negative tone image forming process using an organic solvent developer, and a method for manufacturing an electronic device, including the pattern forming method. According to the present invention, it is also possible to provide a laminate film and a composition for forming an upper layer film, both of which are suitably used in the pattern forming method.

DESCRIPTION OF THE PREFERRED EMBODIMENTS

Hereinafter, embodiments for carrying out the present invention will be described.

Moreover, in citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group).

"Actinic rays" or "radiation" in the present specification means, for example, a bright line spectrum of a mercury lamp, far ultraviolet rays typified by an excimer laser, extreme ultraviolet rays (EUV light), X-rays, electron beams, or the like. In addition, in the present invention, light means actinic rays or radiation. Furthermore, unless otherwise specified, "exposure" in the present specification includes not only exposure by a mercury lamp, far ultraviolet rays typified by an excimer laser, X-rays, EUV light, or the like, but also exposure by writing by particle rays such as electron beams and ion beams.

The pattern forming method according to the present invention includes a step of forming an actinic ray-sensitive or radiation-sensitive film on a substrate, using an actinic ray-sensitive or radiation-sensitive resin composition, a step of forming an upper layer film on the actinic ray-sensitive or radiation-sensitive film, using a composition for forming an upper layer film, a step of exposing a laminate film including the actinic ray-sensitive or radiation-sensitive film and the upper layer film, and a step of subjecting the exposed laminate film to development using a developer including an organic solvent.

In the present invention, use may be made of the composition for forming an upper layer film, which contains a resin (XA), a resin (XB) containing fluorine atoms, a basic compound (XC), and a solvent (XD), in which the resin (XA) is a resin not containing fluorine atoms, or in a case where the resin (XA) contains fluorine atoms, the resin (XA) is a resin having a lower content of fluorine atoms than that in the resin (XB), based on a mass.

As described above, the technique in which the deterioration of DOF or EL performance is suppressed by neutralizing an acid excessively generated in a resist surface layer upon exposure with a basic quencher (basic compound)

which has been added to a topcoat (upper layer film) is well-known (see JP2013-061647A and JP2013-061648A).

The technique is thought to be based on the followings: the basic compound in the topcoat (upper layer film) is transferred into an unexposed area of the actinic ray-sensitive or radiation-sensitive film during a post-exposure bake (PEB), and thus, the diffusion of an acid generated in an exposed area into the unexposed area is suppressed, whereby a contrast in the acid diffusion between the exposed area and the unexposed area increases.

However, as a result of extensive studies conducted by the present inventors, an effect of improving desired EL and DOF performance cannot be obtained by the method, and a reason therefor is presumed to be as follows: volatilization of the basic compound in the topcoat (upper layer film) occurs at the same time during PEB, and thus, an effect of the addition of the basic compound to the topcoat cannot be sufficiently exhibited.

As a result of further extensive studies conducted by the present inventors, it was found that it is possible to remarkably improve EL and DOF by using a basic compound as well as two kinds of resins, that is, a resin containing fluorine atoms (hereinafter also referred to as a "resin (XB)") and a resin not containing fluorine atoms (hereinafter also referred to as a "resin (XA)") or in a case where the resin contains fluorine atoms, the resin is a resin having a lower content of fluorine atoms than that in the resin (XB) in a composition for forming an upper layer film.

The reason therefor is presumed to be as follows: by using a combination of the resin (XA) and the resin (XB), having different contents of fluorine atoms, the surface of the topcoat (upper layer film) is covered with a hydrophobic film of the resin (XB) having a higher content of fluorine atoms, and as a result, the volatilization of the basic compound is suppressed. As a result, the transfer of the basic compound from the topcoat (upper layer film) to an unexposed area of the actinic ray-sensitive or radiation-sensitive film occurs efficiently, which makes it possible to remarkably improve EL and DOF.

Hereinafter, the pattern forming method of the present invention will be first described, and then, the composition for forming an upper layer film (hereinafter also referred to as a "topcoat composition") and an actinic ray-sensitive or radiation-sensitive resin composition, each of which can be suitably used in the pattern forming method of the present invention, will be described.

[Pattern Forming Method]

The pattern forming method of the present invention is a pattern forming method including a step a of forming an actinic ray-sensitive or radiation-sensitive film on a substrate, using an actinic ray-sensitive or radiation-sensitive resin composition, a step b of forming an upper layer film on the actinic ray-sensitive or radiation-sensitive film, using a composition for forming an upper layer film, a step c of exposing a laminate film including the actinic ray-sensitive film and the upper layer film, and a step d of subjecting the exposed laminate film to development using a developer including an organic solvent, <Step a>

In the step a, an actinic ray-sensitive or radiation-sensitive film is formed on a substrate, using the actinic ray-sensitive or radiation-sensitive resin composition of the present invention. Examples of a method for forming the actinic ray-sensitive or radiation-sensitive film on the substrate include a method in which an actinic ray-sensitive or radiation-sensitive resin composition is applied onto a substrate. The application method is not particularly limited, and a spin coating method, a spray method, a roll coating method, a dip method, or the like, which is known in the related art, can be used, with the spin coating method being preferable.

After forming the actinic ray-sensitive or radiation-sensitive film, the substrate may be heated (prebaked (PB)), as desired. Thus, a film from which insoluble residual solvents have been removed can be uniformly formed. The temperature for a prebake after forming the actinic ray-sensitive or radiation-sensitive film in the step a is not particularly limited, but is preferably 50° C. to 160° C., and more preferably 60° C. to 140° C.

The substrate on which the actinic ray-sensitive or radiation-sensitive film is formed is not particularly limited, and it is possible to use a substrate generally used in a process for manufacturing a semiconductor such as an IC, a process for manufacturing a circuit board for a liquid crystal, a thermal head, or the like, and other lithographic processes of photofabrication, and examples thereof include inorganic substrates such as silicon, $SiO_2$, and SiN, and coating type inorganic substrates such as spin on glass (SOG).

Prior to forming the actinic ray-sensitive or radiation-sensitive film, an antireflection film may be applied onto the substrate in advance.

As the antireflection film, any type of an inorganic film type such as titanium, titanium dioxide, titanium nitride, chromium oxide, carbon, and amorphous silicon, and an organic film type formed of a light absorber and a polymer material can be used. In addition, as the organic antireflection film, a commercially available organic antireflection film such as DUV30-series or DUV-40 series manufactured by Brewer Science, Inc., AR-2, AR-3, or AR-5 manufactured by Shipley Company, L.L.C., or ARC series such as ARC29A manufactured by Nissan Chemical Industries, Ltd. can also be used.

<Step b>

In the step b, an upper layer film is formed on the actinic ray-sensitive or radiation-sensitive film formed in the step a, using a composition (topcoat composition) for forming an upper layer film. Examples of a method for forming the upper layer film include a method in which a composition for forming an upper layer film is applied onto an actinic ray-sensitive or radiation-sensitive film. The application method is not particularly limited, and examples thereof include the same method as the above-mentioned application method for the actinic ray-sensitive or radiation-sensitive resin composition.

Thereafter, heating (prebake (PB)) may be carried out. By the prebake after forming the upper layer film, the receding contact angle with respect to water on the surface of the upper layer film can increase, and DOF and EL performance can be improved, which is thus preferable. The receding contact angle with respect to water on the surface of the upper layer film is preferably 80° or more, and more preferably 85° or more. The upper limit value is not particularly limited, but is preferably, for example, 100° or less.

Here, the receding contact angle with respect to water refers to a receding contact angle at a temperature of 23° C. and a relative humidity of 45%.

For the reason that the effects of the present invention are superior, the temperature for the prebake after forming the upper layer film in the step b (hereinafter also referred to as a "PB temperature") is, for example, preferably 100° C. or higher, more preferably 105° C. or higher, still more preferably 110° C. or higher, particularly preferably 120° C. or higher, and most preferably higher than 120° C.

The upper limit value of the PB temperature after forming the upper layer film is not particularly limited, but may be, for example, 200° C. or lower, and is preferably 170° C. or lower, more preferably 160° C. or lower, and still more preferably 150° C. or lower.

In a case where the exposure of the step c which will be described later is liquid immersion exposure, the upper layer film is arranged between the actinic ray-sensitive or radiation-sensitive film and the immersion liquid, and the actinic ray-sensitive or radiation-sensitive film functions as a layer which is not brought into direct contact with the immersion liquid. In this case, preferred characteristics required for the upper layer film (composition for forming an upper layer film) are coating suitability onto the actinic ray-sensitive or radiation-sensitive film, transparency to radiation, particularly to a wavelength of 193 nm, and poor solubility in an immersion liquid (preferably water). Further, it is preferable that the upper layer film is not mixed with the actinic ray-sensitive or radiation-sensitive film, and can be uniformly applied onto the surface of the actinic ray-sensitive or radiation-sensitive film.

Moreover, in order to uniformly apply the composition for forming an upper layer film onto the surface of the actinic ray-sensitive or radiation-sensitive film while not dissolving the actinic ray-sensitive or radiation-sensitive film, it is preferable that the composition for forming an upper layer film contains a solvent in which the actinic ray-sensitive or radiation-sensitive film is not dissolved. It is more preferable that as the solvent in which the actinic ray-sensitive or radiation-sensitive film is not dissolved, a solvent of components other than a developer including an organic solvent which will be described later (hereinafter also referred to as an "organic developer"). A method for applying the composition for forming an upper layer film is not particularly limited, and a spin coating method, a spray method, a roll coating method, a dip method, or the like known in the related art can be used.

From the viewpoint of the transparency to a wavelength at 193 nm, it is preferable that the composition for forming an upper layer film contains a resin substantially not containing aromatics.

The film thickness of the upper layer film is not particularly limited, but from the viewpoint of transparency to an exposure light source, the topcoat with a thickness of usually 5 nm to 300 nm, preferably 10 nm to 300 nm, more preferably 20 nm to 200 nm, and still more preferably 30 nm to 100 nm is formed.

After forming the upper layer film, the substrate is heated, as desired.

From the viewpoint of resolution, it is preferable that the refractive index of the upper layer film is close to that of the actinic ray-sensitive or radiation-sensitive film.

The upper layer film is preferably insoluble in an immersion liquid, and more preferably insoluble in water.

Furthermore, an advancing contact angle with respect to water on a surface of the upper layer film is not particularly limited, but is preferably 90° to 1200, and more preferably 90° to 110°.

In the present invention, the receding contact angle and the advancing contact angle of water on a surface of the upper layer film are measured as follows.

The composition for forming an upper layer film is applied onto a silicon wafer by spin coating, and dried at 100° C. for 60 seconds to form a film (with a film thickness of 120 nm), and the advancing contact angle and the receding contact angle of water droplets are measured by an expansion/contraction method, using a dynamic contact angle meter (for example, manufactured by Kyowa Interface Science Co. Ltd.).

That is, liquid droplets (initial liquid droplet size of 35 μL) were added dropwise onto the surface of a film (topcoat), and then discharged or sucked at a rate of 6 μL/sec for 5 seconds, and the advancing contact angle at which the dynamic contact angle during the discharge is stabilized, and the receding contact angle at which the dynamic contact angle during the suction is stabilized are determined. The measurement environment is at 23° C.±3° C. and the relative humidity is 45%±5%.

In the liquid immersion exposure, in a view that the immersion liquid needs to move on a wafer following the movement of an exposure head that is scanning the wafer at a high speed and forming an exposure pattern, the contact angle of the immersion liquid with respect to the actinic ray-sensitive or radiation-sensitive film in a dynamic state is important, and in order to obtain better resist performance, the immersion liquid preferably has a receding contact angle in the above range.

In a case where the upper layer film is released, an organic developer which will be described later may be used, and another release agent may also be used. As the release agent, a solvent hardly permeating the actinic ray-sensitive or radiation-sensitive film is preferable. In a view that the release of the upper layer film can be carried out simultaneously with the development of the actinic ray-sensitive or radiation-sensitive film, the upper layer film is preferably releasable with an organic developer. The organic developer used for the release is not particularly limited as long as it makes it possible to dissolve and remove a less exposed area of the actinic ray-sensitive or radiation-sensitive film. The organic developer can be selected from developers including a polar solvent such as a ketone-based solvent, an ester-based solvent, an alcohol-based solvent, an amide-based solvent, and an ether-based solvent, and a hydrocarbon-based solvent, which will be described later. A developer including a ketone-based solvent, an ester-based solvent, an alcohol-based solvent, or an ether-based solvent is preferable, a developer including an ester-based solvent is more preferable, and a developer including butyl acetate is still more preferable.

From the viewpoint of the release using an organic developer, the dissolution rate of the upper layer film in the organic developer is preferably 1 to 300 nm/sec, and more preferably 10 to 100 nm/sec.

Here, the dissolution rate of an upper layer film in the organic developer refers to a film thickness decreasing rate in a case where the upper layer film is exposed to a developer after film formation, and is a rate in a case where the upper layer film is immersed in a butyl acetate solution at 23° C. in the present invention.

An effect of reducing development defects after developing an actinic ray-sensitive or radiation-sensitive film is accomplished by setting the dissolution rate of an upper layer film in the organic developer to 1 nm/sec or more, and preferably 10 nm/sec or more. Further, an effect that the line edge roughness of a pattern after the development of the actinic ray-sensitive or radiation-sensitive film becomes better is accomplished as an effect of reducing the exposure unevenness during liquid immersion exposure by setting the dissolution rate to 300 nm/sec or less, and preferably 100 nm/sec.

The upper layer film may also be removed using other known developers, for example, an aqueous alkali solution. Specific examples of the usable aqueous alkali solution include an aqueous tetramethylammonium hydroxide solution.

<Step c>

In the step c, a laminate film including the actinic ray-sensitive or radiation-sensitive film and the upper layer film formed thereon is subjected to exposure. The exposure in the step c can be carried out by a generally known method, and for example, the actinic ray-sensitive or radiation-sensitive film having the upper layer film formed thereon is irradiated with actinic rays or radiation through a predetermined mask. Here, the actinic ray-sensitive or radiation-sensitive film is preferably irradiated with actinic rays or radiation through an immersion liquid, but is not limited thereto. The exposure dose can be appropriately set, but is usually 1 to 100 mJ/cm$^2$.

The wavelength of the light source used in the exposure device in the present invention is not particularly limited, but light at a wavelength of 250 nm or less is preferably used, and examples thereof include KrF excimer laser light (248 nm), ArF excimer laser light (193 nm), F$_2$ excimer laser light (157 nm), EUV light (13.5 nm), and electron beams. Among these, ArF excimer laser light (193 nm) is preferably used.

In a case of carrying out liquid immersion exposure, before the exposure and/or after the exposure, the surface of the film may be washed with a water-based chemical before carrying out the heating (PEB) which will be described later.

The immersion liquid is preferably a liquid which is transparent to exposure wavelength and has a minimum temperature coefficient of a refractive index so as to minimize the distortion of an optical image projected on the film. In particular, in a case where the exposure light source is an ArF excimer laser light (wavelength; 193 nm), water is preferably used in terms of easy availability and easy handling, in addition to the above-mentioned viewpoints.

In a case of using water, an additive (liquid) that decreases the surface tension of water while increasing the interfacial activity may be added at a slight proportion. It is preferable that this additive does not dissolve the actinic ray-sensitive or radiation-sensitive film on a substrate, and has a negligible effect on the optical coat at the undersurface of a lens element. Water to be used is preferably distilled water. Further, pure water which has been subjected to filtration through an ion exchange filter or the like may also be used. Thus, it is possible to suppress the distortion of an optical image projected on the actinic ray-sensitive or radiation-sensitive film by the incorporation of impurities.

In addition, in a view of further improving the refractive index, a medium having a refractive index of 1.5 or more can also be used. This medium may be an aqueous solution or an organic solvent.

The pattern forming method of the present invention may also have the step c (exposing step) carried out plural times. In the case, exposure to be carried out plural times may use the same light source or different light sources, but for the first exposure, ArF excimer laser light (wavelength; 193 nm) is preferably used.

After the exposure, it is preferable to perform heating (bake, also referred to as PEB) and development (preferably further rinsing). Thus, a good pattern can be obtained. The temperature for PEB is not particularly limited as long as a good resist pattern is obtained, and is usually 40° C. to 160° C. PEB may be carried out once or plural times.

<Step d>

In the step d, a negative tone pattern is formed by carrying out development using a developer including an organic solvent. The step d is preferably a step of removing soluble areas of the actinic ray-sensitive or radiation-sensitive film simultaneously.

Examples of the developer (organic developer) containing an organic solvent, which is used in the step d, include developers containing a polar solvent such as a ketone-based solvent, an ester-based solvent, an alcohol-based solvent, an amide-based solvent, and an ether-based solvent, and a hydrocarbon-based solvent.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate (PGMEA), ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, propylene glycol, diethylene glycol, and triethylene glycol; and glycol ether-based solvents such as ethylene glycol monomethyl ether, propylene glycol monomethyl ether (PGME), diethylene glycol monomethyl ether, triethylene glycol monoethyl ether, and methoxymethylbutanol.

Examples of the ether-based solvent include, in addition to the glycol ether-based solvents above, dioxane and tetrahydrofuran.

As the amide-based solvent, for example, N-methyl-2-pyrrolidone, N,N-dimethylacetamide, N,N-dimethylformamide, hexamethylphosphoric triamide, 1,3-dimethyl-2-imidazolidinone, or the like can be used.

Examples of the hydrocarbon-based solvent include aromatic hydrocarbon-based solvents such as toluene and xylene; and aliphatic hydrocarbon-based solvents such as pentane, hexane, octane, and decane.

A plurality of these solvents may be mixed and used, or the solvent may be mixed with a solvent other than those described above or with water, and used. However, in order to sufficiently exhibit the effects of the present invention, the moisture content in the entire developer is preferably less than 10% by mass, and it is more preferable that the developer contains substantially no moisture.

That is, the amount of the organic solvent to be used with respect to the organic developer is preferably from 90% by mass to 100% by mass, and more preferably from 95% by mass to 100% by mass, with respect to the total amount of the developer.

Among these, as the organic developer, a developer containing at least one organic solvent selected from the group consisting of a ketone-based solvent, an ester-based solvent, an alcohol-based solvent, an amide-based solvent, and an ether-based solvent is preferable, a developer including a ketone-based solvent or an ester-based solvent is more preferable, and a developer including butyl acetate, butyl propionate, or 2-heptanone is still more preferable.

The vapor pressure of the organic developer is preferably 5 kPa or less, more preferably 3 kPa or less, and still more preferably 2 kPa or less, at 20° C. By setting the vapor pressure of the organic developer to 5 kPa or less, the evaporation on a substrate or in a development cup of the developer is suppressed, and the temperature evenness within a wafer plane is improved, whereby the dimensional evenness within a wafer plane is enhanced.

Specific examples of the solvent having a vapor pressure of 5 kPa or less (2 kPa or less) include the solvents described in paragraph [0165] of JP2014-71304A.

An appropriate amount of a surfactant may be added to the organic developer, as desired.

The surfactant is not particularly limited, but for example, an ionic or nonionic, fluorine-based and/or silicon-based surfactant, or the like can be used. Examples of such a fluorine-based and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), and U.S. Pat. Nos. 5,405,720A, 5,360,692A, 5,529,881A, 5,296,330A, 5,436,098A, 5,576,143A, 5,294,511A, and 5,824,451A, with the nonionic surfactant being preferable. The nonionic surfactant is not particularly limited, but the fluorine-based surfactant or the silicon-based surfactant is more preferably used.

The amount of the surfactant to be used is usually 0.001% to 5% by mass, preferably 0.005% to 2% by mass, and more preferably 0.01% to 0.5% by mass, with respect to the total amount of the developer.

The organic developer may also include a basic compound. Specific and preferred examples of the basic compound which can be included in the organic developer used in the present invention include those which will be described as the basic compounds which can be included in the actinic ray-sensitive or radiation-sensitive resin composition.

Examples of the developing method include a method in which a substrate is immersed in a tank filled with a developer for a certain period of time (a dip method), a method in which a developer is heaped up to the surface of a substrate by surface tension and developed by standing for a certain period of time (a puddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In addition, after the step of carrying out development using a developer including an organic solvent, a step of stopping the development while replacing the solvent with another solvent may also be included.

A washing step using a rinsing liquid may be included after the step of carrying out development using a developer including an organic solvent.

The rinsing liquid is not particularly limited as long as it does not dissolve the resist pattern, and a solution including a general organic solvent can be used. As the rinsing liquid, for example, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent, described above as the organic solvent included in the organic developer is preferably used.

More preferably, a step of carrying out washing using a rinsing liquid containing at least one organic solvent selected from the group consisting of a hydrocarbon-based solvent, a ketone-based solvent, an ester-based solvent, an alcohol-based solvent, and an amide-based solvent is carried out. Still more preferably, a step of carrying out washing using a rinsing liquid containing a hydrocarbon-based solvent, an alcohol-based solvent, or an ester-based solvent is carried out. Particularly preferably, a step of carrying out washing using a rinsing liquid containing a monohydric alcohol is carried out.

Here, examples of the monohydric alcohol used in the rinsing step include linear, branched, or cyclic monohydric alcohols, and specifically, 1-butanol, 2-butanol, 3-methyl-1-butanol, 3-methyl-2-butanol, tert-butyl alcohol, 1-pentanol, 2-pentanol, 3-methyl-2-pentanol, 4-methyl-2-pentanol, 1-hexanol, 2-hexanol, 3-hexanol, 4-methyl-2-hexanol, 5-methyl-2-hexanol, 1-heptanol, 2-heptanol, 3-heptanol, 4-methyl-2-heptanol, 5-methyl-2-heptanol, 1-octanol, 2-octanol, 3-octanol, 4-octanol, 4-methyl-2-octanol, 5-methyl-2-octanol, 6-methyl-2-octanol, 2-nonanol, 4-methyl-2-nonanol, 5-methyl-2-nonanol, 6-methyl-2-nonanol, 7-methyl-2-nonanol, 2-decanol, or the like can be used, with 1-hexanol, 2-hexanol, 1-pentanol, 3-methyl-1-butanol, or 4-methyl-2-heptanol being preferable.

Furthermore, examples of the hydrocarbon-based solvent used in the rinsing step include aromatic hydrocarbon-based solvents such as toluene and xylene; and aliphatic hydrocarbon-based solvents such as pentane, hexane, octane, decane (n-decane), and undecane.

In a case where an ester-based solvent is used as the organic solvent, a glycol ether-based solvent may be used, in addition to the ester-based solvent (one kind, or two or more kinds). As a specific example thereof in this case, an ester-based solvent (preferably butyl acetate) may be used as a main component, and a glycol ether-based solvent (preferably propylene glycol monomethyl ether (PGME)) may be used as a side component. Thus, residue defects are suppressed.

The respective components in plural numbers may be mixed and used, or the components may be mixed with an organic solvent other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure of the rinsing liquid is preferably 0.05 to 5 kPa, more preferably 0.1 to 5 kPa, and still more preferably 0.12 to 3 kPa, at 20° C. By setting the vapor pressure of the rinsing liquid to 0.05 to 5 kPa, the temperature evenness within a wafer plane is improved, and further, the dimensional evenness within a wafer plane is enhanced by inhibition of swelling due to the permeation of the rinsing liquid.

The rinsing liquid can also be used after adding an appropriate amount of a surfactant thereto.

In the rinsing step, the wafer which has been subjected to development using a developer including an organic solvent is subjected to a washing treatment using the rinsing liquid including the organic solvent. A method for the washing treatment is not particularly limited, and for example, a method in which a rinsing liquid is continuously discharged on a substrate rotated at a constant rate (a spin coating method), a method in which a substrate is immersed in a tank filled with a rinsing liquid for a certain period of time (a dip method), a method in which a rinsing liquid is sprayed onto a substrate surface (a spray method), or the like, can be applied. Among these, a method in which a washing treatment is carried out using the spin coating method, and a substrate is rotated at a rotation speed of 2,000 rpm to 4,000 rpm after washing, and then the rinsing liquid is removed from the substrate, is preferable. Further, it is preferable that a heating step (post bake) is included after the rinsing step. The residual developer and the rinsing liquid between and inside the patterns are removed by performing the bake. The heating step after the rinsing step is carried out at typically 40° C. to 160° C., and preferably at 70° C. to 95° C., and typically for 10 seconds to 3 minutes, and preferably for 30 seconds to 90 seconds.

Moreover, in the pattern forming method of the present invention, development using an alkali developer may also be carried out after the development using an organic developer. A portion having weak exposure intensity is removed by development using an organic solvent, and a portion having strong exposure intensity is also removed by carrying out development using an alkali developer. By virtue of multiple development processes in which development is carried out in plural times in this manner, a pattern can be formed by keeping only a region with an intermediate exposure intensity from not being dissolved, so that a finer pattern than usual can be formed (the same mechanism as in [0077] of JP2008-292975A).

As the alkali developer, for example, alkali aqueous solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcoholamines such as dimethyl ethanolamine and triethanolamine; quaternary ammonium salts such as tetramethylammonium hydroxide and tetraethylammonium hydroxide; cyclic amines such as pyrrole and piperidine; or the like can be used. Among these, an aqueous tetraethylammonium hydroxide solution is preferably used.

Moreover, an appropriate amount of alcohols or a surfactant can also be added to the alkali developer and used.

The alkali concentration of the alkali developer is usually 0.01% to 20% by mass.

The pH of the alkali developer is usually 10.0 to 15.0.

The time for carrying out development using an alkali developer is usually 10 to 300 seconds.

The alkali concentration (and the pH) of the alkali developer and the developing time can be appropriately adjusted depending on the patterns formed.

Washing may be carried out using a rinsing liquid after the development using an alkali developer, and as the rinsing liquid, pure water is used, or an appropriate amount of a surfactant may be added thereto before the use.

Furthermore, after the developing treatment or the rinsing treatment, a treatment for removing the developer or rinsing liquid adhering on the pattern by a supercritical fluid may be carried out.

In addition, a heating treatment can be carried out in order to remove moisture content remaining in the pattern after the rinsing treatment or the treatment using a supercritical fluid.

It is preferable that various materials (for example, the actinic ray-sensitive or radiation-sensitive resin composition of the present invention, a developer, a rinsing liquid, a composition for forming an antireflection film, and the composition for forming an upper layer film of the present invention) used in the pattern forming method of the present invention include no impurities such as a metal and a peroxide. The content of the impurities included in these materials is preferably 1 ppm or less, more preferably 100 ppt or less, and still more preferably 10 ppt or less, and particularly preferably, metal components are substantially not contained (no higher than the detection limit of a measurement apparatus).

Examples of a method for removing impurities such as metals from the various materials include filtration using a filter. As for the filter pore diameter, the pore size is preferably 50 nm or less, more preferably 10 nm or less, and still more preferably 5 nm or less. As for the materials of a filter, a polytetrafluoroethylene-made filter, a polyethylene-made filter, and a nylon-made filter are preferable. In the step of filtration using a filter, a plurality of kinds of filters may be connected in series or in parallel, and used. In a case of using a plurality of kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method of selecting raw materials having a low content of metals as raw materials constituting various materials, a method of subjecting raw materials constituting various materials to filtration using a filter, and a method of performing distillation under the condition for suppressing the contamination as much as possible by, for example, lining the inside of a device with TEFLON (registered trademark). The preferred conditions for filtration using a filter, which is carried out for raw materials constituting various materials, are the same as the above-described conditions.

In addition to the filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

A method for improving the surface roughness of the pattern may also be applied to the pattern formed by the pattern forming method of the present invention. Examples of the method for improving the surface roughness of the pattern include a method for treating a resist pattern by plasma of a hydrogen-containing gas disclosed in WO2014/002808A1. In addition, known methods as described in JP2004-235468A, US2010/0020297A, JP2009-19969A, Proc. of SPIE Vol. 8328 83280N-1 "EUV Resist Curing Technique for LWR Reduction and Etch Selectivity Enhancement" may also be applied.

Furthermore, a mold for imprints may be manufactured using the actinic ray-sensitive or radiation-sensitive resin composition of the present invention, and with regard to the details thereof, refer to JP4109085B and JP2008-162101A, for example.

The pattern forming method of the present invention can also be used in formation of a guide pattern (see, for example, ACS Nano Vol. 4 No. 8 Pages 4815 to 4823) in Directed Self-Assembly (DSA).

In addition, the pattern formed by the method can be used as a core material (core) in the spacer process disclosed in, for example, JP1991-270227A (JP-H03-270227A) and JP2013-164509A.

[Composition for Forming Upper Layer Film]

Next, the composition for forming an upper layer film used in the pattern forming method of the present invention will be described.

<Resin>

The composition for forming an upper layer film of the present invention contains at least two kinds of resins, that is, a resin (XA) and a resin (XB). Here, the resin (XB) is a resin containing fluorine atoms, and the resin (XA) is a resin not containing fluorine atoms, or in a case where the resin (XA) contains fluorine atoms, the resin (XA) is a resin having a lower content of fluorine atoms than that in the resin (XB), based on a mass. As described above, by using a combination of the resin (XA) and the resin (XB), which are two kinds of resins having different contents of fluorine atoms, the surface of the upper layer film is covered with a hydrophobic film of the resin (XB) having a higher content of fluorine atoms, and as a result, the volatilization of the basic compound is suppressed. As a result, the transfer of the basic compound to the unexposed area of the actinic ray-sensitive or radiation-sensitive film occurs efficiently, and thus, EL and DOF can be remarkably improved.

[Resin (XA)]

It is preferable that the resin (XA) is transparent to an exposure light source used since light reaches the actinic ray-sensitive or radiation-sensitive film through the upper layer film upon exposure. In a case where the resin (XA) is used for ArF liquid immersion exposure, it is preferable that the resin does not substantially have an aromatic group in terms of transparency to ArF light.

In an embodiment of the present invention, the resin (XA) preferably has a content of fluorine atoms of 5% by mass or less. That is, the content of fluorine atoms in the resin (XA) is preferably 5% by mass or less, more preferably 2.5% by mass or less, and particularly preferably 0% by mass, with respect to the weight-average molecular weight of the resin (XA).

Furthermore, in another embodiment of the present invention, it is preferable that the resin (XA) is a resin having a $CH_3$ partial structure in the side chain moiety.

Here, the $CH_3$ partial structure (hereinafter also simply referred to as a "side chain $CH_3$ partial structure") contained in the side chain moiety in the resin (XA) includes a $CH_3$ partial structure contained in an ethyl group, a propyl group, or the like.

On the other hand, a methyl group bonded directly to the main chain of the resin (XA) (for example, an α-methyl group in the repeating unit having a methacrylic acid structure) is not included in the $CH_3$ partial structure in the present invention.

More specifically, in a case where the resin (XA) contains a repeating unit derived from a monomer having a polymerizable moiety with a carbon-carbon double bond, such as a repeating unit represented by General Formula (M), and in addition, $R_{11}$ to $R_{14}$ are each $CH_3$ "itself", such $CH_3$ is not included in the $CH_3$ partial structure contained in the side chain moiety in the present invention.

On the other hand, a $CH_3$ partial structure which is present via a certain atom from a C—C main chain corresponds to the $CH_3$ partial structure in the present invention. For example, in a case where $R_{11}$ is an ethyl group ($CH_2CH_3$), the resin (XA) has "one" $CH_3$ partial structure in the present invention.

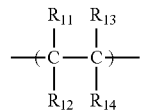

In General Formula (M), $R_{11}$ to $R_{14}$ each independently represent a side chain moiety.

Examples of $R_{11}$ to $R_{14}$ in the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and these groups may further have a substituent.

The resin (XA) is preferably a resin having a repeating unit having the $CH_3$ partial structure in a side chain moiety thereof, and more preferably has, as such a repeating unit, at least one repeating unit (x) of the repeating units represented by General Formula (II) or a repeating unit represented by General Formula (III). In particular, in a case where KrF, EUV, or electron beams (EB) are used as an exposure light source, the resin (XA) can suitably include the repeating unit represented by General Formula (III).

Hereinafter, the repeating unit represented by General Formula (II) will be described in detail.

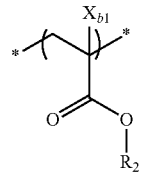

In General Formula (II), $X_{b1}$ represents a hydrogen atom, an alkyl group, a cyano group, or a halogen atom, and $R_2$ represents an organic group having one or more $CH_3$ partial structures, which is stable against an acid. Here, more specifically, the organic group which is stable against an acid is preferably an organic group not having a "group that decomposes by the action of an acid to generate an alkali-soluble group" described in the acid-decomposable resin contained in the actinic ray-sensitive or radiation-sensitive resin composition which will be described later.

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. The cycloalkyl group, the alkenyl group, the cycloalkenyl group, the aryl group, and the aralkyl group may further have an alkyl group as a substituent.

$R_2$ is preferably an alkyl group or an alkyl-substituted cycloalkyl group, which has one or more $CH_3$ partial structures.

The number of the $CH_3$ partial structures contained in the organic group which has one or more $CH_3$ partial structures and is stable against an acid as $R_2$ is preferably from 2 to 10, and more preferably from 3 to 8.

The alkyl group having one or more $CH_3$ partial structures in $R_2$ is preferably a branched alkyl group having 3 to 20 carbon atoms. Specific preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

The cycloalkyl group having one or more $CH_3$ partial structures in $R_2$ may be monocyclic or polycyclic. Specific examples thereof include groups having a monocyclo, bicyclo, tricyclo, or tetracyclo structure having 5 or more carbon atoms. The number of carbon atoms is preferably 6 to 30, and particularly preferably 7 to 25. Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group. More preferred examples of the cycloalkyl group include an adamantyl group, a norbornyl group, a cyclohexyl group, a cyclopentyl group, a tetracyclododecanyl group, and a tricyclodecanyl group, with the norbornyl group, the cyclopentyl group, or the cyclohexyl group being still more preferable. As $R_2$, a cycloalkyl group having one or more $CH_3$ partial structures is preferable, a polycyclic cycloalkyl group having one or more $CH_3$ partial structures is more preferable, a polycyclic cycloalkyl group having two or more $CH_3$ partial structures is still more preferable, and a polycyclic cycloalkyl group having three or more $CH_3$ partial structures is particularly preferable. Among those, a polycyclic cycloalkyl group substituted with three or more alkyl groups is preferable.

The alkenyl group having one or more $CH_3$ partial structures in $R_2$ is preferably a linear or branched alkenyl group having 1 to 20 carbon atoms, with the branched alkenyl group being more preferable.

The aryl group having one or more $CH_3$ partial structures in $R_2$ is preferably an aryl group having 6 to 20 carbon atoms, and examples thereof include a phenyl group and a naphthyl group, with the phenyl group being preferable.

The aralkyl group having one or more $CH_3$ partial structures in $R_2$ is preferably an aralkyl group having 7 to 12 carbon atoms, and examples thereof include a benzyl group, a phenethyl group, and a naphthylmethyl group.

Specific examples of the hydrocarbon group having two or more $CH_3$ partial structures in $R_2$ include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-t-butylcyclohexyl group, and an isobornyl group. The hydrocarbon group is more preferably an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-di-tert-butylcyclohexyl group, a 4-isopropylcyclohexyl group, a 4-t-butylcyclohexyl group, or an isobornyl group.

Specific preferred examples of the repeating unit represented by General Formula (II) are shown below, but the present invention is not limited thereto.

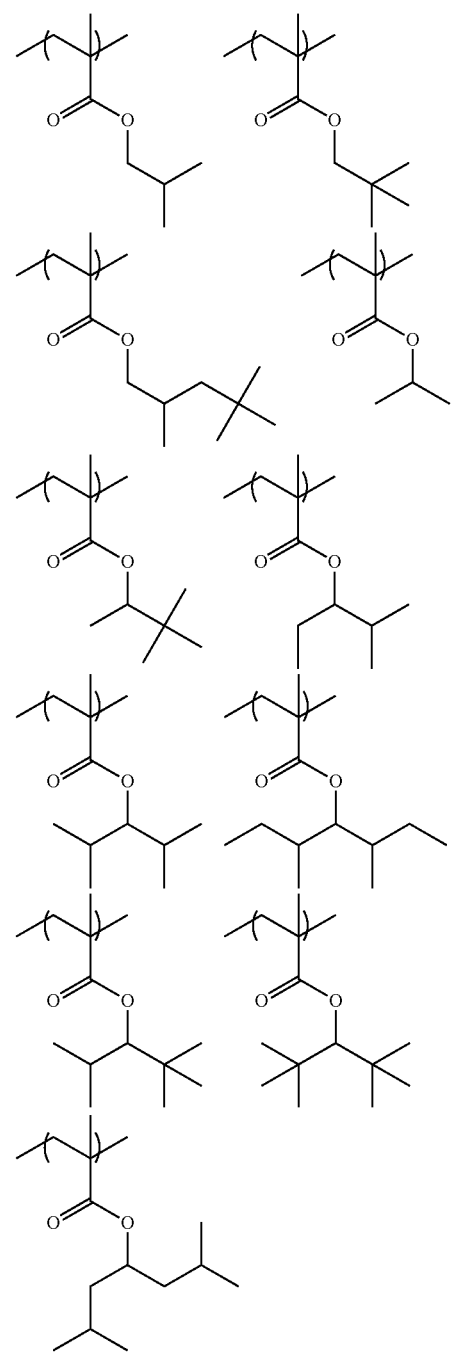

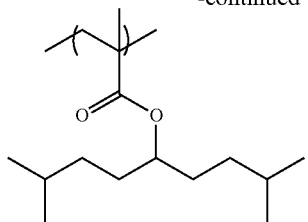
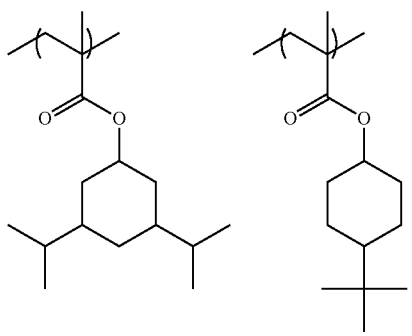
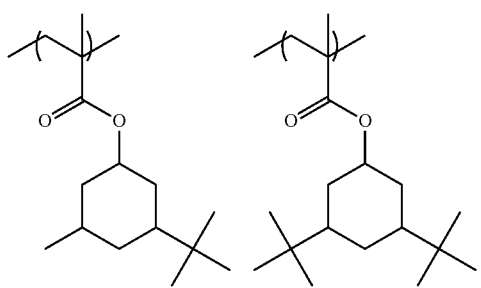
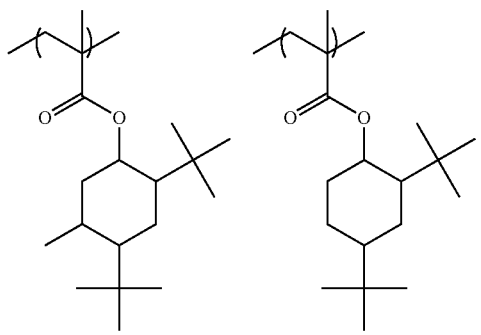
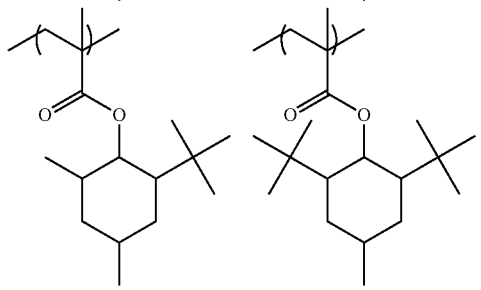

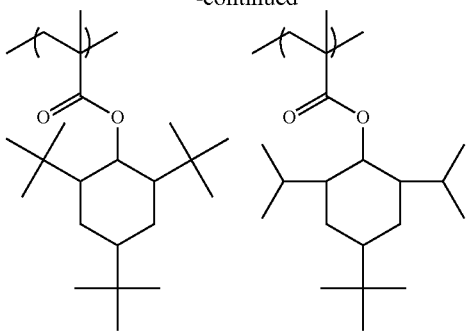
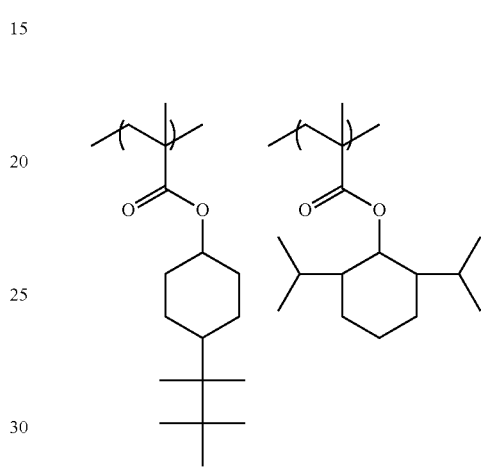
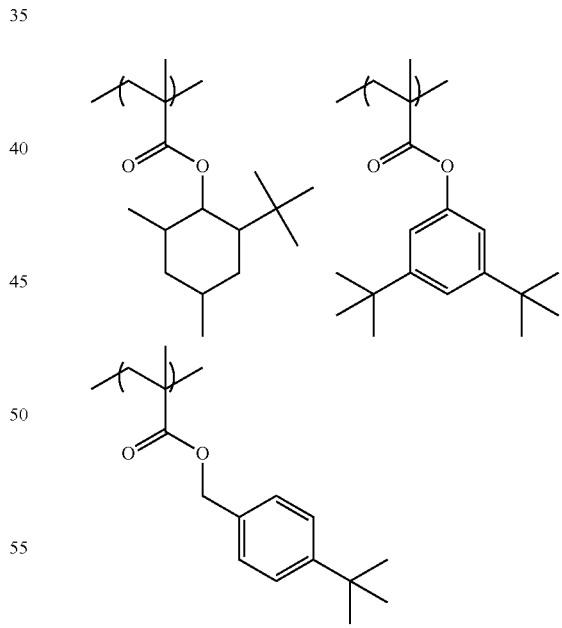

The repeating unit represented by General Formula (II) is preferably a repeating unit which is stable against an acid (non-acid-decomposable), and specifically, it is preferably a repeating unit not having a group capable of decomposing by the action of an acid to generate a polar group.

Hereinafter, the repeating unit represented by General Formula (III) will be described in detail.

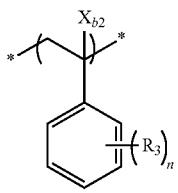
(III)

In General Formula (III), $X_{b2}$ represents a hydrogen atom, an alkyl group, a cyano group, or a halogen atom, $R_3$ represents an organic group having one or more $CH_3$ partial structures, which is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, with the hydrogen atom being preferable.

$X_{b2}$ is preferably a hydrogen atom.

Since $R_3$ is an organic group which is stable against an acid, more specifically, it is preferably an organic group which does not have a "group capable of decomposing by the action of an acid to generate an alkali-soluble group" described in an acid-decomposable resin which will be described later.

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

The alkyl group having one or more $CH_3$ partial structures in $R_3$ is preferably a branched alkyl group having 3 to 20 carbon atoms. Specific preferred examples of the alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

Specific examples of the alkyl group having two or more $CH_3$ partial structures in $R_3$ include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, and a 2,3,5,7-tetramethyl-4-heptyl group. The alkyl group is more preferably one having 5 to 20 carbon atoms, and is an isopropyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, or a 2,3,5,7-tetramethyl-4-heptyl group.

n represents an integer of 1 to 5, preferably an integer of 1 to 3, and more preferably 1 or 2.

Specific preferred examples of the repeating unit represented by General Formula (III) are shown below, but the present invention is not limited thereto.

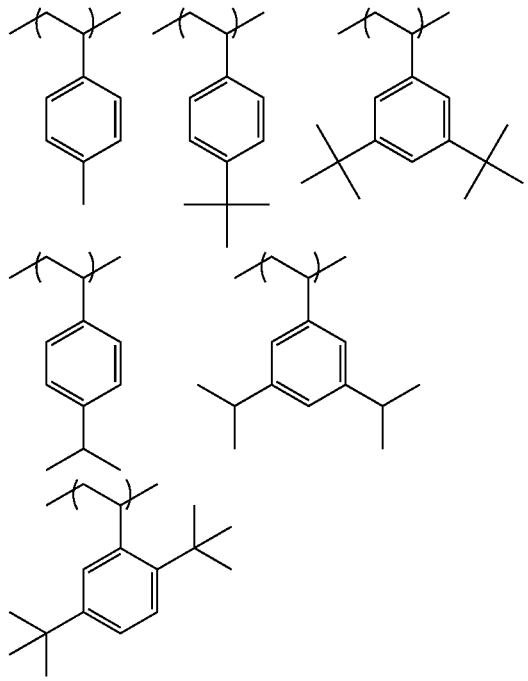

The repeating unit represented by General Formula (III) is preferably a repeating unit which is stable against an acid (non-acid-decomposable), and specifically, it is preferably a repeating unit which does not have a group capable of decomposing by the action of an acid to generate a polar group.

In a case where the resin (XA) includes a $CH_3$ partial structure in the side chain moiety, and has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the resin (XA). The content is usually 100% by mole or less with respect to all the repeating units of the resin (XA).

By incorporation of at least one repeating unit (x) of the repeating unit represented by General Formula (II) or the repeating unit represented by General Formula (III) in a proportion of 90% by mole or more with respect to all the repeating units of the resin (XA), the surface free energy of the resin (XA) increases. As a result, it is difficult for the resin (XA) to be unevenly distributed on the surface of the actinic ray-sensitive or radiation-sensitive composition film and the static/dynamic contact angle of the actinic ray-sensitive or radiation-sensitive film with respect to water can be securely increased, thereby enhancing the immersion liquid tracking properties.

Furthermore, in another embodiment of the present invention, the resin (XA) is preferably a resin containing a repeating unit derived from a monomer containing at least one fluorine atom and/or at least one silicon atom, and more preferably a water-insoluble resin containing a repeating unit derived from a monomer containing at least one fluorine atom and/or at least one silicon atom, within a scope not interfering with the effects obtained by using a combination of two resins having different contents of fluorine atoms, that is, the resin (XA) and the resin (XB). By incorporation of the repeating unit derived from a monomer containing at least one fluorine atom and/or at least one silicon atom, good solubility in an organic solvent developer is obtained and the effects of the present invention are sufficiently obtained.

The fluorine atom or the silicon atom in the resin (XA) may be contained in the main chain of the resin or may be substituted in the side chain.

The resin (XA) is preferably a resin having an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have another substituent.

The cycloalkyl group having a fluorine atom is a monocyclic or polycyclic cycloalkyl group in which at least one hydrogen atom is substituted with a fluorine atom, and may further have another substituent.

Examples of the aryl group having a fluorine atom include an aryl group in which at least one hydrogen atom is substituted with a fluorine atom, such as a phenyl group and a naphthyl group, and the aryl group may further have another substituent.

Specific examples of the alkyl group having a fluorine atom, the cycloalkyl group having a fluorine atom, and the aryl group having a fluorine atom are shown below, but the present invention is not limited thereto.

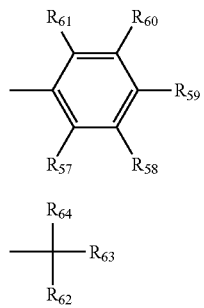

In General Formulae (F2) and (F3), $R_{57}$ to $R_{64}$ each independently represent a hydrogen atom, a fluorine atom, or an alkyl group, provided that at least one of $R_{57}, \ldots,$ or $R_1$ or of $R_{62}, \ldots,$ or $R_{64}$ is a fluorine atom or an alkyl group (preferably having 1 to 4 carbon atoms) in which at least one hydrogen atom is substituted for by a fluorine atom. It is preferable that all of $R_{57}$ to $R_{61}$ are a fluorine atom. $R_{62}$ and $R_{63}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. The hexafluoroisopropyl group, the heptafluoroisopropyl group, the hexafluoro(2-methyl)isopropyl group, the octafluoroisobutyl group, a nonafluoro-t-butyl group, or the perfluoroisopentyl group is preferable, and the hexafluoroisopropyl group or the heptafluoroisopropyl group is more preferable.

The resin (XA) is preferably a resin having an alkylsilyl structure (preferably a trialkylsilyl group) or a cyclic siloxane structure as a partial structure having a silicon atom.

Specific examples of the alkylsilyl structure or the cyclic siloxane structure include groups represented by General Formulae (CS-1) to (CS-3).

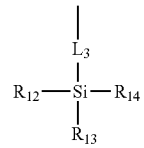

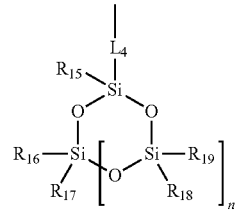

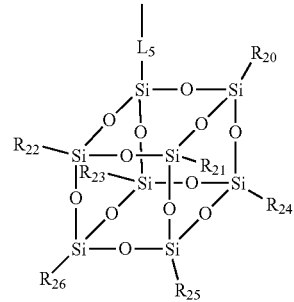

In General Formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms).

$L_3$ to $L_5$ each represent a single bond or a divalent linking group. Examples of the divalent linking group include any one or a combination of two or more groups selected from the group consisting of an alkylene group, a phenyl group, an ether group, a thioether group, a carbonyl group, an ester group, an amido group, a urethane group, and a urea group.

n represents an integer of 1 to 5.

Examples of the resin (XA) include a resin having at least one selected from the group consisting of repeating units represented by General Formulae (C-I) to (C-V).

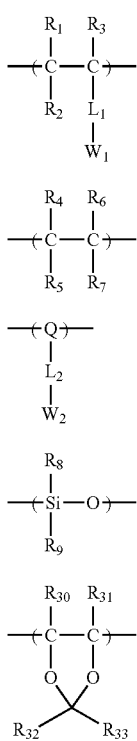

(C-I)
(C-II)
(C-III)
(C-IV)
(C-V)

In General Formulae (C-I) to (C-V), $R_1$ to $R_3$ each independently represent a hydrogen atom, a fluorine atom, a linear or branched alkyl group having 1 to 4 carbon atoms, or a linear or branched fluorinated alkyl group having 1 to 4 carbon atoms.

$W_1$ and $W_2$ each represent an organic group having at least one of a fluorine atom or a silicon atom.

$R_4$ to $R_7$ each independently represent a hydrogen atom, a fluorine atom, a linear or branched alkyl group having 1 to 4 carbon atoms, or a linear or branched fluorinated alkyl group having 1 to 4 carbon atoms, provided that at least one of $R_4$, . . . , or $R_7$ represents a fluorine atom. $R_4$ and $R_5$, or $R_6$ and $R_7$ may be combined to form a ring.

$R_8$ represents a hydrogen atom or a linear or branched alkyl group having 1 to 4 carbon atoms.

$R_9$ represents a linear or branched alkyl group having 1 to 4 carbon atoms or a linear or branched fluorinated alkyl group having 1 to 4 carbon atoms.

$L_1$ and $L_2$ each represent a single bond or a divalent linking group, and are the same as $L_3$ to $L_5$.

Q represents a monocyclic or polycyclic aliphatic group. That is, it represents an atomic group containing two carbon atoms (C—C) bonded to each other for forming an alicyclic structure.

$R_{30}$ and $R_{31}$ each independently represent a hydrogen atom or a fluorine atom.

$R_{32}$ and $R_{33}$ each independently represent an alkyl group, a cycloalkyl group, a fluorinated alkyl group, or a fluorinated cycloalkyl group.

It is to be noted that the repeating unit represented by General Formula (C-V) has at least one fluorine atom in at least one of $R_{30}$, $R_{31}$, $R_{32}$, or $R_{33}$.

The resin (XA) preferably has a repeating unit represented by General Formula (C-I), and more preferably has a repeating unit represented by one of General Formulae (C-Ia) to (C-Id).

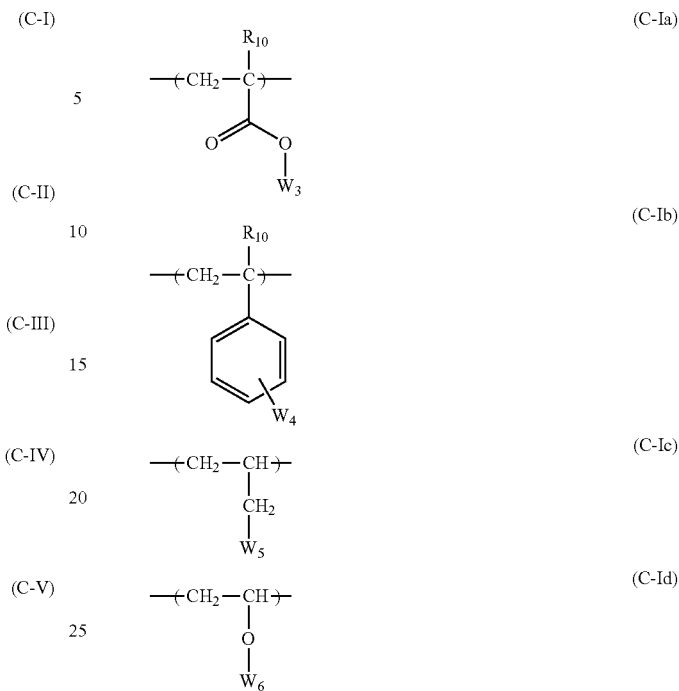

(C-Ia)
(C-Ib)
(C-Ic)
(C-Id)

In General Formulae (C-Ia) to (C-Id), $R_{10}$ and $R_{11}$ each represent a hydrogen atom, a fluorine atom, a linear or branched alkyl group having 1 to 4 carbon atoms, or a linear or branched fluorinated alkyl group having 1 to 4 carbon atoms.

$W_3$ to $W_6$ are each an organic group having one or more of at least one of a fluorine atom or a silicon atom.

In a case where $W_3$ to $W_6$ are each an organic group having a fluorine atom, they are each preferably a fluorinated, linear or branched alkyl group or cycloalkyl group having 1 to 20 carbon atoms, or a linear, branched, or cyclic fluorinated alkyl ether group having 1 to 20 carbon atoms.

Examples of the fluorinated alkyl group represented by one of $W_3$ to $W_6$ include a trifluoroethyl group, a pentafluoropropyl group, a hexafluoroisopropyl group, a hexafluoro (2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, and a perfluoro(trimethyl)hexyl group.

In a case where $W_3$ to $W_6$ are each an organic group having a silicon atom, an alkylsilyl structure or a cyclic siloxane structure is preferable. Specific examples thereof include groups represented by General Formulae (CS-1) to (CS-3).

Specific examples of the repeating unit represented by General Formula (C-I) are shown below. X represents a hydrogen atom, —$CH_3$, —F, or —$CF_3$.

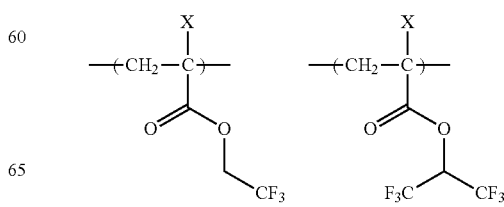

-continued
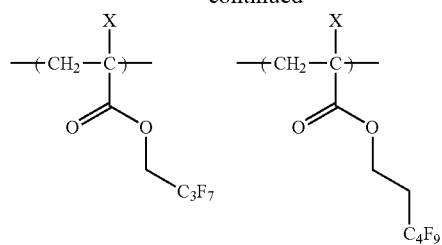
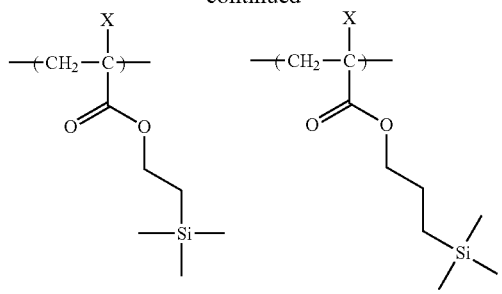
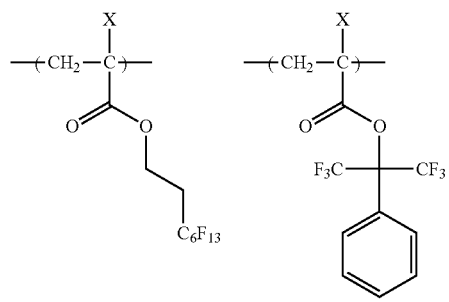
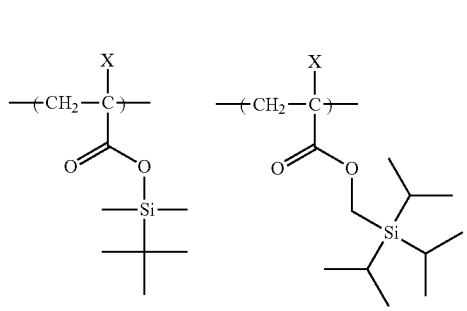
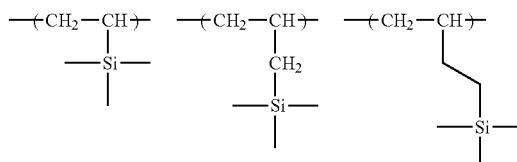
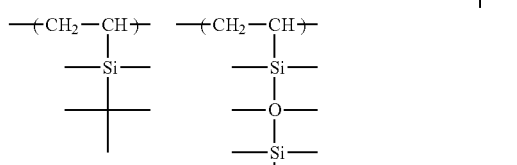
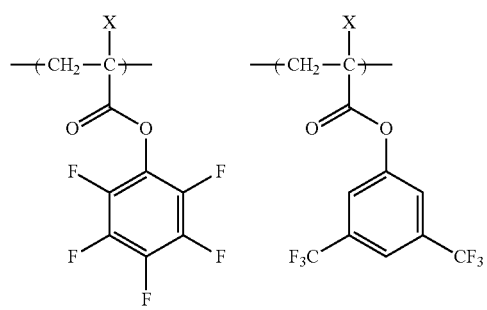
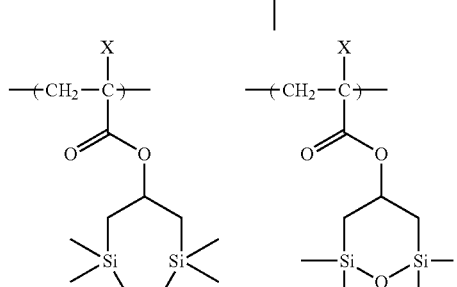
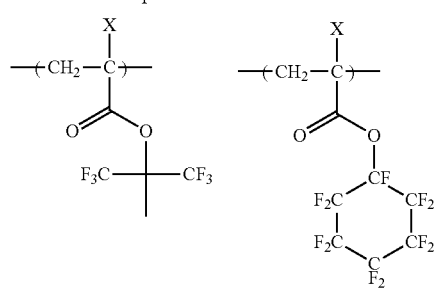
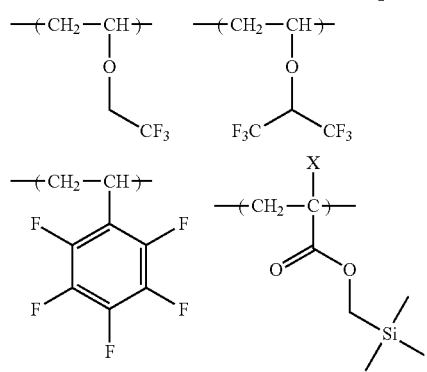
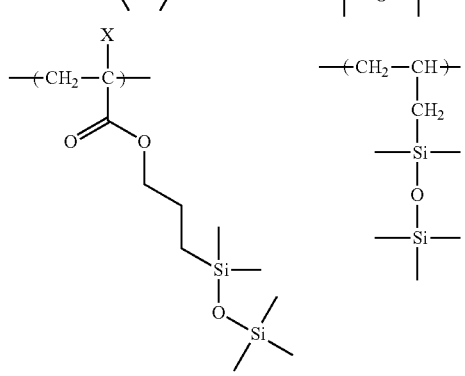

-continued

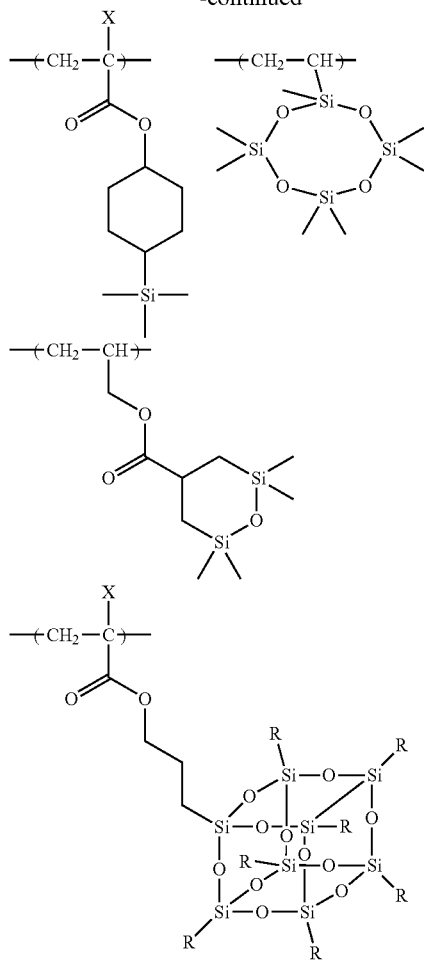

R = CH₃, C₂H₅, C₃H₇, C₄H₉

In order to adjust the solubility in an organic solvent developer, the resin (XA) may have a repeating unit represented by General Formula (Ia).

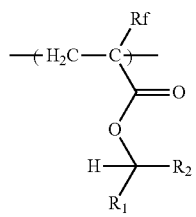

(Ia)

In General Formula (Ia),

Rf represents a fluorine atom or an alkyl group in which at least one hydrogen atom is substituted with a fluorine atom.

$R_1$ represents an alkyl group.

$R_2$ represents a hydrogen atom or an alkyl group.

The alkyl group in which at least one hydrogen atom is substituted with a fluorine atom, in Rf in General Formula (Ia), preferably has 1 to 3 carbon atoms, and more preferably a trifluoromethyl group.

The alkyl group of $R_1$ is preferably a linear or branched alkyl group having 3 to 10 carbon atoms, and more preferably a branched alkyl group having 3 to 10 carbon atoms.

$R_2$ is preferably a linear or branched alkyl group having 1 to 10 carbon atoms, and more preferably a linear or branched alkyl group having 3 to 10 carbon atoms.

Specific examples of the repeating unit represented by General Formula (Ia) are shown below, but the present invention is not limited thereto.

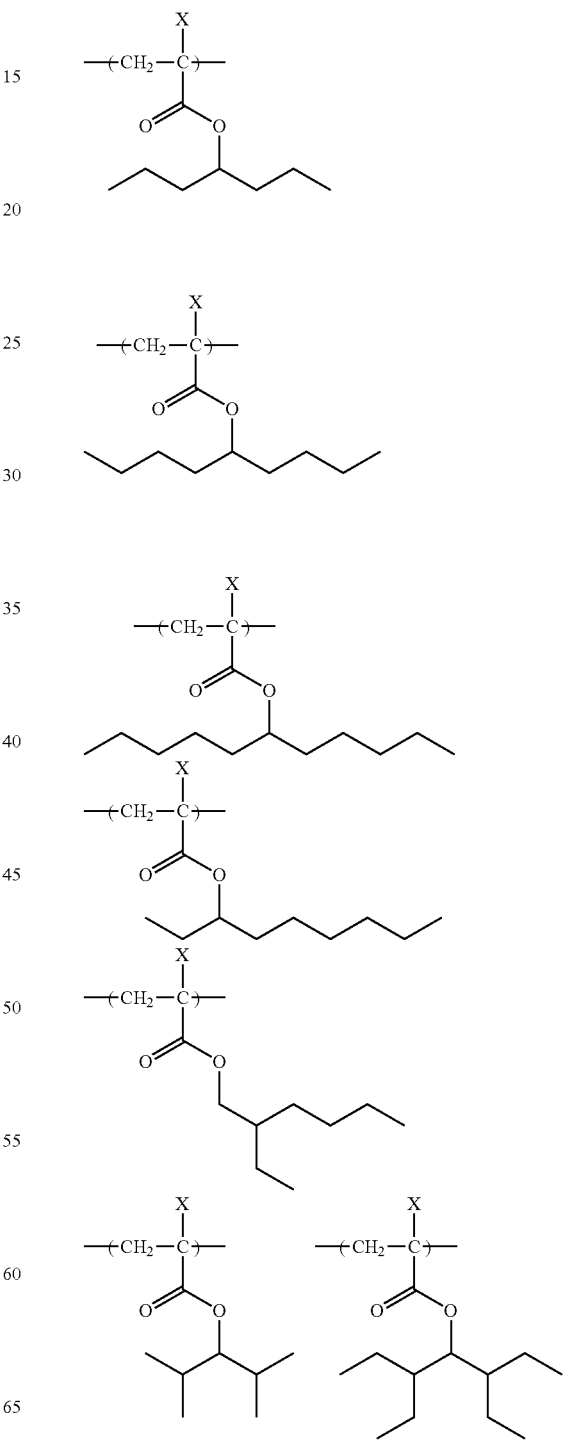

-continued

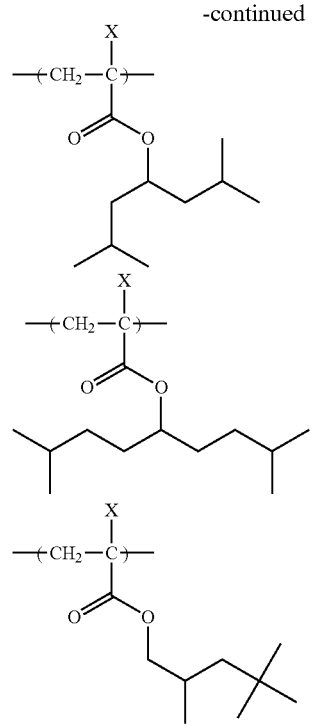

X = F or CF$_3$

The resin (XA) may further have a repeating unit represented by General Formula (III).

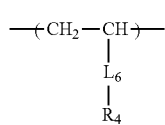
(III)

In General Formula (III),

R$_4$ represents an alkyl group, a cycloalkyl group, an alkenyl group, a cycloalkenyl group, a trialkylsilyl group, or a group having a cyclic siloxane structure.

L$_6$ represents a single bond or a divalent linking group.

In General Formula (III), the alkyl group of R$_4$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The trialkylsilyl group is preferably a trialkylsilyl group having 3 to 20 carbon atoms.

The group having a cyclic siloxane structure is preferably a group having a cyclic siloxane structure having 3 to 20 carbon atoms.

The divalent linking group of L$_6$ is preferably an alkylene group (preferably having carbon atoms 1 to 5) or an oxy group.

The resin (XA) may have the same group as a lactone group, an ester group, an acid anhydride, or an acid-decomposable group in an acid-decomposable resin which will be described later. The resin (XA) may further have a repeating unit represented by General Formula (VIII).

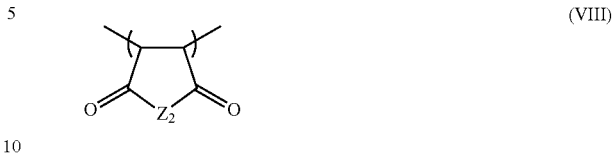
(VIII)

The resin (XA) is preferably is one of several resins selected from the following (X-1) to (X-8).

(X-1) A resin having a repeating unit (a) having a fluoroalkyl group (preferably having 1 to 4 carbon atoms), and more preferably a resin having only the repeating unit (a).

(X-2) A resin having a repeating unit (b) having a trialkylsilyl group or a cyclic siloxane structure, and more preferably a resin having only the repeating unit (b).

(X-3) A resin having the repeating unit (a) having a fluoroalkyl group (preferably having 1 to 4 carbon atoms), a repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerization resin of the repeating unit (a) and the repeating unit (c).

(X-4) A resin having the repeating unit (b) having a trialkylsilyl group or a cyclic siloxane structure, and the repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerization resin of the repeating unit (b) and the repeating unit (c).

(X-5) A resin having the repeating unit (a) having a fluoroalkyl group (preferably having 1 to 4 carbon atoms) and the repeating unit (b) having a trialkylsilyl group or a cyclic siloxane structure, and more preferably a copolymerization resin of the repeating unit (a) and the repeating unit (b).

(X-6) A resin having the repeating unit (a) having a fluoroalkyl group (preferably having 1 to 4 carbon atoms), the repeating unit (b) having a trialkylsilyl group or a cyclic siloxane structure, and the repeating unit (c) having a branched alkyl group (preferably having 4 to 20 carbon atoms), a cycloalkyl group (preferably having 4 to 20 carbon atoms), a branched alkenyl group (preferably having 4 to 20 carbon atoms), a cycloalkenyl group (preferably having 4 to 20 carbon atoms), or an aryl group (preferably having 4 to 20 carbon atoms), and more preferably a copolymerization resin of the repeating unit (a), the repeating unit (b), and the repeating unit (c).

As the repeating unit (c) having a branched alkyl group, a cycloalkyl group, a branched alkenyl group, a cycloalkenyl group, or an aryl group in the resins (X-3), (X-4), and (X-6), an appropriate functional group can be introduced in consideration of hydrophilicity, interactions, or the like into consideration.

(X-7) A resin a repeating unit (preferably a repeating unit having an alkali-soluble group with a pKa of 4 or more) further having an alkali-soluble group (d) in the repeating unit constituting each of (X-1) to (X-6).

(X-8) A resin having only a repeating unit having an alkali-soluble group (d) having a fluoroalcohol group.

In the resins (X-3), (X-4), (X-6), and (X-7), the amount of the repeating unit (a) having a fluoroalkyl group and/or the repeating unit (b) having a trialkylsilyl group or a cyclic siloxane structure is preferably 10% to 99% by mole, and more preferably 20% to 80% by mole.

Furthermore, by incorporation of the alkali-soluble group (d) into the resin (X-7), the peeling ease upon the use of an organic solvent developer as well as the peeling ease upon the use of other peeling solutions, for example, the use of an alkaline aqueous solution as a peeling solution are improved.

The resin (XA) is preferably solid at normal temperature (25° C.). Further, the glass transition temperature (Tg) is preferably 50° C. to 200° C., and more preferably 80° C. to 160° C.

Being solid at 25° C. means having a melting point of 25° C. or higher.

The glass transition temperature (Tg) can be measured by a differential scanning calorimetry, and for example, it can be determined by after heating a sample and then cooling, followed by analyzing the change in the specific volume in a case of heating the sample again at 5° C./min.

The resin (XA) is insoluble in an immersion liquid (preferably water), and is preferably soluble in an organic solvent developer (preferably a developer including an ester-based solvent). In a case where the pattern forming method of the present invention further includes a step of performing development using an alkali developer, it is preferable that the resin (XA) is also soluble in the alkali developer from the viewpoint that it is possible to perform development and peeling using the alkali developer.

In a case where the resin (XA) has silicon atoms, the content of the silicon atoms is preferably 2% to 50% by mass, and more preferably 2% to 30% by mass, with respect to the weight-average molecular weight of the resin (XA). Further, the amount of the repeating units containing silicon atoms is preferably 10% to 100% by mass, and more preferably 20% to 100% by mass, in the resin (XA).

By setting the contents of the silicon atoms and the repeating unit including silicon atoms to the ranges, it is possible to improve all of insolubility in an immersion liquid (preferably water), peeling ease of an upper layer film upon the use of an organic solvent developer, and incompatibility with an actinic ray-sensitive or radiation-sensitive film.

By setting the contents of the fluorine atoms and the repeating unit including fluorine atoms to the ranges, it is possible to improve all of insolubility in an immersion liquid (preferably water), peeling ease of an upper layer film upon the use of an organic solvent developer, and incompatibility with an actinic ray-sensitive or radiation-sensitive film.

The weight-average molecular weight of the resin (XA), in terms of standard polystyrene, is preferably 1,000 to 100,000, more preferably 1,000 to 50,000, still more preferably 2,000 to 15,000, and particularly preferably 3,000 to 15,000.

In the resin (XA), it is obvious that the content of impurities such as a metal is small, and the content of residual monomers is also preferably 0% to 10% by mass, more preferably 0% to 5% by mass, and still more preferably 0% to 1% by mass, from the viewpoint of reduction in elution from a upper layer film to an immersion liquid. Further, the molecular weight distribution (Mw/Mn, also referred to as "dispersity") is preferably in a range of 1 to 5, more preferably in a range of 1 to 3, and still more preferably in a range of 1 to 1.5.

Various commercially available products may be used as the resin (XA), or the resin may be synthesized by a conventional method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethyl formamide and dimethyl acetamide; and solvents which dissolve the composition of the present invention, such as propylene glycol monomethyl ether acetate, propylene glycol monomethyl ether, and cyclohexanone.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). As desired, a chain transfer agent can also be used. The concentration of the reactant is usually 5% to 50% by mass, preferably 20% to 50% by mass, and more preferably 30% to 50% by mass. The reaction temperature is usually 10° C. to 150° C., preferably 30° C. to 120° C., and more preferably 60° C. to 100° C.

After the completion of the reaction, cooling is carried out to room temperature, and purification is carried out. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a re-precipitation method in which a residual monomer or the like is removed by adding a resin solution dropwise to a poor solvent to coagulate the resin in the poor solvent, or a purification method in a solid state in which filtered resin slurry is washed with a poor solvent can be applied to the purification. For example, by bringing the resin into contact with a solvent (poor solvent), which poorly dissolves or does not dissolve the resin, corresponding to 10 times or less the volume amount of the reaction solution, or preferably 5 to 10 times the volume amount of the reaction solution, the resin is solidified and precipitated.

The solvent (precipitation or reprecipitation solvent) to be used in a case of precipitation or reprecipitation from the polymer solution may be an arbitrary one so long as it is a poor solvent to the polymer. Depending on the kind of the polymer, a solvent that is appropriately selected from, for example, a hydrocarbon (an aliphatic hydrocarbon such as pentane, hexane, heptane, and octane; an alicyclic hydrocarbon such as cyclohexane and methylcyclohexane; and an aromatic hydrocarbon such as benzene, toluene, and xylene), a halogenated hydrocarbon (a halogenated aliphatic hydrocarbon such as methylene chloride, chloroform, and carbon tetrachloride; and a halogenated aromatic hydrocarbon such as chlorobenzene and dichlorobenzene), a nitro compound (nitromethane, nitroethane, and the like), a nitrile (acetonitrile, benzonitrile, and the like), an ether (a chain ether such as diethyl ether, diisopropyl ether, and dimethoxyethane; and a cyclic ether such as tetrahydrofuran and dioxane), a ketone (acetone, methyl ethyl ketone, diisobutyl ketone, and the like), an ester (ethyl acetate, butyl acetate, and the like), a carbonate (dimethyl carbonate, diethyl carbonate, ethylene carbonate, propylene carbonate, and the like), an alcohol (methanol, ethanol, propanol, isopropyl alcohol, butanol, and the like), a carboxylic acid (acetic acid and the like), water, and a mixed solvent containing the same can be used. Among these, the precipitation or reprecipitation solvent is preferably a solvent containing at least an alcohol (particularly methanol or the like) or water. In such a solvent containing at least a hydrocarbon, the ratio of the alcohol (particularly methanol or the like) to other solvents (for example, an ester such as ethyl acetate and an ether such as tetrahydrofuran) is approximately, for example, the former/the latter (volume ratio; 25° C.) of 10/90 to 99/1, preferably the former/the latter (volume ratio; 25° C.) of 30/70 to 98/2, and more preferably the former/the latter (volume ratio; 25° C.) of 50/50 to 97/3.

The amount of the precipitation or reprecipitation solvent to be used may be appropriately selected by taking into consideration efficiency, yield, or the like. In general, it is used in an amount of 100 to 10,000 parts by mass, preferably 200 to 2,000 parts by mass, and more preferably 300 to 1,000 parts by mass, with respect to 100 parts by mass of the polymer solution.

In a case of feeding the polymer solution into a precipitation or reprecipitation solvent (poor solvent), the nozzle pore diameter is preferably 4 mmϕ or less (for example, 0.2 to 4 mmϕ) and the feeding rate (dropwise addition rate) of the polymer solution into the poor solvent is, for example, in terms of a linear velocity, approximately 0.1 to 10 m/sec, and preferably 0.3 to 5 m/sec.

The precipitation or reprecipitation procedure is preferably carried out under stirring. Examples of the stirring blade which can be used for the stirring include a disc turbine, a fan turbine (including a paddle), a curved vane turbine, an arrow feather turbine, a Pfaudler type, a bull margin type, an angled vane fan turbine, a propeller, a multistage type, an anchor type (or horseshoe type), a gate type, a double ribbon type, and a screw type. It is preferable that the stirring is further carried out for 10 minutes or more, in particular, 20 minutes or more, after the completion of feeding of the polymer solution. In a case where the stirring time is short, the monomer content in the polymer particles may not be sufficiently reduced in some cases. Further, the mixing and stirring of the polymer solution and the poor solvent may also be carried out by using a line mixer instead of the stirring blade.

Although the temperature during the precipitation or reprecipitation may be appropriately selected by taking into consideration efficiency or operability, the temperature is usually approximately 0° C. to 50° C., preferably in the vicinity of room temperature (for example, approximately 20° C. to 35° C.). The precipitation or reprecipitation procedure may be carried out by using a commonly employed mixing vessel such as stirring tank according to a known method such as batch system and continuous system.

The precipitated or reprecipitated particulate polymer is usually subjected to commonly employed solid-liquid separation such as filtration and centrifugation and then dried before using. The filtration is carried out by using a solvent-resistant filter material preferably under elevated pressure. The drying is carried out under normal pressure or reduced pressure (preferably under reduced pressure) at a temperature of approximately 30° C. to 100° C., and preferably approximately 30° C. to 50° C.

Furthermore, after the resin is once precipitated and separated, it may be redissolved in a solvent and then brought into contact with a solvent in which the resin is sparingly soluble or insoluble.

That is, the method may be a method including, after the completion of a radical polymerization reaction, precipitating a resin by bringing the polymer into contact with a solvent in which the polymer is sparingly soluble or insoluble (step a), separating the resin from the solution (step b), dissolving the resin in a solvent again to prepare a resin solution A (step c), then precipitating a resin solid by bringing the resin solution A into contact with a solvent in which the resin is sparingly soluble or insoluble and which is in a volume amount of less than 10 times (preferably a volume amount of 5 times or less) the resin solution A (step d), and separating the precipitated resin (step e).

As the solvent used in a case of the preparation of the resin solution A, the same solvent as the solvent for dissolving the monomer in a case of the polymerization reaction may be used, and the solvent may be the same as or different from each other from the solvent used in a case of the polymerization reaction.

The resin (XA) may be used singly or in combination of two or more kinds thereof.

The content of the resin (XA) is preferably 0.5% to 10.0% by mass, more preferably 1.0% to 6.0% by mass, and still more preferably 1.5% to 5.0% by mass, with respect to the total solid content of the composition for forming an upper layer film.

[Resin (XB)]

In a case where the resin (XB) is used for ArF liquid immersion exposure in the same manner as the above-mentioned resin (XA), it is preferable that the resin (XB) does not have an aromatic group in view of transparency to ArF light.

The resin (XB) is a resin containing fluorine atoms, and preferably a water-insoluble resin (hydrophobic resin).

The resin (XB) preferably has a fluorine atom in the main chain or a side chain of the resin (XB). Further, in a case where the resin (XB) contains a silicon atom, it may have the silicon atom in the main chain or a side chain of the resin (XB).

In one embodiment, the resin (XB) is preferably a resin having an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have another substituent.

The cycloalkyl group having a fluorine atom is a monocyclic or polycyclic cycloalkyl group in which at least one hydrogen atom is substituted with a fluorine atom, and they may further have another substituent.

The aryl group having a fluorine atom is an aryl group in which at least one hydrogen atom is substituted with a fluorine atom, such as a phenyl group and a naphthyl group, and they may further have another substituent.

Specific examples of the alkyl group having a fluorine atom, the cycloalkyl group having a fluorine atom, or the aryl group having a fluorine atom are shown below, but the present invention is not limited thereto.

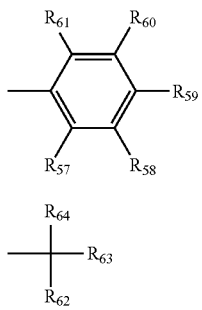

(F2)

(F3)

In General Formulae (F2) and (F3), $R_{57}$ to $R_{64}$ each independently represent a hydrogen atom, a fluorine atom, or an alkyl group, provided that at least one of $R_{57}, \ldots,$ or $R_{61}$ or $R_{62}, \ldots,$ or $R_{64}$ is a fluorine atom or an alkyl group (preferably having 1 to 4 carbon atoms) in which at least one hydrogen atom is substituted for by a fluorine atom. It is preferable that all of $R_{57}$ to $R_{61}$ are a fluorine atom. $R_{62}$ and $R_{63}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. The hexafluoroisopropyl group, the heptafluoroisopropyl group, the hexafluoro(2-methyl) isopropyl group, the octafluoroisobutyl group, the nonafluoro-t-butyl group, or the perfluoroisopentyl group is preferable, and the hexafluoroisopropyl group or the heptafluoroisopropyl group is more preferable.

Examples of the resin (XB) include a resin having at least one selected from the group of the repeating units represented by General Formulae (C-I) to (C-V).

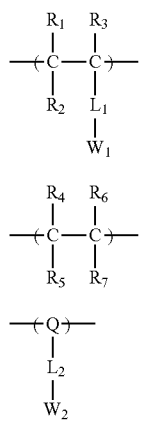

(C-I)

(C-II)

(C-III)

(C-IV)

(C-V)

In General Formulae (C-I) to (C-V), $R_1$ to $R_3$ each independently represent a hydrogen atom, a fluorine atom, a linear or branched alkyl group having 1 to 4 carbon atoms, or a linear or branched fluorinated alkyl group having 1 to 4 carbon atoms.

$W_1$ and $W_2$ each represent an organic group having at least one of a fluorine atom or a silicon atom.

$R_4$ to $R_7$ each independently represent a hydrogen atom, a fluorine atom, a linear or branched alkyl group having 1 to 4 carbon atoms, or a linear or branched fluorinated alkyl group having 1 to 4 carbon atoms, provided that at least one of $R_4, \ldots,$ or $R_7$ represents a fluorine atom. $R_4$ and $R_5$, or $R_6$ and $R_7$ may be combined to form a ring.

$R_8$ represents a hydrogen atom or a linear or branched alkyl group having 1 to 4 carbon atoms.

$R_9$ represents a linear or branched alkyl group having 1 to 4 carbon atoms or a linear or branched fluorinated alkyl group having 1 to 4 carbon atoms.

$L_1$ and $L_2$ each represent a single bond or a divalent linking group, and are the same as each of $L_3$ to $L_5$.

Q represents a monocyclic or polycyclic aliphatic group. That is, it represents an atomic group containing two carbon atoms (C—C) bonded to each other for forming an alicyclic structure.

$R_{30}$ and $R_{31}$ each independently represent a hydrogen atom or a fluorine atom.

$R_{32}$ and $R_{33}$ each independently represent an alkyl group, a cycloalkyl group, a fluorinated alkyl group, or a fluorinated cycloalkyl group.

It is to be noted that the repeating unit represented by General Formula (C-V) has at least one fluorine atom in at least one of $R_{30}$, $R_{31}$, $R_{32}$, or $R_{33}$.

The resin (XB) preferably has a repeating unit represented by General Formula (C-I), and more preferably has a repeating unit represented by each of General Formulae (C-Ia) to (C-Id).

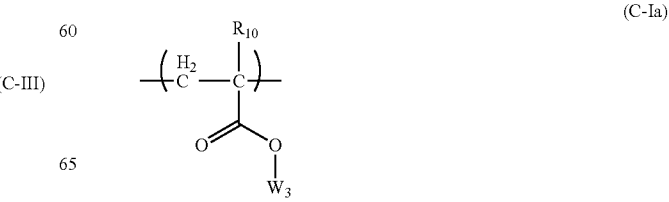

(C-Ia)

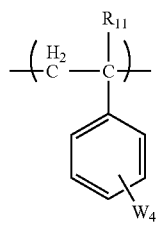 (C-Ib)

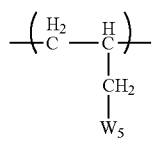 (C-Ic)

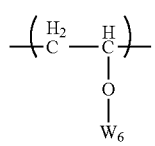 (C-Id)

In General Formulae (C-Ia) to (C-Id), $R_{10}$ and $R_{11}$ each represent a hydrogen atom, a fluorine atom, a linear or branched alkyl group having 1 to 4 carbon atoms, or a linear or branched fluorinated alkyl group having 1 to 4 carbon atoms.

$W_3$ to $W_6$ each represent an organic group having one or more of at least one of a fluorine atom or a silicon atom.

In a case where $W_3$ to $W_6$ are each an organic group having a fluorine atom, they are each preferably a fluorinated, linear or branched alkyl group or cycloalkyl group having 1 to 20 carbon atoms, or a linear, branched, or cyclic fluorinated alkyl ether group having 1 to 20 carbon atoms.

Examples of the fluorinated alkyl group represented by each of $W_3$ to $W_6$ include a trifluoroethyl group, a pentafluoropropyl group, a hexafluoroisopropyl group, a hexafluoro (2-methyl)isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, and a perfluoro(trimethyl)hexyl group.

In a case where $W_3$ to $W_6$ are each an organic group having a silicon atom, they are each preferably an alkylsilyl structure or a cyclic siloxane structure. Specific examples thereof include the groups represented by General Formulae (CS-1) to (CS-3).

Specific examples of the repeating unit represented by General Formula (C-I) are shown below, but are not limited thereto. X represents a hydrogen atom, —CH$_3$, —F, or —CF$_3$.

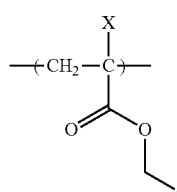 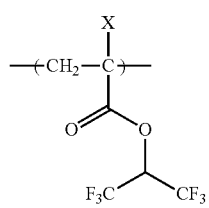

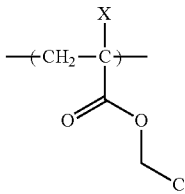 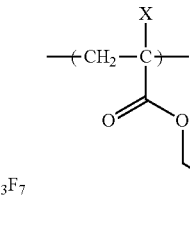

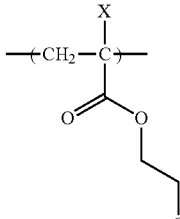 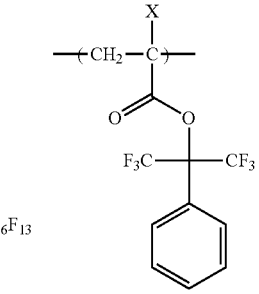

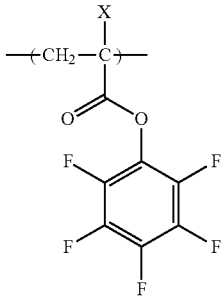 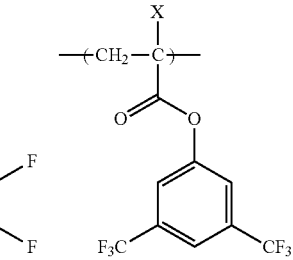

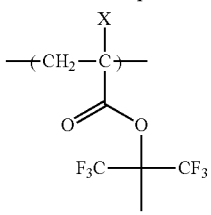 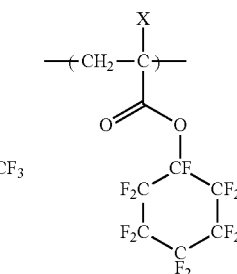

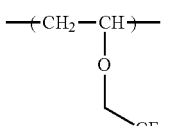 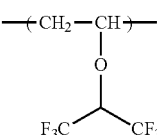

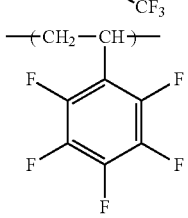

The resin (XB) is also preferably a resin having a CH$_3$ partial structure in the side chain moiety in the same manner as the resin (XA), and preferably includes, for example, at least one repeating unit (x) of the repeating unit represented by General Formula (II) or the repeating unit represented by General Formula (III) in the resin (XA).

It is preferable that the resin (XB) is insoluble in an immersion liquid (preferably water) and is soluble in an organic developer. From the viewpoint of the possibility of release by development using an alkali developer, it is preferable that the resin (XB) is also soluble in an alkali developer.

In an embodiment of the present invention, the content of fluorine atoms in the resin (XB) is preferably 15% by mass or more with respect to the weight-average molecular weight of the resin (XB). Here, the value of the content of fluorine atoms in the resin is a value determined by the method described for the resin (XA).

The content of fluorine atoms in the resin (XB) is more preferably 15% to 80% by mass, more preferably 20% to 80% by mass, and particularly preferably 25% to 80% by mass. Further, the amount of the repeating unit including fluorine atoms is preferably 10% to 100% by mass, and more preferably 30% to 100% by mass in the resin (XB).

The weight-average molecular weight of the resin (XB) in terms of standard polystyrene is preferably 1,000 to 100,000, more preferably 1,000 to 50,000, still more preferably 2,000 to 15,000, and particularly preferably 3,000 to 15,000.

In the resin (XB), it is obvious that the content of impurities such as a metal is small, and the content of residual monomers is also preferably 0% to 10% by mass, more preferably 0% to 5% by mass, and still more preferably 0% to 1% by mass, from the viewpoint of reduction in elution from a topcoat to an immersion liquid. Further, the molecular weight distribution (Mw/Mn, also referred to as "dispersity") is preferably in a range of 1 to 5, more preferably in a range of 1 to 3, and still more preferably in a range of 1 to 1.5.

Various commercially available products may be used as the resin (XB), or the resin (XB) may be synthesized by a conventional method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethyl formamide and dimethyl acetamide; and solvents which dissolve the actinic ray-sensitive or radiation-sensitive resin composition of the present invention, such as propylene glycol monomethyl ether acetate, propylene glycol monomethyl ether, and cyclohexanone.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferable examples of the initiators include azobisisobutyronitrile, azobisdimethylvaleronitrile, and dimethyl 2,2'-azobis(2-methyl propionate). As desired, a chain transfer agent can also be used. The concentration of the reactant is usually 5% to 50% by mass, preferably 20% to 50% by mass, and more preferably 30% to 50% by mass. The reaction temperature is usually 10° C. to 150° C., preferably 30° C. to 120° C., and more preferably 60° C. to 100° C.

After the completion of the reaction, cooling is carried out to room temperature, and purification is carried out. A usual method such as a liquid-liquid extraction method in which a residual monomer or an oligomer component is removed by washing with water or combining suitable solvents, a purification method in a solution state such as ultrafiltration which extracts and removes only substances having a specific molecular weight or less, a re-precipitation method in which a residual monomer or the like is removed by adding a resin solution dropwise to a poor solvent to coagulate the resin in the poor solvent, or a purification method in a solid state in which filtered resin slurry is washed with a poor solvent can be applied to the purification. For example, by bringing into contact with a solvent (poor solvent), which poorly dissolves or does not dissolve the resin, corresponding to 10 times or less the volume amount of the reaction solution, or preferably 5 to 10 times the volume amount of the reaction solution, the resin is solidified and precipitated.

The solvent (precipitation or reprecipitation solvent) to be used in a case of precipitation or reprecipitation from the polymer solution may be an arbitrary one so long as it is a poor solvent to the polymer. Depending on the kind of the polymer, it may be appropriately selected from, for example, a hydrocarbon (an aliphatic hydrocarbon such as pentane, hexane, heptane, and octane; an alicyclic hydrocarbon such as cyclohexane and methylcyclohexane; and an aromatic hydrocarbon such as benzene, toluene, and xylene), a halogenated hydrocarbon (for example, a halogenated aliphatic hydrocarbon such as methylene chloride, chloroform, and carbon tetrachloride; a halogenated aromatic hydrocarbon such as chlorobenzene and dichlorobenzene), a nitro compound (nitromethane, nitroethane, and the like), a nitrile (acetonitrile, benzonitrile, and the like), an ether (a chain ether such as diethyl ether, diisopropyl ether, and dimethoxyethane; and a cyclic ether such as tetrahydrofuran and dioxane), a ketone (acetone, methyl ethyl ketone, diisobutyl ketone, and the like), an ester (ethyl acetate, butyl acetate, and the like), a carbonate (dimethyl carbonate, diethyl carbonate, ethylene carbonate, propylene carbonate, and the like), an alcohol (methanol, ethanol, propanol, isopropyl alcohol, butanol, and the like), a carboxylic acid (acetic acid and the like), water, and a mixed solvent containing the same. Among these, the precipitation or reprecipitation solvent is preferably a solvent containing at least an alcohol (particularly methanol or the like) or water. In such a solvent containing at least a hydrocarbon, the ratio of the alcohol (particularly, methanol or the like) to other solvents (for example, an ester such as ethyl acetate and an ether such as tetrahydrofuran) is approximately, for example, the former/the latter (volume ratio; 25° C.) of 10/90 to 99/1, preferably the former/the latter (volume ratio; 25° C.) of 30/70 to 98/2, more preferably the former/the latter (volume ratio; 25° C.) of 50/50 to 97/3.

The amount of the precipitation or reprecipitation solvent to be used may be appropriately selected by taking into consideration efficiency, yield, or the like. In general, it is used in an amount of 100 to 10,000 parts by mass, preferably 200 to 2,000 parts by mass, and more preferably 300 to 1,000 parts by mass, with respect to 100 parts by mass of the polymer solution.

In a case of feeding the polymer solution into a precipitation or reprecipitation solvent (poor solvent), the nozzle pore diameter is preferably 4 mmφ or less (for example, 0.2 to 4 mmφ) and the feeding rate (dropwise addition rate) of the polymer solution into the poor solvent is, for example, in terms of a linear velocity, approximately 0.1 to 10 m/sec, and preferably 0.3 to 5 m/sec.

The precipitation or reprecipitation procedure is preferably carried out under stirring. Examples of the stirring blade which can be used for the stirring include a disc turbine, a fan turbine (including a paddle), a curved vane turbine, an arrow feather turbine, a Pfaudler type, a bull margin type, an angled vane fan turbine, a propeller, a multistage type, an anchor type (or horseshoe type), a gate type, a double ribbon type, and a screw type. It is preferable that the stirring is further carried out for 10 minutes or more, in particular, 20 minutes or more, after the completion of feeding of the polymer solution. In a case where the stirring time is too short, the monomer content in the polymer particles may not be sufficiently reduced in some cases. Further, the mixing and stirring of the polymer solution and the poor solvent may also be carried out by using a line mixer instead of the stirring blade.

Although the temperature in a case of the precipitation or reprecipitation may be appropriately selected by taking into consideration efficiency or operability, the temperature is usually approximately 0° C. to 50° C., preferably in the vicinity of room temperature (for example, approximately 20° C. to 35° C.). The precipitation or reprecipitation procedure may be carried out by using a commonly employed mixing vessel such as stirring tank according to a known method such as batch system and continuous system.

The precipitated or reprecipitated particulate polymer is usually subjected to commonly employed solid-liquid separation such as filtration and centrifugation and then dried before using. The filtration is carried out by using a solvent-resistant filter material preferably under elevated pressure. The drying is carried out under normal pressure or reduced pressure (preferably under reduced pressure) at a temperature of approximately 30° C. to 100° C., and preferably approximately 30° C. to 50° C.

Furthermore, after the resin is once precipitated and separated, it may be redissolved in a solvent and then brought into contact with a solvent in which the resin is sparingly soluble or insoluble.

That is, the method may be a method including, after the completion of a radical polymerization reaction, precipitating a resin by bringing the polymer into contact with a solvent in which the polymer is sparingly soluble or insoluble (step a), separating the resin from the solution (step b), dissolving the resin in a solvent again to prepare a resin solution A (step c), then precipitating a resin solid by bringing the resin solution A into contact with a solvent in which the resin is sparingly soluble or insoluble and which is in a volume amount of less than 10 times (preferably a volume amount of 5 times or less) the resin solution A (step d), and separating the precipitated resin (step e).

As the solvent used in a case of the preparation of the resin solution A, the same solvent as the solvent for dissolving the monomer in a case of the polymerization reaction may be used, and the solvent may be the same as or different from each other from the solvent used in a case of the polymerization reaction.

The resin (XB) may be used singly or in combination of two or more kinds thereof.

The content of the resin (XB) in the composition for forming an upper layer film is preferably 20% by mass or less with respect to the total solid content. In a case where the content of the resin (XB) in the composition for forming an upper layer film increases, the diffusivity of the upper layer film itself decreases, leading to deterioration of DOF and EL performance, and therefore, it is preferable to reduce the content of the resin (XB) to a predetermined amount or less.

As described above, the composition for forming an upper layer film of the present invention may use a basic compound will be described later in combination with two resins having different contents of fluorine atoms, that is, the resin (XA) and the resin (XB). In an embodiment of the present invention, the difference in the contents of fluorine atoms between the resin (XA) and the resin (XB) is preferably 10% by mass or more, more preferably 15% by mass or more, and still more preferably 18% by mass or more.

Preferred examples of the resin (XA) and/or the resin (XB) are shown below.

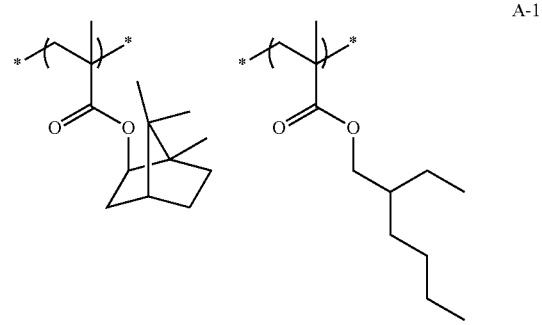

A-1

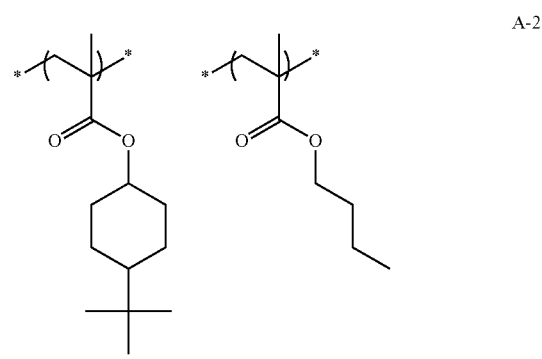

A-2

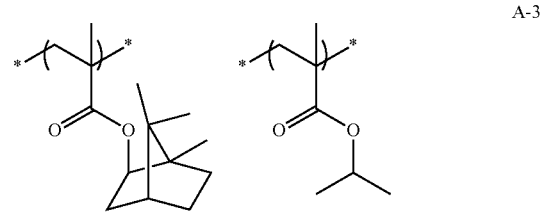

A-3

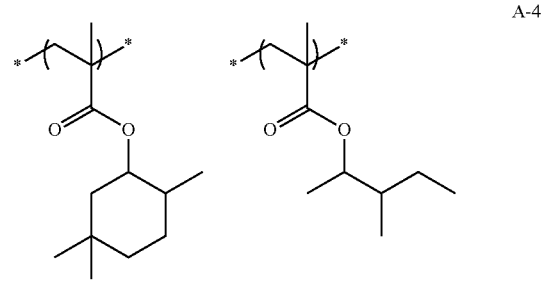

A-4

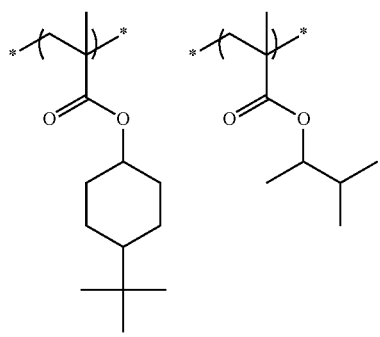
A-5
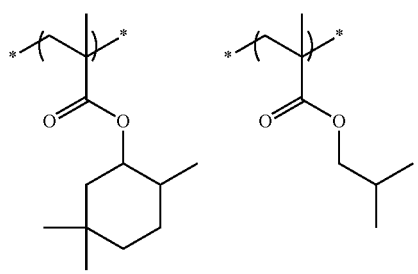
A-6
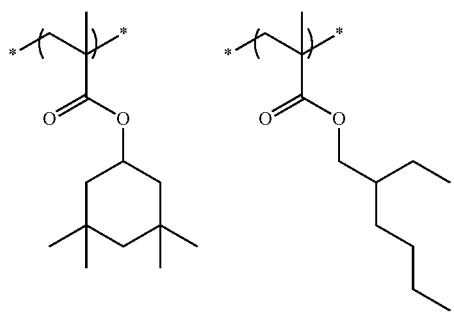
A-7
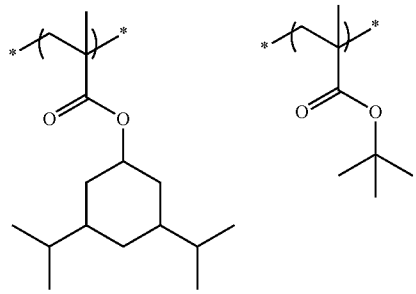
A-8
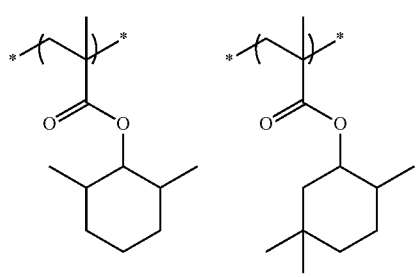
A-9
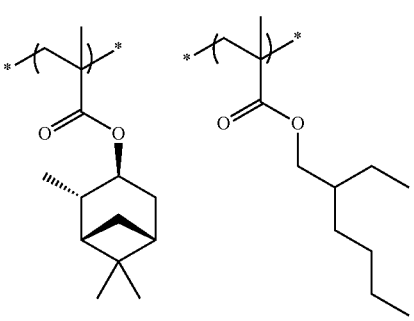
A-10
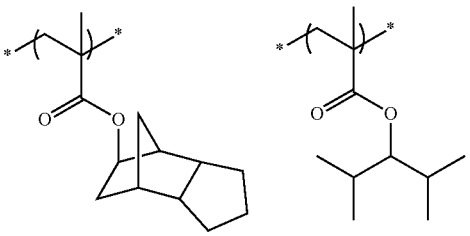
A-11
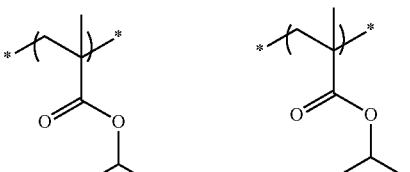
A-12
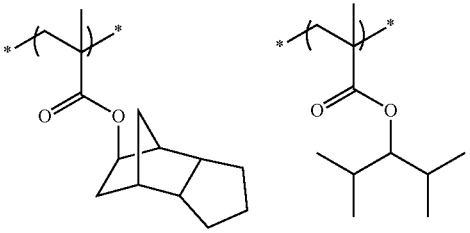
A-13
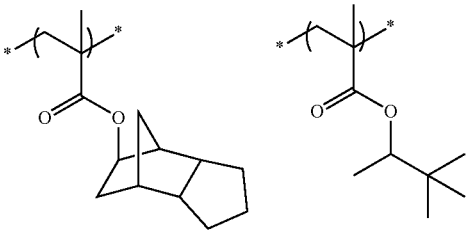
A-14
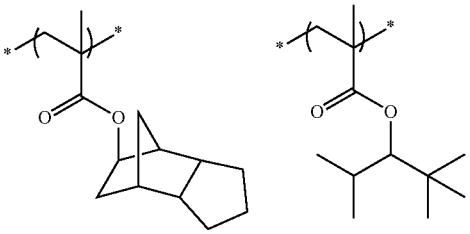
A-15

A-17 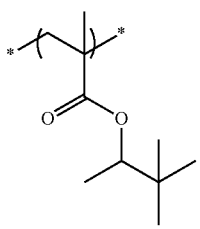
A-18 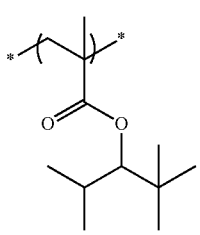
A-19 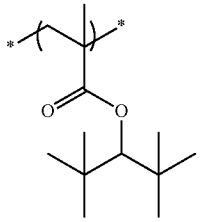
A-20 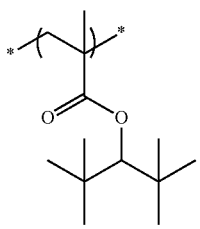
A-21 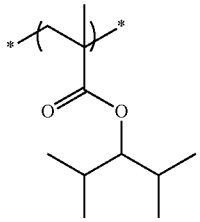
A-22 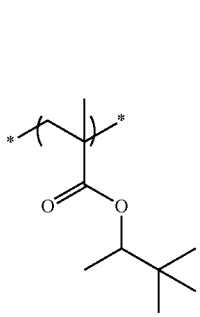
-continued
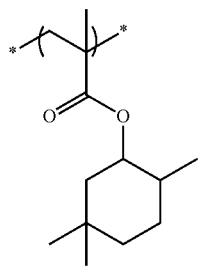
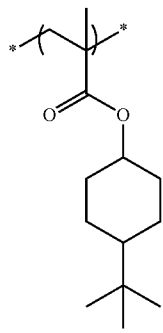
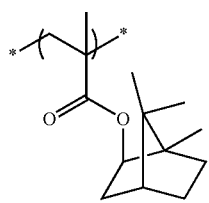
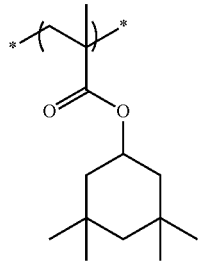
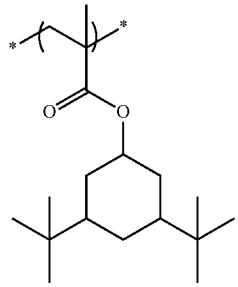
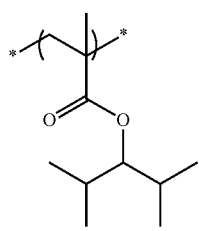
A-23
A-24
A-25
A-26
A-27
A-28

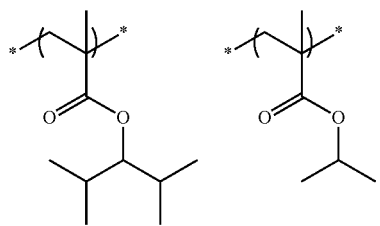
A-29
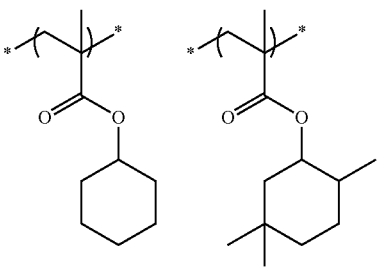
A-35
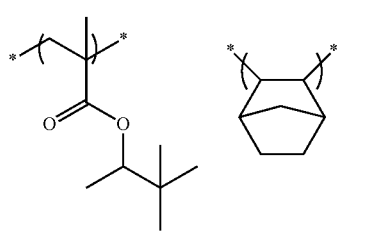
A-30
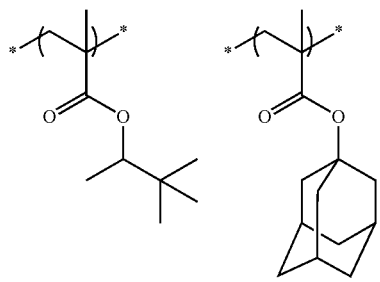
A-31
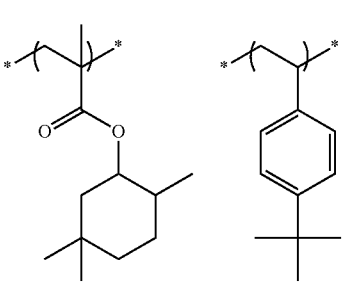
A-36
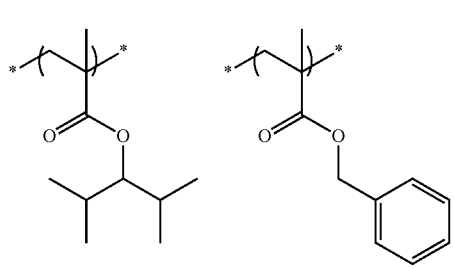
A-32
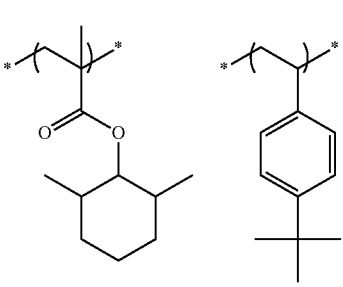
A-37
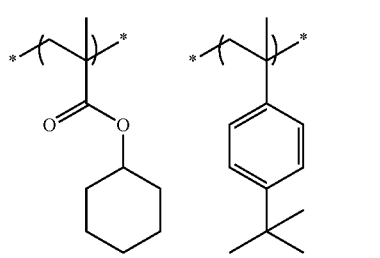
A-33
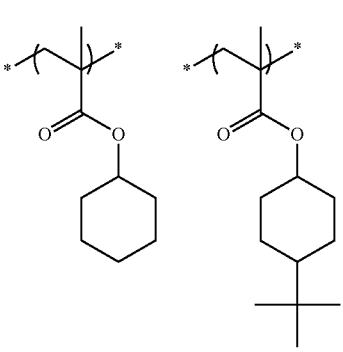
A-38
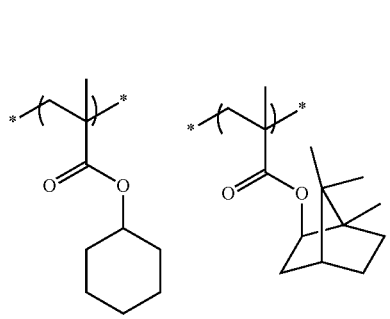
A-34
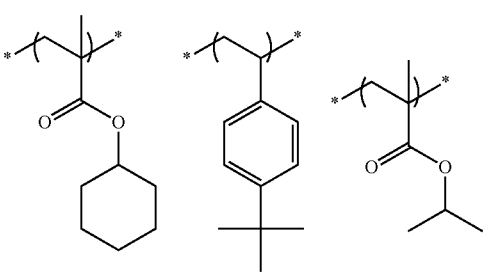
A-39

A-40
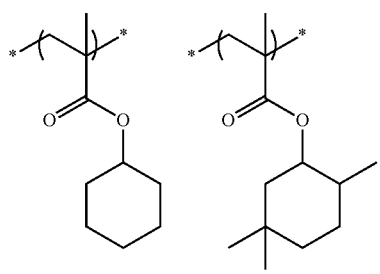
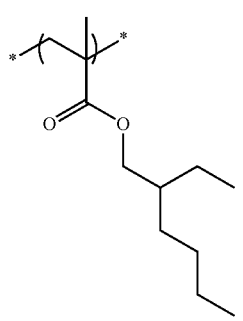
A-41
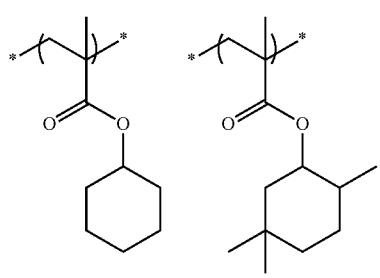
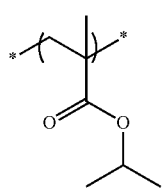
A-42
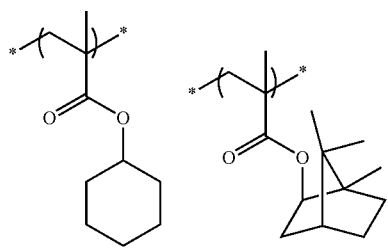
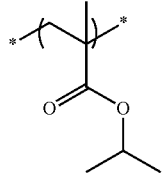
A-43
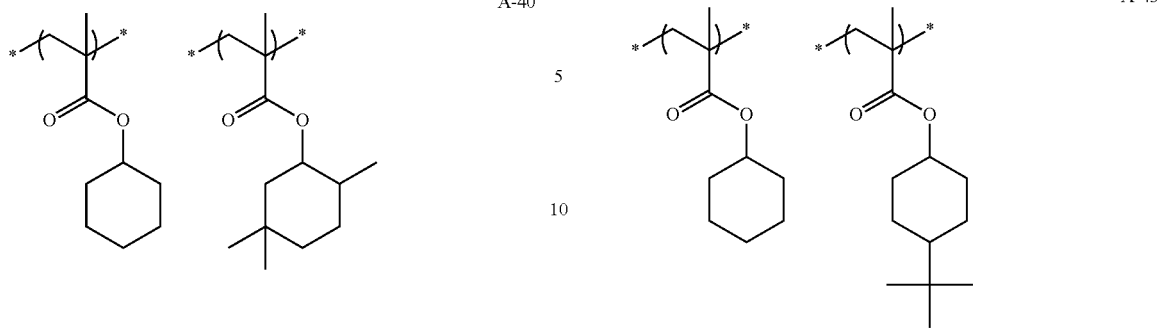
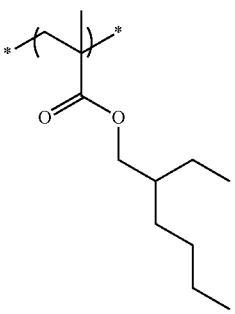
A-44
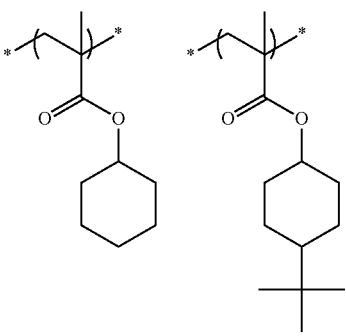
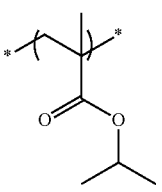
A-45
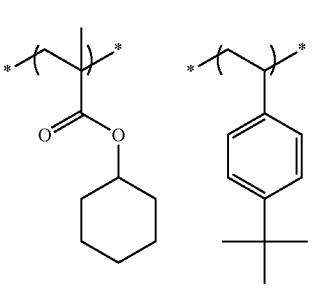

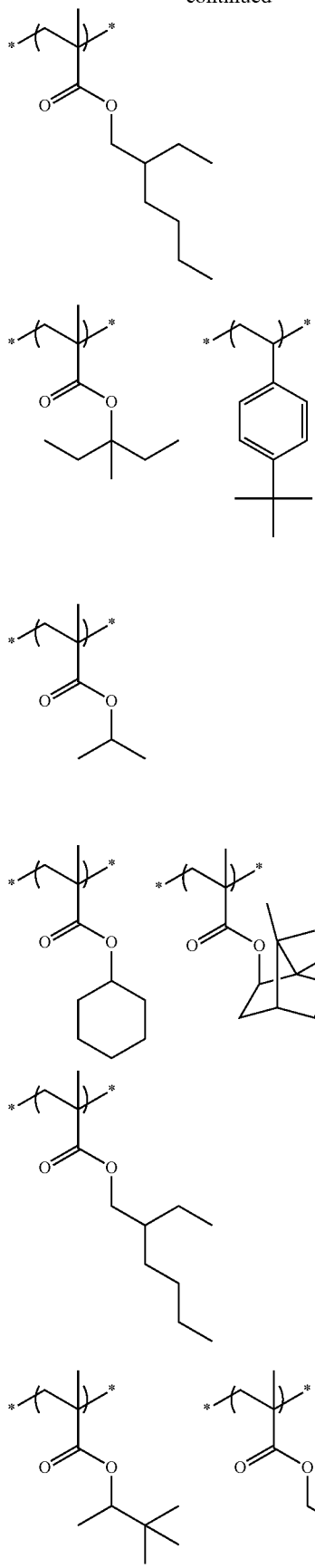
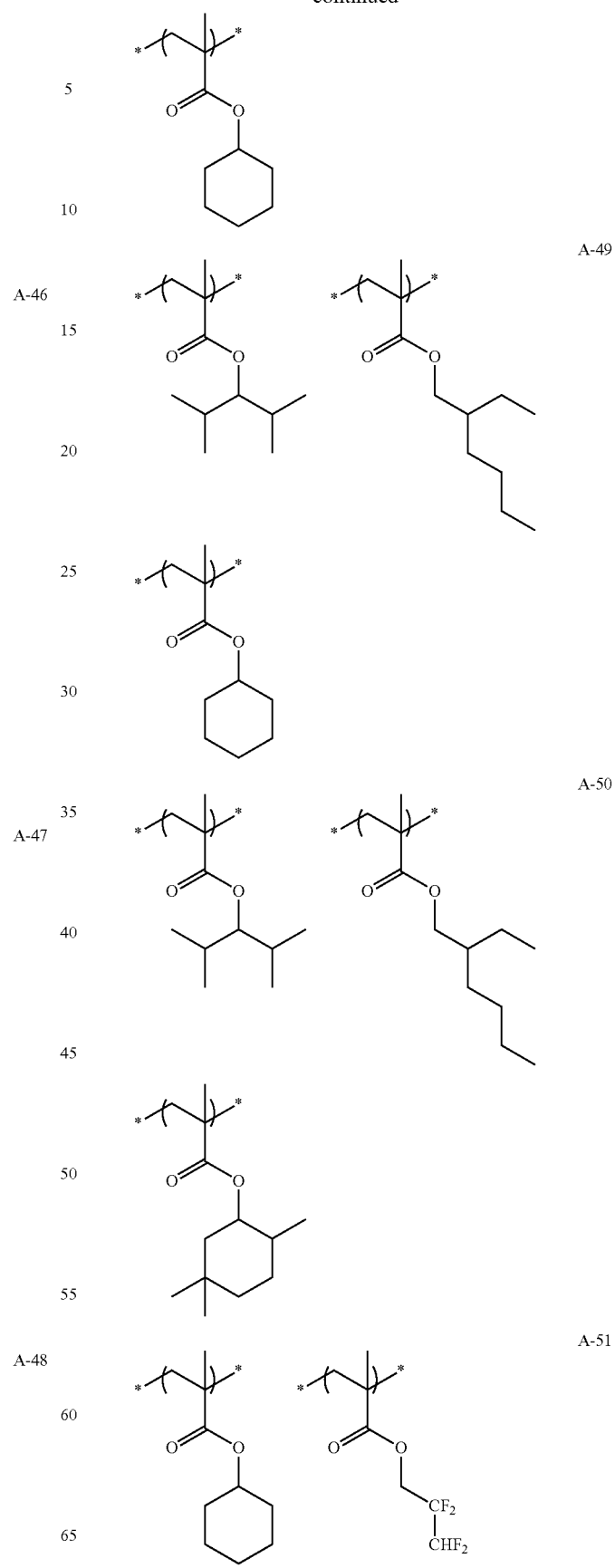

-continued

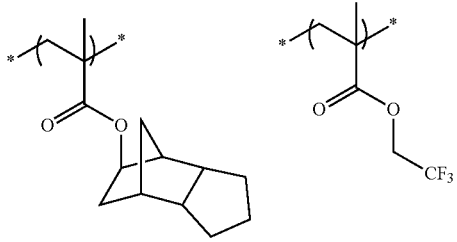
A-52

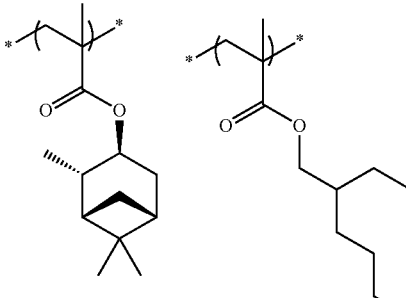
A-56

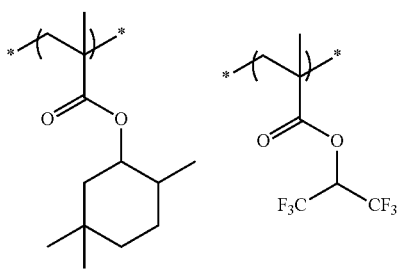
A-53

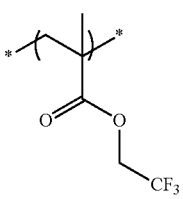

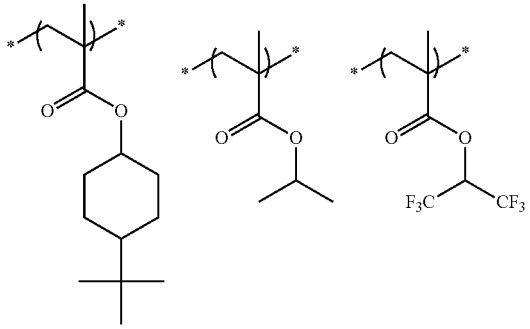
A-54

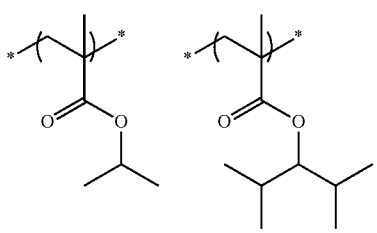
A-55

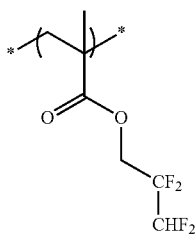

<Basic Compound (XC)>

The composition for forming an upper layer film of the present invention contains a basic compound (XC).

In one embodiment, the basic compound (XC) is a compound with a C log P value of 1.30 or less, and the C log P value is preferably 1.00 or less, and more preferably 0.70 or less. The C log P value of the basic compound (XC) is usually −3.00 or more.

Here, the C log P value is a value calculated for the compound using Chem DrawUltra ver. 12.0.2.1076 (Cambridge Corporation).

In one embodiment, the basic compound (XC) is preferably a compound having an ether bond, and more preferably a compound having an alkyleneoxy group.

As long as the basic compound (XC) has a C log P value of 1.30 or less, it also includes a base generator which will be described later. By incorporating the basic compound (XC) into the composition for forming an upper layer film of the present invention, the basic compound (XC) functions as a quencher that traps an acid generated from the photoacid generator in the actinic ray-sensitive or radiation-sensitive film, and thus, DOF and EL are superior.

The basic compound (XC) is more preferably an amine compound or an amide compound. Specific examples of the amine compound and the amide compound include those corresponding to the amine compound and the amide compound among the compounds which will be described later.

The basic compound (XC) is preferably an organic basic compound, and more preferably a nitrogen-containing basic compound. For example, the basic compound with a C log P of 1.30 or less among the basic compounds which may be contained in the actinic ray-sensitive or radiation-sensitive resin composition which will be described later can be used, and specific suitable examples thereof include compounds having structures represented by Formulae (A) to (E) which will be described later.

Furthermore, for example, compounds classified into the following (1) to (5) can be used.

(1) Compound Represented by General Formula (BS-1)

(BS-1)

In General Formula (BS-1),

R's each independently represent a hydrogen atom or an organic group, provided that at least one of three R's is an organic group.

This organic group is selected such that the C log P of the compound is 1.30 or less, and examples thereof include a linear or branched alkyl group, a monocyclic or polycyclic cycloalkyl group, an aryl group, and an aralkyl group, each having a heteroatom in the chain or as a ring member, or having a polar group as a substituent.

The number of carbon atoms in the alkyl group as R is not particularly limited, but is usually 1 to 20, and preferably 1 to 12.

The number of carbon atoms in the cycloalkyl group as R is not particularly limited, but is usually 3 to 20, and preferably 5 to 15.

The number of carbon atoms in the aryl group as R is not particularly limited, but is usually 6 to 20, and preferably 6 to 10. Specific examples thereof include a phenyl group and a naphthyl group.

The number of carbon atoms in the aralkyl group as R is not particularly limited, but is usually 7 to 20, and preferably 7 to 11. Specific examples thereof include a benzyl group.

Examples of a polar group as the substituent contained in the alkyl group, the cycloalkyl group, the aryl group, or the aralkyl group as R include a hydroxy group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific suitable examples of the compound represented by General Formula (BS-1) include an alkyl group in which at least one R is substituted with a hydroxy group. Specific examples thereof include triethanolamine and N,N-dihydroxyethylaniline.

Moreover, the alkyl group as R preferably has an oxygen atom in the alkyl chain. That is, an oxyalkylene chain is preferably formed. The oxyalkylene chain is preferably —$CH_2CH_2O$—. Specific examples thereof include tris(methoxyethoxyethyl)amine and a compound disclosed after line 60 of column 3 in the specification of U.S. Pat. No. 6,040,112A.

Examples of the basic compound represented by General Formula (BS-1) include the following compounds.

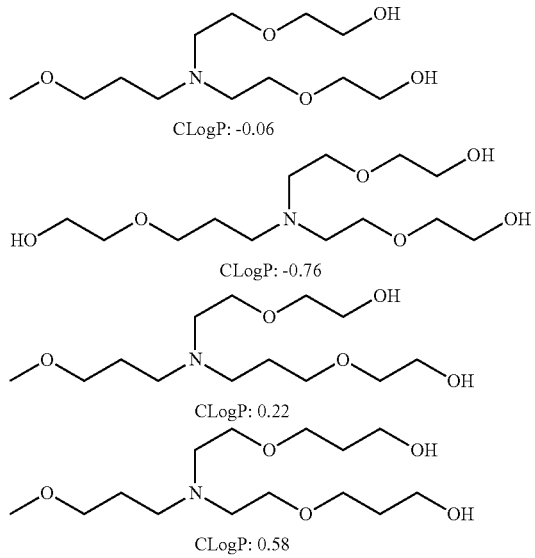

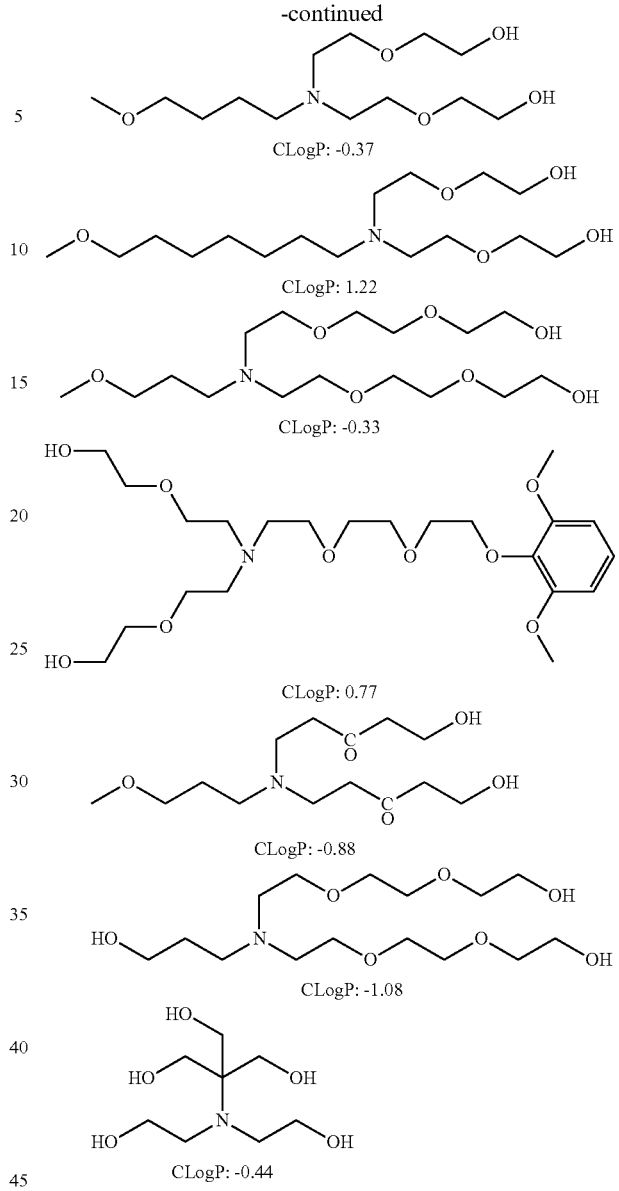

(2) Compound Having Nitrogen-Containing Heterocyclic Structure

A compound having a nitrogen-containing heterocyclic structure can also be appropriately used as the basic compound (XC).

This nitrogen-containing heterocycle may or may not have aromaticity. Further, the nitrogen-containing heterocycle may have a plurality of nitrogen atoms. It is preferable that the nitrogen-containing heterocycle further contains a heteroatom other than nitrogen. Specific examples thereof include a compound having an imidazole structure, a compound having a piperidine structure [N-hydroxyethylpiperidine (C log P: −0.81) and the like], a compound having a pyridine structure, and a compound having an antipyrine structure [antipyrine (C log P: −0.20), hydroxyantipyrine (C log P: −0.16), and the like].

Furthermore, a compound having two or more ring structures is also suitably used. Specific examples thereof include 1,5-diazabicyclo[4.3.0]-non-5-ene (C log P: −0.02) and 1,8-diazabicyclo[5.4.0]undec-7-ene (C log P: 1.14).

(3) Amine Compound Having Phenoxy Group

An amine compound having a phenoxy group can also be appropriately used as the basic compound (XC).

The amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, or an aryloxy group.

This compound more preferably has at least one oxyalkylene chain between the phenoxy group and the nitrogen atom. The number of oxyalkylene chains in one molecule is preferably 3 to 9, and more preferably 4 to 6. Among oxyalkylene chains, —$CH_2CH_2O$— is particularly preferable.

The amine compound having a phenoxy group is obtained by, for example, heating a mixture of a primary or secondary amine having a phenoxy group and a haloalkyl ether to be reacted, by adding an aqueous solution of a strong base such as sodium hydroxide, potassium hydroxide, and tetraalkylammonium thereto, and by extracting the resultant product with an organic solvent such as ethyl acetate and chloroform. In addition, an amine compound having a phenoxy group can also be obtained by heating a mixture of a primary or secondary amine and a haloalkyl ether having a phenoxy group at the terminal to be reacted, by adding an aqueous solution of a strong base such as sodium hydroxide, potassium hydroxide, and tetraalkylammonium thereto, and by extracting the resultant product with an organic solvent such as ethyl acetate and chloroform.

(4) Ammonium Salt

An ammonium salt can also be appropriately used as the basic compound (XC). Examples of the anion of the ammonium salt include hydroxide, carboxylate, halide, sulfonate, borate, and phosphate. Among these, hydroxide and carboxylate are particularly preferable.

As the halide, chloride, bromide, and iodide are particularly preferable.

As the sulfonate, an organic sulfonate having 1 to 20 carbon atoms is particularly preferable. Examples of the organic sulfonate include alkyl sulfonate and aryl sulfonate, having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, and a cyclohexyl group are preferable. Examples of other substituents include an alkoxy group having 1 to 6 carbon atoms, a halogen atom, a cyano group, a nitro group, an acyl group, and an acyloxy group.

This ammonium salt may be hydroxide or carboxylate. In this case, the ammonium salt is particularly preferably tetraalkylammonium hydroxide (tetraalkylammonium hydroxide such as tetramethylammonium hydroxide, tetraethylammonium hydroxide, and tetra-(n-butyl)ammonium hydroxide) having 1 to 8 carbon atoms.

Preferred examples of the basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound include guanidine (C log P: −2.39), 1,1-dimethylguanidine (C log P: −1.04), 1,1,3,3-tetramethylguanidine (C log P: −0.29), imidazole (C log P: −0.03), 2-methylimidazole (C log P: 0.24), 4-methylimidazole (C log P: 0.24), N-methylimidazole (C log P: −0.01), 2-aminopyridine (C log P: 0.32), 3-aminopyridine (C log P: 0.32), 4-aminopyridine (C log P: 0.32), 2-(aminomethyl)pyridine (C log P: −0.40), 2-amino-3-methylpyridine (C log P: 0.77), 2-amino-4-methylpyridine (C log P: 0.82), 2-amino-5-methylpyridine (C log P: 0.82), 2-amino-6-methylpyridine (C log P: 0.82), 3-aminoethylpyridine (C log P: −0.06), 4-aminoethylpyridine (C log P: −0.06), 3-aminopyrrolidine (C log P: −0.85), piperazine (C log P: −0.24), N-(2-aminoethyl)piperazine (C log P: −0.74), N-(2-aminoethyl)piperidine (C log P: 0.88), 4-piperidinopiperidine (C log P: 0.73), 2-iminopiperidine (C log P: 0.29), 1-(2-aminoethyl)pyrrolidine (C log P: 0.32), pyrazole (C log P: 0.24), 3-amino-5-methylpyrazole (C log P: 0.78), pyrazine (C log P: −0.31), 2-(aminomethyl)-5-methylpyrazine (C log P: −0.86), pyrimidine (C log P: −0.31), 2,4-diaminopyrimidine (C log P: −0.34), 4,6-dihydroxypyrimidine (C log P: 0.93), 2-pyrazoline (C log P: −0.57), 3-pyrazoline (C log P: −1.54), N-aminomorpholine (C log P: −1.22), and N-(2-aminoethyl)morpholine (C log P: −0.33).

(5) Low Molecular Compound Having Nitrogen Atom and Group Capable of Leaving by Action of Acid The composition of the present invention can contain a low molecular compound (hereinafter referred to as a "low molecular compound (D)" or a "compound (D)") which has a nitrogen atom and a group capable of leaving by the action of an acid, as the basic compound (XC). The low molecular compound (D) preferably has basicity after the group capable of leaving by the action of an acid leaves.

The group capable of leaving by the action of an acid is not particularly limited, but an acetal group, a carbonate group, a carbamate group, a tertiary ester group, a tertiary hydroxyl group, or a hemiaminal ether group is preferable, and a carbamate group or a hemiaminal ether group is particularly preferable.

The molecular weight of the low molecular compound (D) having a group capable of leaving by the action of an acid is preferably 100 to 1,000, more preferably 100 to 700, and particularly preferably 100 to 500.

As the compound (D), an amine derivative having a group capable of leaving by the action of an acid on a nitrogen atom is preferable.

The compound (D) may also have a carbamate group having a protecting group on a nitrogen atom. The protecting group constituting the carbamate group can be represented by General Formula (d-1).

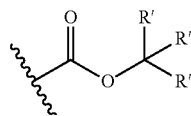 (d-1)

In General Formula (d-1),

R″s each independently represent a hydrogen atom, a linear or branched alkyl group, a cycloalkyl group, an aryl group, an aralkyl group, or an alkoxyalkyl group. R″s may be bonded to each other to form a ring.

R′ is preferably a linear or branched alkyl group, a cycloalkyl group, or an aryl group, and more preferably a linear or branched alkyl group or a cycloalkyl group.

Specific structures of such groups are shown below.

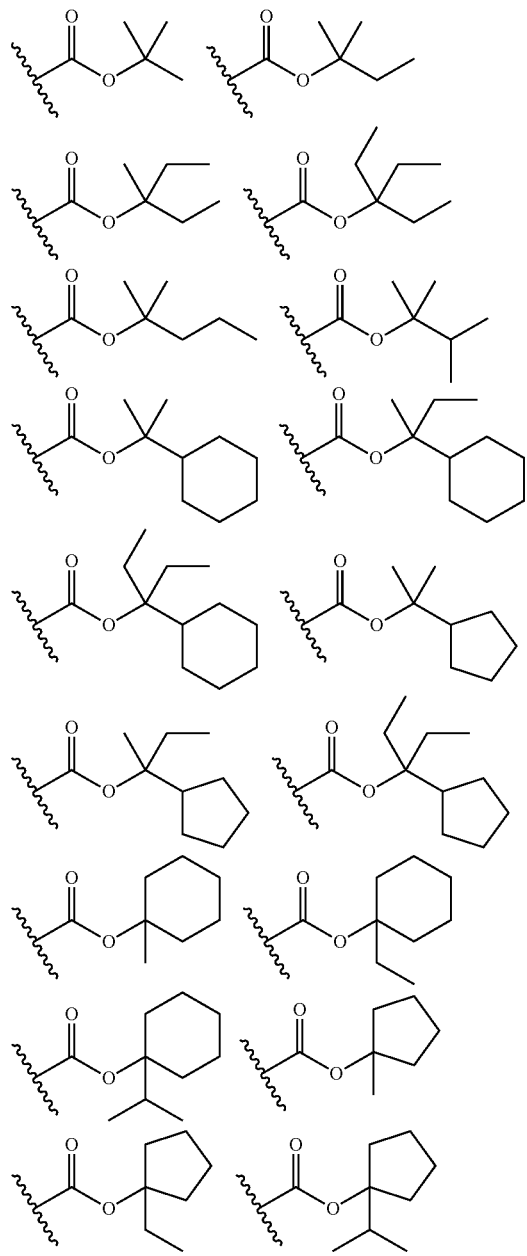

-continued

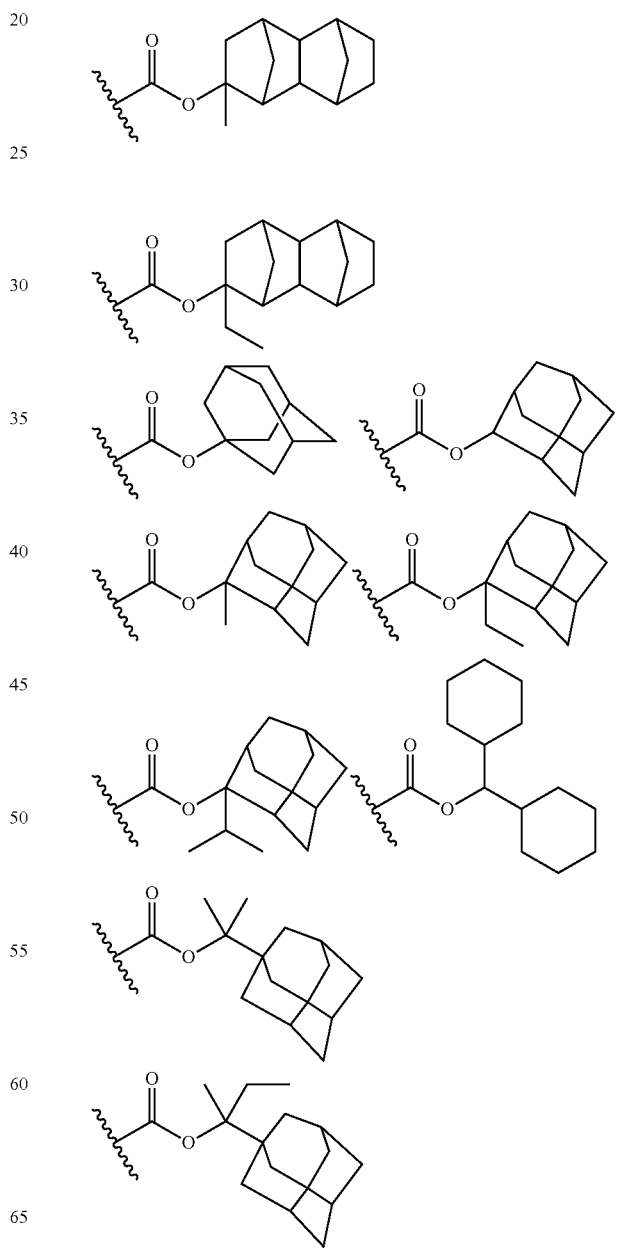

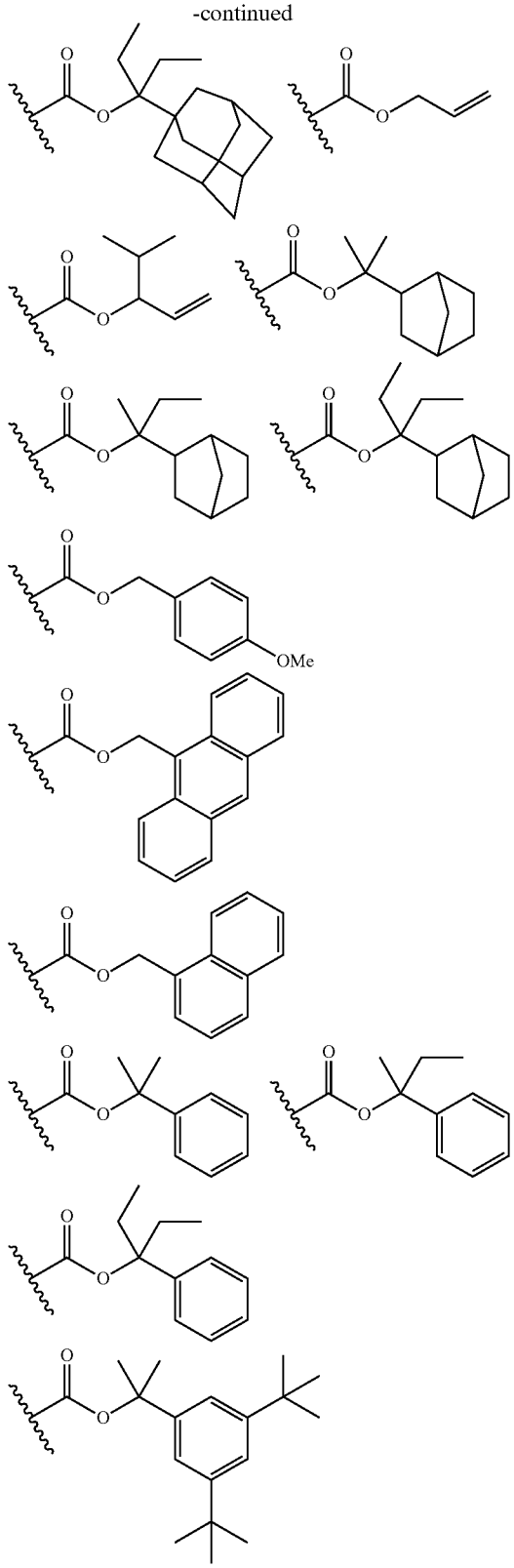

The compound (D) can be constituted with a combination of the above-mentioned basic compound and a structure represented by General Formula (d-1).

The compound (D) is particularly preferably a compound having a structure represented by General Formula (A).

Incidentally, the compound (D) may correspond to the above-mentioned basic compound as long as it is a low molecular compound having a group capable of leaving by the action of an acid.

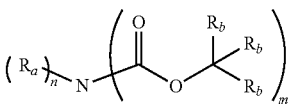

(A)

In General Formula (A), $R_a$ represents a hydrogen atom, an alkyl group, a cycloalkyl group, an aryl group, or an aralkyl group. Further, with n=2, two $R_a$'s may be the same as or different from each other, and two $R_a$'s may be bonded to each other to form a divalent heterocyclic hydrocarbon group (preferably having 20 or less carbon atoms) or a derivative thereof.

$R_b$'s each independently represent a hydrogen atom, an alkyl group, a cycloalkyl group, an aryl group, an aralkyl group, or an alkoxyalkyl group, provided that in a case where one or more $R_b$ in —C($R_b$)($R_b$)($R_b$) are hydrogen atoms, at least one of the remaining $R_b$'S is a cyclopropyl group, a 1-alkoxyalkyl group, or an aryl group.

At least two $R_b$'s may be bonded to each other to form an alicyclic hydrocarbon group, an aromatic hydrocarbon group, a heterocyclic hydrocarbon group, or a derivative thereof.

n represents an integer of 0 to 2, and m represents an integer of 1 to 3, with n+m=3.

In General Formula (A), the alkyl group, the cycloalkyl group, the aryl group, and the aralkyl group represented by each of $R_a$ and $R_b$ may be substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by $R_b$.

Examples of the alkyl group, the cycloalkyl group, the aryl group, and the aralkyl group (each of the alkyl group, the cycloalkyl group, the aryl group, and the aralkyl group may be substituted with the functional group, an alkoxy group, or a halogen atom) of $R_a$ and/or $R_b$ include:

a group derived from a linear or branched alkane, such as methane, ethane, propane, butane, pentane, hexane, heptane, octane, nonane, decane, undecane, and dodecane, or a group in which the group derived from an alkane is substituted with one or more kinds of or one or more groups of cycloalkyl groups such as a cyclobutyl group, a cyclopentyl group, and a cyclohexyl group, a group derived from a cycloalkane, such as cyclobutane, cyclopentane, cyclohexane, cycloheptane, cyclooctane, norbornane, adamantane, and noradamantane, or a group in which the group derived from a cycloalkane is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group, a group derived from an aromatic compound, such as benzene, naphthalene, and anthracene, or a group in which the group derived from an aromatic compound is substituted with one or more kinds of or one or more groups of linear or branched alkyl groups such as a methyl group, an ethyl group, an n-propyl group, an i-propyl group, an n-butyl group, a 2-methylpropyl group, a 1-methylpropyl group, and a t-butyl group, a group derived from a heterocyclic compound, such as pyrrolidine, piperidine, morpholine, tetrahydrofuran, tetrahydropyran, indole, indoline, quinoline, perhydroquinoline, indazole, and benzimidazole, or a group in which the group derived from a heterocyclic compound is substituted with one or more kinds of or one or more groups of linear or branched alkyl groups or aromatic compound-derived groups, a group in which the group derived from a linear or branched alkane or the group derived from a cycloalkane is substituted with one or more kinds of or one or more groups of aromatic compound-derived groups such as a phenyl group, a naphthyl group, and an anthracenyl group, and a group in which the substituent above is substituted with a functional group such as a hydroxyl group, a cyano group, an amino group, a pyrrolidino group, a piperidino group, a morpholino group, and an oxo group.

Moreover, examples of the divalent heterocyclic hydrocarbon group (preferably having 1 to 20 carbon atoms) formed by the mutual bonding of $R_a$'s, or a derivative thereof include a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline, and 1,5,9-triazacyclododecane, and a group in which the group derived from a heterocyclic compound is substituted with one or more kinds of or one or more groups of a linear or branched alkane-derived group, a cycloalkane-derived group, an aromatic compound-derived group, a heterocyclic compound-derived group, and a functional group such as a hydroxyl group, a cyano group, an amino group, a pyrrolidino group, a piperidino group, a morpholino group, and an oxo group.

Specific examples of the particularly preferred compound (D) in the present invention include the following compounds, but the present invention is not limited thereto.

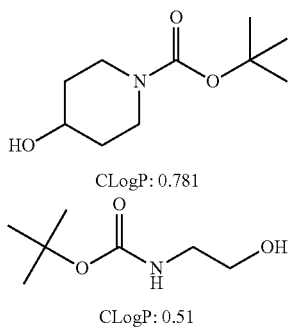

The compound represented by General Formula (A) can be synthesized in accordance with JP2007-298569A, JP2009-199021A, or the like.

In the present invention, the low molecular compound (D) may be used singly or as a mixture of two or more kinds thereof.

Other examples of the low molecular compound which can be used include the compounds synthesized in Examples of JP2002-363146A and the compounds described in paragraph 0108 of JP2007-298569A.

A photosensitive basic compound may also be used as the basic compound. As the photosensitive basic compound, for example, the compounds described in JP2003-524799A, J. Photopolym. Sci. & Tech., Vol. 8, pp. 543 to 553 (1995), or the like can be used.

(Base Generator)

As described above, examples of the basic compound (XC) also include a base generator having a C log P value of 1.30 or less.

Examples of the base generator (photobase generator) with a C log P of 1.30 or less, which can be contained in a composition for forming an upper layer film, include the compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B.

Furthermore, the compounds described in JP2010-243773A are also appropriately used.

Specific suitable examples of the photobase generator with a C log P of 1.30 or less include 2-nitrobenzyl carbamate, but are not limited thereto.

The content of the basic compound with a C log P of 1.30 or less in the topcoat composition is preferably 0.01% to 20% by mass, more preferably 0.1% to 10% by mass, and still more preferably 0.3% to 5% by mass, with respect to the solid content of the topcoat composition.

The compound (b) with a C log P of 1.30 or less may be used singly or in combination of a plurality of kinds thereof.

<Solvent (XD)>

In order to form a good pattern while not dissolving the actinic ray-sensitive or radiation-sensitive film, it is preferable that the composition for forming an upper layer film in the present invention contains a solvent in which the actinic ray-sensitive or radiation-sensitive film is not dissolved, and it is more preferable that a solvent with components different from an organic developer is used.

Incidentally, from the viewpoint of the prevention of elution into an immersion liquid, low solubility in an immersion liquid is preferred, and low solubility in water is more preferable. In the present specification, the description of "having low solubility in an immersion liquid" represents insolubility in an immersion liquid. Similarly, "having low solubility in water" means insolubility in water. Further, from the viewpoints of volatility and coatability, the boiling point of the solvent is preferably 90° C. to 200° C.

The description of "having low solubility in an immersion liquid" indicates that in an example of the solubility in water, in a case where a composition for forming an upper layer film is applied onto a silicon wafer and dried to form a film, and then the film is immersed in pure water at 23° C. for 10 minutes, the decrease rate in the film thickness after drying is within 3% of the initial film thickness (typically 50 nm).

In the present invention, from the viewpoint of uniformly applying the topcoat (upper layer film), a solvent having a concentration of the solid contents of preferably 0.01% to 20% by mass, more preferably 0.1% to 15% by mass, and most preferably 1% to 10% by mass is used.

The solvent that can be used is not particularly limited as long as it can dissolve the above-mentioned resins (XA) and (XB), and does not dissolve the actinic ray-sensitive or radiation-sensitive film, but suitable examples thereof include an alcohol-based solvent, an ether-based solvent, an ester-based solvent, a fluorine-based solvent, and a hydrocarbon-based solvent, with a non-fluorinated alcohol-based solvent being more preferably used. Thus, the non-dissolving property for the actinic ray-sensitive or radiation-sensitive film is further enhanced and in a case where the composition for forming an upper layer film is applied onto the actinic ray-sensitive or radiation-sensitive film, a topcoat (upper layer film) can be more uniformly formed without dissolving the actinic ray-sensitive or radiation-sensitive film. The viscosity of the solvent is preferably 5 centipoises (cP) or less, more preferably 3 cP or less, still more preferably 2 cP or less, and particularly preferably 1 cP or less. Further, centipoises can be converted into pascal seconds according to the following formula:

$$1,000 cP = 1\ Pa \cdot s.$$

From the viewpoint of coatability, the alcohol-based solvent is preferably a monohydric alcohol, and more preferably a monohydric alcohol having 4 to 8 carbon atoms. As the monohydric alcohol having 4 to 8 carbon atoms, a linear, branched, or cyclic alcohol may be used, but a linear or branched alcohol is preferable. As such an alcohol-based solvent, for example, alcohols such as 1-butanol, 2-butanol, 3-methyl-1-butanol, 4-methyl-1-pentanol, 4-methyl-2-pentanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, and 4-octanol; glycols such as ethylene glycol, propylene glycol, diethylene glycol, and triethylene glycol; glycol ethers such as ethylene glycol monomethyl ether, propylene glycol monomethyl ether, diethylene glycol monomethyl ether, triethylene glycol monoethyl ether, and methoxymethylbutanol; or the like can be used. Among those, alcohol and glycol ether are preferable, and 1-butanol, 1-hexanol, 1-pentanol, 3-methyl-1-butanol, 4-methyl-1-pentanol, 4-methyl-2-pentanol, and propylene glycol monomethyl ether are more preferable.

In another embodiment of the present invention, as the alcohol-based solvent, a secondary alcohol is preferable from the viewpoints of temporal stability and coatability, and specific examples thereof include the secondary alcohols in the specific examples of the above-mentioned monohydric alcohols.

Examples of the ether-based solvent include, in addition to the glycol ether-based solvents, dioxane, tetrahydrofuran, isoamyl ether, and diisoamyl ether. Among the ether-based solvents, an ether-based solvent having a branched structure is preferable.

Examples of the ester-based solvent include methyl acetate, ethyl acetate, isopropyl acetate, butyl acetate (n-butyl acetate), pentyl acetate, hexyl acetate, isoamyl acetate, butyl propionate (n-butyl propionate), butyl butyrate, isobutyl butyrate, butyl butanoate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, methyl 2-hydroxyisobutyrate, isobutyl isobutyrate, and butyl propionate. Among the ester-based solvents, an ester-based solvent having a branched structure is preferable.

Examples of the fluorine-based solvent include 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-octanediol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, and perfluorotetrapentylamine. Among those, a fluorinated alcohol and a fluorinated hydrocarbon-based solvent can be suitably used.

Examples of the hydrocarbon-based solvent include aromatic hydrocarbon-based solvents such as toluene, xylene, and anisole; and aliphatic hydrocarbon-based solvents such as n-heptane, n-nonane, n-octane, n-decane, 2-methylheptane, 3-methylheptane, 3,3-dimethylhexane, and 2,3,4-trimethylpentane.

These solvents are used singly or as a mixture of a plurality of kinds thereof.

In a case of mixing other solvents with the solvents, the mixing ratio is usually 0% to 30% by mass, preferably 0% to 20% by mass, and more preferably 0% to 10% by mass, with the total amount of solvents of the actinic ray-sensitive or radiation-sensitive composition. By mixing a solvent other than the above-mentioned solvents, the solubility for the actinic ray-sensitive or radiation-sensitive film, the solubility of the resin in the composition for forming an upper layer film, the elution characteristics from the actinic ray-sensitive or radiation-sensitive film, or the like can be appropriately adjusted.

In a case of using a mixture of a plurality of solvents as the solvent (XD), in one embodiment, it is preferable to use a mixed solvent including at least one secondary alcohol and at least one ether-based solvent. As compared with a case of using a secondary alcohol as the solvent (XD) singly, it may be preferable in some cases to use a mixed solvent with an ether-based solvent since the viscosity of the composition for forming an upper layer film decreases.

<Surfactant>

The composition for forming an upper layer film of the present invention may further contain a surfactant.

The surfactant is not particularly limited, and any of an anionic surfactant, a cationic surfactant, and a nonionic surfactant can be used as long as it can form a film with the composition for forming an upper layer film and can be dissolved in the solvent of the composition for forming an upper layer film.

The amount of the surfactant to be added is preferably 0.001% to 20% by mass, and more preferably 0.01% to 10% by mass, with respect to the total solid content in the composition for forming an upper layer film.

The surfactant may be used singly or in combination of two or more kinds thereof.

As the surfactant, for example, one selected from an alkyl cation-based surfactant, an amide-type quaternary cation-based surfactant, an ester type quaternary cation-based surfactant, an amine oxide-based surfactant, a betaine-based surfactant, an alkoxylate-based surfactant, a fatty acid ester-based surfactant, an amide-based surfactant, an alcohol-based surfactant, an ethylenediamine-based surfactant, and a fluorine-based and/or silicon-based surfactant (a fluorine-based surfactant, a silicon-based surfactant, or a surfactant having both of a fluorine atom and a silicon atom) can be suitably used.

Specific examples of the surfactant include polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene/polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; surfactants such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; and commercially available surfactants mentioned later.

Examples of the commercially available surfactants that can be used include fluorine-based surfactants or silicon-based surfactants such as EFTOP EF301 and EF303 (manufactured by Shin-Akita Kasei K. K.), FLORAD FC430, 431, and 4430 (manufactured by Sumitomo 3M Inc.), MEGAFAC F171, F173, F176, F189, F113, F110, F177, F120, and R08 (manufactured by DIC Corp.), SURFLON S-382, SC101, 102, 103, 104, 105, and 106 (manufactured by Asahi Glass Co., Ltd.), TROYSOL S-366 (manufactured by Troy Chemical Corp.), GF-300 and GF-150 (manufactured by Toagosei Chemical Industry Co., Ltd.), SURFLON S-393 (manufactured by Seimi Chemical Co., Ltd.), EFTOP EF121, EF122A, EF122B, RF122C, EF125M, EF135M, EF351, EF352, EF801, EF802, and EF601 (manufactured by JEMCO Inc.), PF636, PF656, PF6320, and PF6520 (manufactured by OMNOVA Solutions Inc.), and FTX-204D, 208G, 218G, 230G, 204D, 208D, 212D, 218, and 222D (manufactured by NEOS COMPANY LIMITED). In addition, Polysiloxane Polymer KP-341 (manufactured by Shin-Etsu Chemical Co., Ltd.) can also be used as the silicon-based surfactant.

<Method for Preparing Composition for Forming Upper Layer Film>

The composition for forming an upper layer film of the present invention is preferably used by dissolving the respective components in a solvent, and filtering the solution through a filter. The filter is preferably a polytetrafluoroethylene-, polyethylene-, or nylon-made filter having a pore size of 0.1 μm or less, more preferably 0.05 μm or less, and still more preferably 0.03 μm or less. Further, filtration may be carried out by connecting plural kinds of filters in series or in parallel. In addition, the composition may be filtered in plural times or the multiple filtration process may be a circular filtration process. Further, the composition may be subjected to a deaeration treatment or the like before or after filtration through a filter. It is preferable that the composition for forming an upper layer film of the present invention does not include impurities such as metals. The content of the impurities included in these materials is preferably 10 ppm or less, more preferably 5 ppm or less, and still more preferably 1 ppm or less, but particularly preferably, metal components are not substantially included (within a detection limit of a measurement apparatus, or less).

[Actinic Ray-Sensitive or Radiation-Sensitive Resin Composition]

Next, the actinic ray-sensitive or radiation-sensitive resin composition which can be suitably used in the pattern forming method of the present invention will be described.

(A) Resin

The actinic ray-sensitive or radiation-sensitive resin composition of the present invention typically contains a resin capable of decreasing the solubility in a developer including an organic solvent due to an increase in the polarity by the action of an acid.

The resin capable of decreasing the solubility in a developer including an organic solvent due to an increase in the polarity by the action of an acid (hereinafter also referred to as a "resin (A)") is preferably a resin (hereinafter also referred to as an "acid-decomposable resin" or an "acid-decomposable resin (A)") having a group (hereinafter also referred to as an "acid-decomposable group") capable of decomposing by the action of an acid to generate an alkali-soluble group at either the main chain or the side chain of the resin, or at both the main chain and the side chain.

Furthermore, the resin (A) is more preferably a resin having an alicyclic hydrocarbon structure which is monocyclic or polycyclic (hereinafter also referred to as an "alicyclic hydrocarbon-based acid-decomposable resin"). It is thought that the resin having an alicyclic hydrocarbon structure which is monocyclic or polycyclic has high hydrophobicity and has improved developability in a case of developing an area of the actinic ray-sensitive or radiation-sensitive film having a weak light irradiation intensity by an organic developer.

The actinic ray-sensitive or radiation-sensitive resin composition of the present invention, which contains the resin (A), can be suitably used in a case of irradiation with ArF excimer laser light.

Examples of the alkali-soluble group included in the resin (A) include a group having a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl) imido group, a tris(alkylcarbonyl)methylene group, and a tris(alkylsulfonyl)methylene group.

Preferred examples of the alkali-soluble group include a carboxylic acid group, a fluorinated alcohol group (preferably hexafluoroisopropanol), and a sulfonic acid group.

A preferred group capable of decomposing by an acid (acid-decomposable group) is a group obtained by substituting a hydrogen atom of these alkali-soluble groups with a group capable of leaving with an acid.

Examples of the group capable of leaving by an acid include $-C(R_{36})(R_{37})(R_{38})$, $-C(R_{36})(R_{37})(OR_{39})$, and $-C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the acid-decomposable group, a cumyl ester group, an enol ester group, an acetal ester group, a tertiary alkyl ester group, and the like are preferable, and a tertiary alkyl ester group is more preferable.

The resin (A) is preferably a resin containing repeating units having partial structures represented by General Formulae (pI) to (pV).

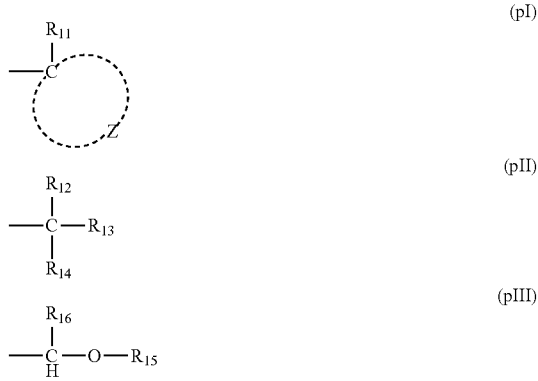

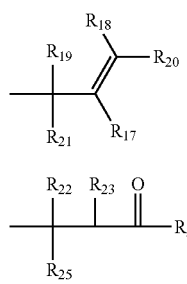
(pIV)

(pV)

In General Formulae (pI) to (pV), $R_{11}$ represents a methyl group, an ethyl group, an n-propyl group, an isopropyl group, an n-butyl group, an isobutyl group, or a sec-butyl group, and Z represents an atomic group which is necessary for forming a cycloalkyl group together with carbon atoms.

$R_{12}$ to $R_{16}$ each independently represent a cycloalkyl group or a linear or branched alkyl group having 1 to 4 carbon atoms, provided that at least one of $R_{12}, \ldots$, or $R_{14}$, or any one of $R_{15}$ and $R_{16}$ is a cycloalkyl group.

$R_{17}$ to $R_{21}$ each independently represent a hydrogen atom, a cycloalkyl group, or a linear or branched alkyl group having 1 to 4 carbon atoms, provided that at least one of $R_{17}, \ldots$, or $R_{21}$ is a cycloalkyl group. Further, any one of $R_{19}$ and $R_{21}$ is a linear or branched alkyl group or cycloalkyl group, having 1 to 4 carbon atoms.

$R_{22}$ to $R_{25}$ each independently represent a hydrogen atom, a cycloalkyl group, or a linear or branched alkyl group having 1 to 4 carbon atoms, provided that at least one of $R_{22}, \ldots$, or $R_{25}$ represents a cycloalkyl group. Further, $R_{23}$ and $R_{24}$ may be bonded to each other to form a ring.

In General Formulae (pI) to (pV), the alkyl group in each of $R_{12}$ to $R_{25}$ is a linear or branched alkyl group having 1 to 4 carbon atoms.

The cycloalkyl group in each of $R_{11}$ to $R_{25}$ or the cycloalkyl group formed by Z together with carbon atoms may be monocyclic or polycyclic. Specific examples thereof include a group having 5 or more carbon atoms and having a monocyclo, bicyclo, tricyclo, or tetracyclo structure. These cycloalkyl groups preferably have 6 to 30 carbon atoms, and particularly preferably 7 to 25 carbon atoms. These cycloalkyl groups may have a substituent.

Preferred examples of the cycloalkyl group include an adamantyl group, a noradamantyl group, a decalin residue, a tricyclodecanyl group, a tetracyclododecanyl group, a norbornyl group, cedrol group, a cyclopentyl group, a cyclohexyl group, a cycloheptyl group, a cyclooctyl group, a cyclodecanyl group, and a cyclododecanyl group. More preferred examples thereof include an adamantyl group, a norbornyl group, a cyclohexyl group, a cyclopentyl group, a tetracyclododecanyl group, and a tricyclodecanyl group.

Examples of a substituent which may further be included in these alkyl groups and cycloalkyl groups include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). Examples of the substituent which may further be included in the alkyl group, the alkoxy group, the alkoxycarbonyl group, or the like include a hydroxyl group, a halogen atom, and an alkoxy group.

The structures represented by General Formulae (pI) to (pV) in the resin can be used in the protection of the alkali-soluble group. Examples of the alkali-soluble group include various groups that have been known in the technical field.

Specific examples of the structure include a structure in which a hydrogen atom in a carboxylic acid group, a sulfonic acid group, a phenol group, or a thiol group is substituted with a structure represented by any one of General Formulae (pI) to (pV), with a structure in which a hydrogen atom in a carboxylic acid group or a sulfonic acid group is substituted with a structure represented by any one of General Formulae (pI) to (pV) being preferable.

As the repeating unit having an alkali-soluble group protected by the structure represented by one of General Formulae (pI) to (pV), a repeating unit represented by General Formula (pA) is preferable.

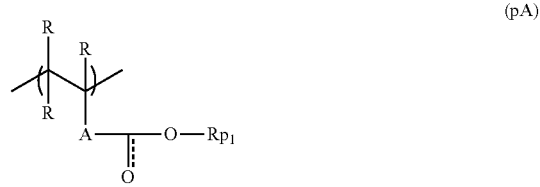
(pA)

Here, R represents a hydrogen atom, a halogen atom, or a linear or branched alkyl group having 1 to 4 carbon atoms, and a plurality of R's may be the same as or different from each other.

A is a single bond, or one group or a combination of two or more groups selected from the group consisting of an alkylene group, an ether group, a thioether group, a carbonyl group, an ester group, an amido group, a sulfonamido group, a urethane group, or a urea group, with the single bond being preferable.

$Rp_1$ is a group of any one of Formulae (pI) to (pV).

The repeating unit represented by General Formula (pA) is particularly preferably a repeating unit derived from 2-alkyl-2-adamantyl (meth)acrylate or dialkyl (1-adamantyl)methyl (meth)acrylate.

Specific examples of the repeating unit represented by General Formula (pA) are shown below, but the present invention is not limited thereto.

(In the following formulae, Rx represents H, $CH_3$, or $CH_2OH$; and Rxa and Rxb each represent an alkyl group having 1 to 4 carbon atoms.)

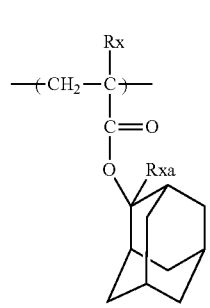

1

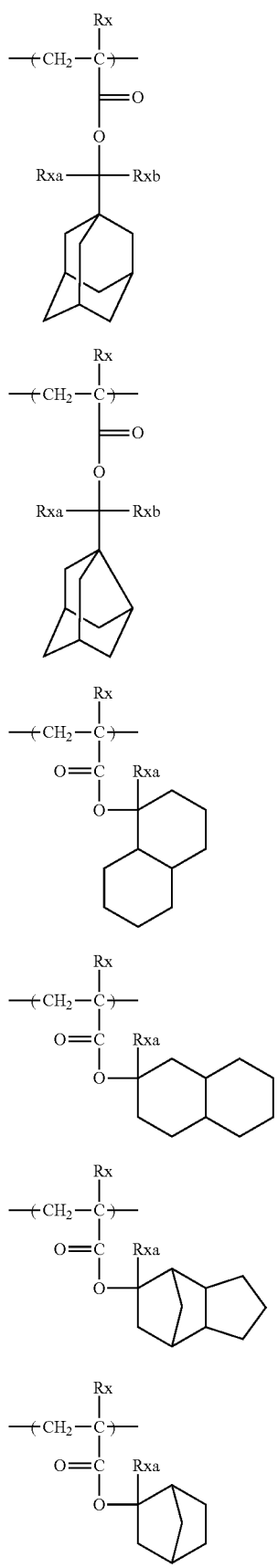
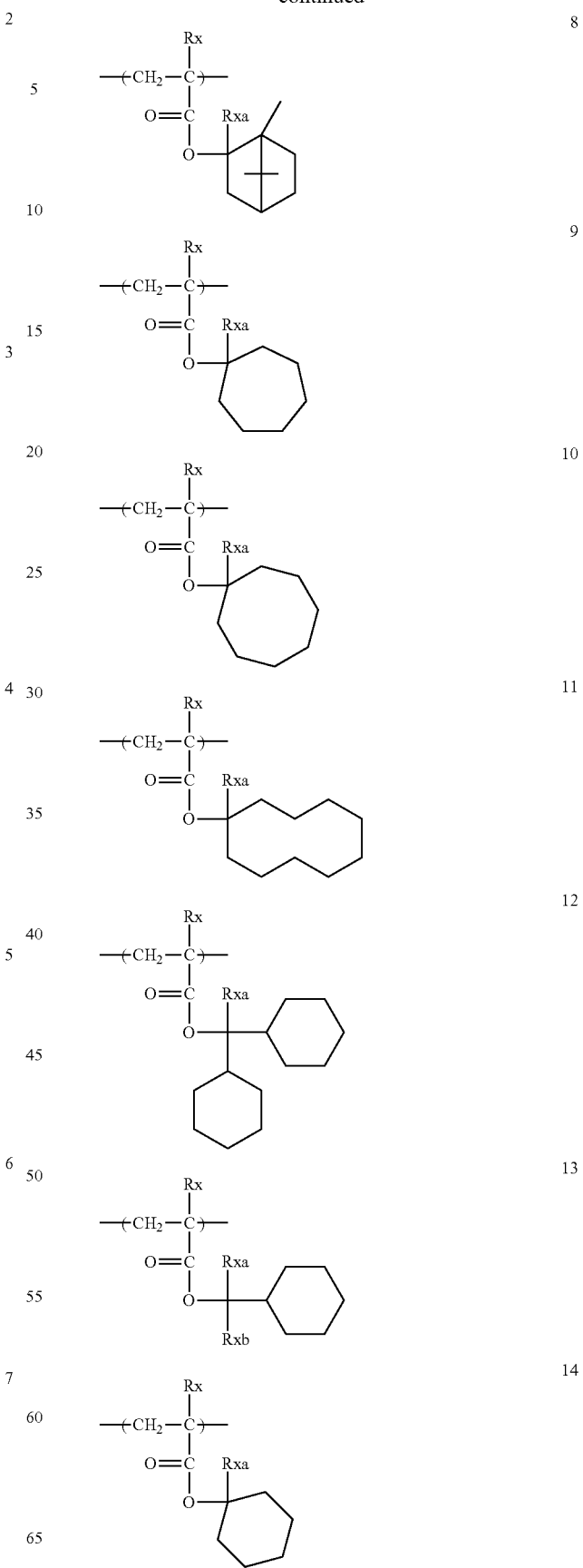

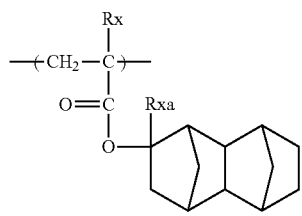

The repeating unit having an acid-decomposable group contained in the resin (A) may be used alone or in combination of two or more kinds thereof.

The resin (A) preferably contains a repeating unit having a lactone structure or a sultone (cyclic sulfonic acid ester) structure.

As the lactone group or the sultone group, any group may be used as long as it has a lactone structure or a sultone structure, but the structure is preferably a 5- to 7-membered ring lactone structure or sultone structure, and preferably a 5- to 7-membered ring lactone structure or sultone structure to which another ring structure is fused in the form of forming a bicyclo structure or a spiro structure. The resin (A) still more preferably has a repeating unit having a lactone structure or a sultone structure represented by any one of General Formulae (LC1-1) to (LC1-17), (SL1-1), and (SL1-2). Further, the lactone structure or the sultone structure may be bonded directly to the main chain. The lactone structures or the sultone structures are preferably (LC1-1), (LC1-4), (LC1-5), and (LC1-8), and more preferably (LC1-4). By using such a specific lactone structure or sultone structure, LWR and development defects are relieved.

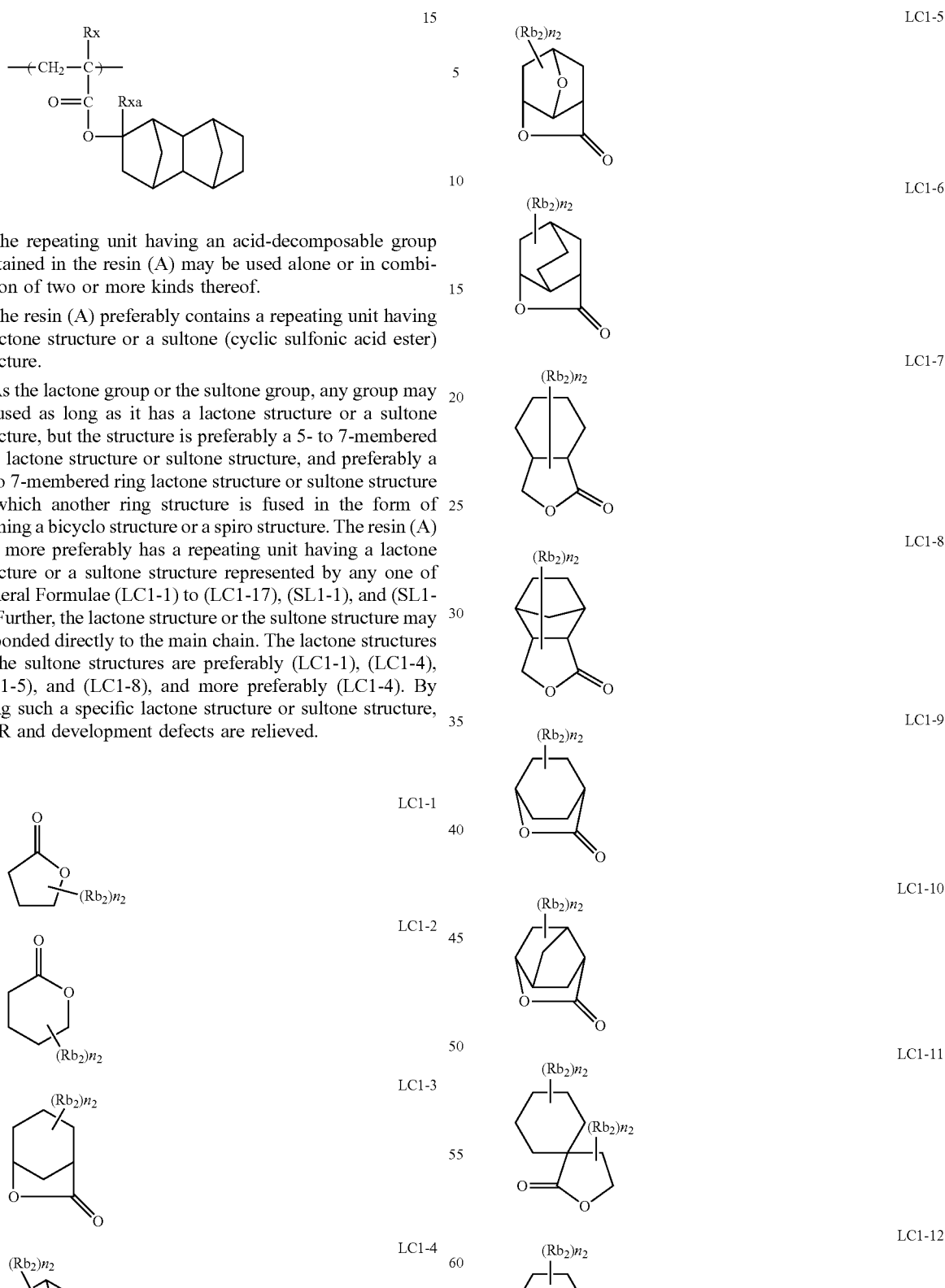

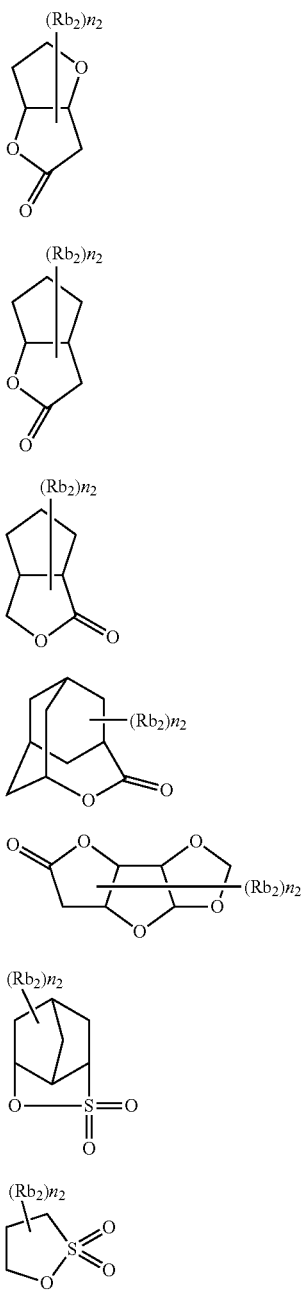

The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among those, an alkyl group having 1 to 4 carbon atoms, a cyano group, and an acid-decomposable group are more preferable. $n_2$ represents an integer of 0 to 4. In a case where $n_2$ is 2 or more, the substituents ($Rb_2$) which are present in plural numbers may be the same as or different from each other, and further, the substituents ($Rb_2$) which are present in plural numbers may be bonded to each other to form a ring.

The repeating unit having a lactone group or a sultone group usually has an optical isomer, and any optical isomer may be used. Further, one kind of optical isomer may be used alone or a plurality of optical isomers may be mixed and used. In a case of mainly using one kind of optical isomer, the optical purity (ee) thereof is preferably 90% or more, and more preferably 95% or more.

The content of the repeating unit having a lactone structure or a sultone structure, other than the repeating unit represented by General Formula (III), is preferably 15% to 60% by mole, more preferably 20% to 50% by mole, and still more preferably 30% to 50% by mole, with respect to all the repeating units in the resin in a case where the repeating units are contained in a plurality of kinds.

In order to enhance the effects of the present invention, it is also possible to use two or more kinds of the repeating units having a lactone structure or a sultone structure selected from General Formula (III) in combination. In a case of using them in combination, it is preferable to use two or more selected from the lactone or sultone repeating units of General Formula (III) in which n is 0 in combination.

In a case where the actinic ray-sensitive or radiation-sensitive resin composition of the present invention is to be used for ArF exposure, from the viewpoint of the transparency to the ArF light, it is preferable that the resin (A) is free of an aromatic group.

The resin (A) is preferably a resin in which all the repeating units are composed of (meth)acrylate-based repeating units. In this case, all the repeating units may be methacrylate-based repeating units, all the repeating units may be acrylate-based repeating units, or all the repeating units may be composed of methacrylate-based repeating units and acrylate-based repeating units, but the acrylate-based repeating units preferably account for 50% by mole or less with respect to all the repeating units.

Preferred examples of the resin (A) include the resins described in paragraphs [0152] to [0158] of JP2008-309878A, but the present invention is not limited thereto.

The resin (A) can be synthesized by an ordinary method (for example, radical polymerization). Examples of the general synthesis method include a batch polymerization method of dissolving monomer species and an initiator in a solvent and heating the solution, thereby carrying out the polymerization, and a dropwise-addition polymerization method of adding dropwise a solution containing monomer species and an initiator to a heated solvent for 1 to 10 hours, with the dropwise-addition polymerization method being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate, amide solvents such as dimethyl formamide and dimethyl acetamide; and solvents which dissolve the actinic ray-sensitive or radiation-sensitive resin composition of the present invention, such as propylene glycol monomethyl ether acetate, propylene glycol monomethyl ether, and cyclohexanone, which will be described later. It is more preferable to carry out polymerization using the same solvent as the solvent used in the actinic ray-sensitive or radiation-sensitive resin composition of the present invention. Thus, generation of the particles during storage can be suppressed.

It is preferable that the polymerization reaction is carried out in an inert gas atmosphere such as nitrogen and argon. As the polymerization initiator, commercially available radical initiators (azo-based initiators, peroxides, or the like) are used to initiate the polymerization. As the radical initiator, an azo-based initiator is preferable, and the azo-based initiator having an ester group, a cyano group, or a carboxyl group is preferable. Preferred examples of the initiators include azobisisobutyronitrile, azobisdimethylvaleronitrile, and dimethyl 2,2'-azobis(2-methyl propionate). The initiator is added or added in portionwise, depending on the purposes, and after completion of the reaction, the reaction mixture is poured into a solvent, and then a desired polymer is recovered by a method such as powder and solid recovery. The concentration of the reactant is 5% to 50% by mass, and preferably 10% to 30% by mass. The reaction temperature is usually 10° C. to 150° C., preferably 30° C. to 120° C., and more preferably 60° C. to 100° C.

For the purification, an ordinary method such as a liquid-liquid extraction method of applying water washing or combining it with an appropriate solvent to remove the residual monomers or oligomer components; a purification method in a solution state, such as ultrafiltration of extracting and removing only the polymers having a molecular weight no more than a specific molecular weight; a re-precipitation method of dropwise adding a resin solution into a poor solvent to solidify the resin in the poor solvent, thereby removing the residual monomers and the like; and a purification method in a solid state, such as washing of a resin slurry with a poor solvent after separation of the slurry by filtration can be applied.

The weight-average molecular weight (Mw) of the resin (A) is preferably 1,000 to 200,000, more preferably 1,000 to 20,000, and still more preferably 1,000 to 15,000, as a value in terms of polystyrene by means of gel permeation chromatography (GPC). By setting the weight-average molecular weight to 1,000 to 200,000, the heat resistance or the dry etching resistance can be prevented from being deteriorated, and the film forming properties can be prevented from being deteriorated due to deteriorated developability or increased viscosity.

The dispersity (molecular weight distribution) which is a ratio (Mw/Mn) of the weight-average molecular weight (Mw) to the number-average molecular weight (Mn) in the resin (A) is in a range of usually 1 to 5, preferably 1 to 3, more preferably 1.2 to 3.0, and particularly preferably 1.2 to 2.0 is used. As the dispersity is smaller, the resolution and the pattern shape are excellent, the side wall of the resist pattern is smooth, and the roughness is excellent.

The content of the resin (A) in the entire actinic ray-sensitive or radiation-sensitive resin composition of the present invention is preferably 50% to 99.9% by mass, and more preferably 60% to 99.0% by mass in the total solid content.

Furthermore, in the present invention, the resin (A) may be used singly or in combination of a plurality of kinds thereof.

It is preferable that the resin (A) contains neither a fluorine atom nor a silicon atom from the viewpoint of the compatibility with the composition for forming an upper layer film.

(B) Compound Capable of Generating Acid Upon Irradiation with Actinic Rays or Radiation The actinic ray-sensitive or radiation-sensitive resin composition of the present invention typically contains a compound capable of generating an acid upon irradiation with actinic rays or radiation (also referred to as a "photoacid generator").

As such a photoacid generator, a photoacid generator which is appropriately selected from known compounds capable of generating an acid upon irradiation with actinic rays or radiation which are used for a photoinitiator for cationic photopolymerization, a photoinitiator for radical photopolymerization, a photodecoloring agent for dyes, a photodiscoloring agent, a microresist, or the like, and a mixture thereof can be used.

Examples of the photoacid generator include a diazonium salt, a phosphonium salt, a sulfonium salt, an iodonium salt, imidosulfonate, oxime sulfonate, diazodisulfone, disulfone, and o-nitrobenzyl sulfonate.

In addition, a compound in which a group or compound capable of generating an acid upon irradiation with actinic rays or radiation is introduced into the main or side chain of the polymer, for example, the compounds described in U.S. Pat. No. 3,849,137A, GE3914407A, JP1988-26653A (JP-S63-26653A), JP1980-164824A (JPS55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), and the like can be used.

In addition, the compounds capable of generating an acid by light described in U.S. Pat. No. 3,779,778A, EP126712B, and the like can also be used.

The photoacid generator contained in the actinic ray-sensitive or radiation-sensitive resin composition of the present invention is preferably a compound capable of generating an acid having a cyclic structure upon irradiation with actinic rays or radiation. As the cyclic structure, a monocyclic or polycyclic alicyclic group is preferable, and a polycyclic alicyclic group is more preferable. It is preferable that carbonyl carbon is not included as a carbon atom constituting the ring skeleton of the alicyclic group.

Suitable examples of the photoacid generator contained in the actinic ray-sensitive or radiation-sensitive resin composition of the present invention include a compound (a specific acid generator) capable of generating an acid upon irradiation with actinic rays or radiation, represented by General Formula (3).

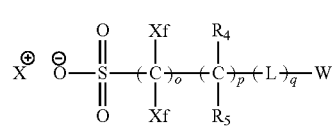

(3)

(Anion)

In General Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where $R_4$ and $R_5$ are present in plural numbers, they may be the same as or different from each other.

L represents a divalent linking group, and in a case where L's are present in plural numbers, they may be the same as or different from each other.

W represents an organic group including a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms in the alkyl group is preferably 1 to 10, and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. It is particularly preferable that both Xf's are fluorine atoms.

$R_4$ and $R_5$ each independently represent a hydrogen atom, a fluorine atom, an alkyl group, or an alkyl group substituted with at least one fluorine atom, and in a case where $R_4$ and $R_5$ are present in plural numbers, they may be the same as or different from each other.

The alkyl group as each of $R_4$ and $R_5$ may have a substituent, and preferably has 1 to 4 carbon atoms. $R_4$ and $R_5$ are each preferably a hydrogen atom.

Specific examples and suitable embodiments of the alkyl group substituted with at least one fluorine atom are the same as the specific examples and suitable embodiments of Xf in General Formula (3).

L represents a divalent linking group, and in a case where L's are present in plural numbers, they may be the same as or different from each other.

Examples of the divalent linking group include —COO— (—C(=O)—O—), —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 10 carbon atoms), an alkenylene group (preferably having 2 to 6 carbon atoms), or a divalent linking group formed by combination of these plurality of groups. Among those, —COO—, —OCO—, —CONH—, —NHCO—, —CO—, —O—, —$SO_2$—, —COO-alkylene group-, —OCO-alkylene group-, —CONH-alkylene group-, or —NHCO-alkylene group- is preferable, and —COO—, —OCO—, —CONH—, —$SO_2$—, —COO-alkylene group-, or —OCO-alkylene group- is more preferable.

W represents an organic group including a cyclic structure. Above all, it is preferably a cyclic organic group.

Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, a diamantyl group, and an adamantyl group is preferable from the viewpoints of inhibiting diffusivity into the film during a post-exposure bake (PEB) process and improving a mask error enhancement factor (MEEF).

The aryl group may be monocyclic or polycyclic. Examples of the aryl group include a phenyl group, a naphthyl group, a phenanthryl group, and an anthryl group. Among those, a naphthyl group showing a relatively low light absorbance at 193 nm is preferable.

The heterocyclic group may be monocyclic or polycyclic, but a polycyclic heterocyclic group can further suppress diffusion of the acid. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle having no aromaticity include a tetrahydropyran ring, a lactone ring, a sultone ring, and a decahydroisoquinoline ring. As a heterocycle in the heterocyclic group, a furan ring, a thiophene ring, a pyridine ring, or a decahydroisoquinoline ring is particularly preferable. Further, examples of the lactone ring and the sultone ring include the lactone structures and sultone structures exemplified in the above-mentioned resin.

The cyclic organic group may have a substituent. Examples of the substituent include, an alkyl group (which may be either linear or branched, and preferably has 1 to 12 carbon atoms), a cycloalkyl group (which may be any one of monocyclic, polycyclic, and spiro rings, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (the carbon contributing to ring formation) may be a carbonyl carbon.

o represents an integer of 1 to 3. p represents an integer of 0 to 10. q represents an integer of 0 to 10.

In one embodiment, it is preferable that in General Formula (3), o is an integer of 1 to 3, p is an integer of 1 to 10, and q is 0. Xf is preferably a fluorine atom, $R_4$ and $R_5$ are preferably both hydrogen atoms, and W is preferably a polycyclic hydrocarbon group. o is more preferably 1 or 2, and still more preferably 1. p is more preferably an integer of 1 to 3, still more preferably 1 or 2, and particularly preferably 1. W is more preferably a polycyclic cycloalkyl group, and still more preferably an adamantyl group or a diamantyl group.

(Cation)

In General Formula (3), $X^+$ represents a cation.

$X^+$ is not particularly limited as long as it is a cation, but suitable embodiments thereof include cations (moieties other than $Z^-$) in General Formula (ZI), (ZII), or (ZIII) which will be described later.

Suitable Embodiments

Suitable embodiments of the specific acid generator include a compound represented by General Formula (ZI), (ZII), or (ZIII).

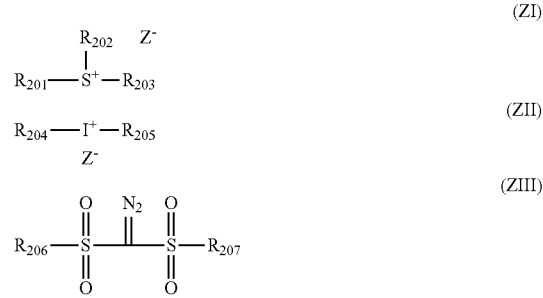

In General Formula (ZI), $R_{201}$, $R_{202}$, and $R_{203}$ each independently represent an organic group.

The number of carbon atoms in the organic group as $R_{201}$, $R_{202}$, and $R_{203}$ is generally 1 to 30, and preferably 1 to 20.

Furthermore, two of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two of $R_{201}$ to $R_{203}$ include an alkylene group (for example, a butylene group and a pentylene group).

$Z^-$ represents an anion in General Formula (3), and specifically represents the following anion.

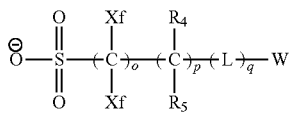

Examples of the organic group represented by $R_{201}$, $R_{202}$, and $R_{203}$ include groups corresponding to the compounds (ZI-1), (ZI-2), (ZI-3), and (ZI-4) which will be described later.

Incidentally, the specific acid generator may be a compound having a plurality of structures represented by General Formula (ZI). For example, it may be a compound having a structure in which at least one of $R_{201}$, . . . , or $R_{203}$ in the compound represented by General Formula (ZI) is bonded to at least one of $R_{201}$, . . . , or $R_{203}$ of another compound represented by General Formula (ZI) through a single bond or a linking group.

More preferred examples of the component (ZI) include the compounds (ZI-1), (ZI-2), (ZI-3), and (ZI-4) described below.

First, the compound (ZI-1) will be described.

The compound (ZI-1) is an arylsulfonium compound, that is, a compound having arylsulfonium as a cation, in which at least one of $R_{201}$, . . . , or $R_{203}$ in General Formula (ZI) is an aryl group.

In the arylsulfonium compound, all of $R_{201}$ to $R_{203}$ may be aryl groups, or some of $R_{201}$ to $R_{203}$ may be aryl groups, with the remainder being alkyl groups or cycloalkyl groups.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, as desired, in the arylsulfonium compound, is preferably a linear or branched alkyl group having 1 to 15 carbon atoms or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as the substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also encompasses an aromatic ring containing a heteroatom.

The organic group not containing an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of $R_{201}$ to $R_{203}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

The compound (ZI-3) is a compound represented by General Formula (ZI-3), which is a compound having a phenacylsulfonium salt structure.

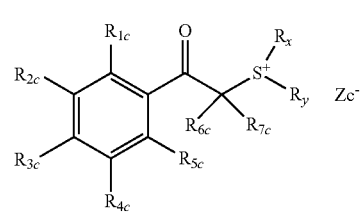

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Among any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$, each may be bonded to each other to form a ring structure, and the ring structure may include an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring formed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_{7c}$, and $R_x$ and $R_y$ include a butylene group and a pentylene group.

As groups formed by the bonding of $R_{5c}$ and $R_{6c}$, and $R_{5c}$ and $R_x$, a single bond or alkylene group is preferable, and examples of the alkylene group include a methylene group and an ethylene group.

$Zc^-$ represents an anion in General Formula (3), and specifically, is the same as described above.

Specific examples of the alkoxy group in the alkoxycarbonyl group as $R_{1c}$ to $R_{5c}$ are the same as the specific examples of the alkoxy group as $R_{1c}$ to $R_{5c}$.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$.

Specific examples of the aryl group in the aryloxy group and the arylthio group as $R_{1c}$ to $R_{5c}$ are the same as the specific examples of the aryl group as $R_{1c}$ to $R_{5c}$.

Examples of the cation in the compound (ZI-2) or (ZI-3) in the present invention include the cations described after paragraph [0036] of the specification of US2012/0076996A.

Next, the compound (ZI-4) will be described.

The compound (ZI-4) is represented by General Formula (ZI-4).

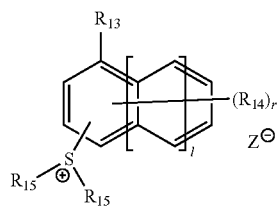

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

In a case where $R_{14}$'s are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to form a ring, the ring skeleton may include a heteroatom such as an oxygen atom and a nitrogen atom. In one embodiment, it is preferable that two $R_{15}$'s are alkylene groups, and are bonded to each other to form a ring structure.

l represents an integer of 0 to 2.

r represents an integer of 0 to 8.

$Z^-$ represents an anion in General Formula (3), and specifically, it is as described above.

In General Formula (ZI-4), the alkyl group of each of $R_{13}$, $R_{14}$, and $R_{15}$ is preferably an alkyl which is linear or branched and has 1 to 10 carbon atoms, and preferably a methyl group, an ethyl group, an n-butyl group, a t-butyl group, or the like.

Examples of the cation of the compound represented by General Formula (ZI-4) in the present invention include the cations described in paragraphs [0121], [0123], and [0124] of JP2010-256842A, paragraphs [0127], [0129], and [0130] of JP2011-76056A, and the like.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of each of $R_{204}$ to $R_{207}$ is preferably a phenyl group or a naphthyl group, and more preferably a phenyl group. The aryl group of each of $R_{204}$ to $R_{207}$ may be an aryl group having a heterocyclic structure containing an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in each of $R_{204}$ to $R_{207}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

The aryl group, the alkyl group, or the cycloalkyl group of each of $R_{204}$ to $R_{207}$ may have a substituent. Examples of the substituent which the aryl group, the alkyl group, or the cycloalkyl group of each of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion in General Formula (3), and specifically, is as described above.

The acid generators may be used singly or in combination of two or more kinds thereof.

The content of the acid generator (a total sum of contents in a case where the acid generators are present in a plurality of kinds) in the composition is preferably 0.1% to 30% by mass, more preferably 0.5% to 25% by mass, still more preferably 3% to 20% by mass, and particularly preferably 3% to 15% by mass, with respect to the total solid content of the composition.

In the case where the composition includes a compound represented by General Formula (ZI-3) or (ZI-4) as the acid generator, the content of the acid generator (the total content in a case where a plurality of kinds of the acid generators are present) is preferably 5% to 35% by mass, more preferably 8% to 30% by mass, still more preferably 9% to 30% by mass, and particularly preferably 9% to 25% by mass, with respect to the total solid content of the composition.

(C) Solvent

Examples of the solvent which can be used in a case where the respective components are dissolved to prepare an actinic ray-sensitive or radiation-sensitive resin composition include organic solvents such as alkylene glycol monoalkyl ether carboxylate, alkylene glycol monoalkyl ether, alkyl lactate ester, alkyl alkoxypropionate, a cyclic lactone having 4 to 10 carbon atoms, a monoketone compound having 4 to 10 carbon atoms, which may have a ring, alkylene carbonate, alkyl alkoxyacetate, and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactate ester include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferred examples of the monoketone compound having 4 to 10 carbon atoms, which may contain a ring, include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent that can be preferably used include solvents having a boiling point of 130° C. or higher under the conditions of normal temperature and normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, propylene carbonate, butyl butanoate, isoamyl acetate, and methyl 2-hydroxyisobutyrate.

In the present invention, the solvents may be used singly or in combination of two or more kinds thereof.

In the present invention, a mixed solvent obtained by mixing a solvent containing a hydroxyl group in its structure with a solvent not containing a hydroxyl group in its structure may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate, and among these, propylene glycol monomethyl ether and ethyl lactate are particularly preferable.

Examples of the solvent not containing a hydroxyl group include propylene glycol monomethyl ether acetate, ethylethoxypropionate, 2-heptanone, γ-butyrolactone, cyclohexanone, butyl acetate, N-methylpyrrolidone, N,N-dimethylacetamide, and dimethylsulfoxide, and among these, propylene glycol monomethyl ether acetate, ethylethoxypropionate, 2-heptanone, γ-butyrolactone, cyclohexanone, and butyl acetate are particularly preferable, and propylene glycol monomethyl ether acetate, ethylethoxypropionate, and 2-heptanone are most preferable.

The mixing ratio (mass ratio) of the solvent containing a hydroxyl group to the solvent not containing a hydroxyl group is 1/99 to 99/1, preferably 10/90 to 90/10, and more preferably 20/80 to 60/40. A mixed solvent including the solvent not containing a hydroxyl group in the amount of 50% by mass or more is particularly preferable from the viewpoint of coating evenness.

The solvent is preferably a mixed solvent of two or more kinds of solvents containing propylene glycol monomethyl ether acetate.

(D) Basic Compound

The actinic ray-sensitive or radiation-sensitive resin composition of the present invention preferably contains a basic compound in order to reduce a change in performance over time from exposure to heating.

Moreover, from the viewpoint of DOF and EL performance, it is preferable that the actinic ray-sensitive or radiation-sensitive resin composition contains the basic compound. That is, the basic compound contained in the actinic ray-sensitive or radiation-sensitive resin composition is transferred to the upper layer film during the prebake of the formed upper layer film, and some of the basic compound returns to the unexposed area of the actinic ray-sensitive or radiation-sensitive film during PEB. In this case, the exposed area has a decrease in the basic compound, and thus, an acid easily diffuses, whereas the unexposed area has an increase in the basic compound, and thus, an acid hardly diffuses. As a result of such an increase in the contrast of the acid diffusion between the exposed area and the unexposed area of the actinic ray-sensitive or radiation-sensitive film, DOF and EL are further improved.

Preferred examples of the basic compound include compounds having structures represented by Formulae (A) to (E).

(A)

(B)

(C)

(D)

-continued

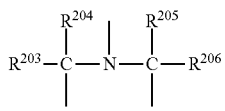
(E)

In General Formulae (A) to (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), in which $R^{201}$ and $R^{202}$ may be bonded to each other to form a ring.

With respect to the alkyl group, as the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

The alkyl group in General Formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure, an alkylamine derivative having a hydroxyl group and/or an ether bond, and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Furthermore, the compounds described as the basic compound (XC) which is contained in the composition (topcoat composition) for forming an upper layer film as described above can also be suitably used as the basic compound.

These basic compounds may be used singly or in combination of two or more kinds thereof.

The amount of the basic compound to be used is usually 0.001% to 10% by mass, and preferably 0.01% to 5% by mass, with respect to the solid content of the actinic ray-sensitive or radiation-sensitive resin composition of the present invention.

The ratio between the photoacid generator to the basic compound to be used in the actinic ray-sensitive or radiation-sensitive resin composition is preferably the photoacid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern with aging after exposure until the heat treatment. The photoacid generator/basic compound (molar ratio) is more preferably 5.0 to 200, and still more preferably 7.0 to 150.

(E) Hydrophobic Resin

The actinic ray-sensitive or radiation-sensitive resin composition of the present invention may contain a hydrophobic resin (E). As the hydrophobic resin, for example, the above-mentioned resin (XB) which is contained in the composition for forming an upper layer film can be suitably used. Further, other suitable examples of the hydrophobic resin include "[4] Hydrophobic Resin (D)" described in paragraphs [0389] to [0474] of JP2014-149409A.

The weight-average molecular weight of the hydrophobic resin (E) in terms of standard polystyrene is preferably 1,000 to 100,000, more preferably 1,000 to 50,000, and still more preferably 2,000 to 15,000.

Furthermore, the hydrophobic resin (E) may be used singly or in combination of a plurality of kinds thereof.

The content of the hydrophobic resin (E) in the composition is preferably 0.01% to 10% by mass, more preferably 0.05% to 8% by mass, and still more preferably 0.1% to 7% by mass, with respect to the total solid content in the actinic ray-sensitive or radiation-sensitive resin composition of the present invention.

(F) Surfactant

The actinic ray-sensitive or radiation-sensitive resin composition of the present invention preferably further contains a surfactant (F), and more preferably contains either one or two or more of fluorine-based and/or silicon-based surfactants (a fluorine-based surfactant, a silicon-based surfactant, or a surfactant containing both a fluorine atom and a silicon atom).

By incorporating the surfactant (F) into the actinic ray-sensitive or radiation-sensitive resin composition of the present invention, it becomes possible to form a resist pattern which is decreased in adhesiveness and development defects with good sensitivity and resolution at the time of using an exposure light source of 250 nm or less, and particularly 220 nm or less.

Examples of the fluorine-based and/or silicon-based surfactants include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), JP2002-277862A, U.S. Pat. Nos. 5,405,720A, 5,360,692A, 5,529,881A, 5,296,330A, 5,436,098A, 5,576,143A, 5,294,511A, and 5,824,451A, and the following commercially available surfactants may be used as they are.

Examples of the commercially available surfactants that can be used include fluorine-based surfactants or silicon-based surfactants such as EFTOP EF301 and EF303 (manufactured by Shin-Akita Kasei K. K.), FLORAD FC430, 431, and 4430 (manufactured by Sumitomo 3M Inc.), MEGAFAC F171, F173, F176, F189, F113, F110, F177, F120, and R08 (manufactured by DIC Corp.), SURFLON S-382, SC101, 102, 103, 104, 105, and 106 (manufactured by Asahi Glass Co., Ltd.), TROYSOL S-366 (manufactured by Troy Chemical Corp.), GF-300 and GF-150 (manufactured by Toagosei Chemical Industry Co., Ltd.), SURFLON S-393 (manufactured by Seimi Chemical Co., Ltd.), EFTOP EF121, EF122A, EF122B, RF122C, EF125M, EF135M, EF351, EF352, EF801, EF802, and EF601 (manufactured by JEMCO Inc.), PF636, PF656, PF6320, and PF6520 (manufactured by OMNOVA Solutions Inc.), and FTX-204D, 208G, 218G, 230G, 204D, 208D, 212D, 218, and 222D (manufactured by NEOS COMPANY LIMITED). In addition, Polysiloxane Polymer KP-341 (manufactured by Shin-Etsu Chemical Co., Ltd.) can also be used as the silicon-based surfactant.

Furthermore, in addition to those known surfactants as described above, a surfactant using a polymer having a fluoroaliphatic group derived from a fluoroaliphatic compound which is produced by a telomerization method (also referred to as a telomer method) or an oligomerization method (also referred to as an oligomer method), can be used as the surfactant. The fluoroaliphatic compound can be synthesized in accordance with the method described in JP2002-90991A.

As the polymer having a fluoroaliphatic group, copolymer of monomers having fluoroaliphatic groups and (poly(oxyalkylene)) acrylate and/or (poly(oxyalkylene)) methacrylate are preferable, and they may be distributed at random or may be block copolymerized. Further, examples of the poly(oxyalkylene) group include a poly(oxyethylene) group, a poly(oxypropylene) group, and a poly(oxybutylene) group. Incidentally, the polymers may be units having alkylenes different in chain length in the same chain length, such as a poly(block combination of oxyethylene, oxypropylene, and oxyethylene), and poly(block combination of oxyethylene and oxypropylene). In addition, the copolymers of monomers having fluoroaliphatic groups and (poly(oxyalkylene)) acrylate (or methacrylate) may not be only binary copolymers but also ternary or higher copolymers obtained by copolymerization of monomers having different two or more kinds of fluoroaliphatic groups or different two or more kinds of (poly(oxyalkylene)) acrylates (or methacrylates) or the like at the same time.

Examples of the commercially available surfactant include MEGAFAC F178, F-470, F-473, F-475, F-476, and F-472 (manufactured by DIC Corp.); a copolymer of an acrylate (or methacrylate) having a $C_6F_{13}$ group with a (poly(oxyalkylene)) acrylate (or methacrylate); and a copolymer of an acrylate (or methacrylate) having a $C_3F_7$ group with a (poly(oxyethylene)) acrylate (or methacrylate) and a (poly(oxypropylene)) acrylate (or methacrylate).

Moreover, in the present invention, surfactants other than fluorine-based and/or silicon-based surfactants can also be used. Specific examples thereof include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used singly or in combination of some kinds thereof.

The amount of the surfactant (F) to be used is preferably 0.01% to 10% by mass, and more preferably 0.1% to 5% by mass, with respect to the total amount (excluding the solvent) of the actinic ray-sensitive or radiation-sensitive resin composition.

(G) Onium Carboxylate Salt

The actinic ray-sensitive or radiation-sensitive resin composition of the present invention may contain an onium carboxylate salt (G). Examples of the onium carboxylate salt include a sulfonium carboxylate salt, an iodonium carboxylate salt, and an ammonium carboxylate salt. In particular, as the onium carboxylate salt (G), an iodonium salt and a sulfonium salt are preferable. Further, it is preferable that the carboxylate residue of the onium carboxylate salt (G) does not contain an aromatic group and a carbon-carbon double bond. As a particularly preferred anionic moiety, a linear, branched, or cyclic (monocyclic or polycyclic) alkylcarboxylate anion having 1 to 30 carbon atoms is preferable. Further, a carboxylate anion in which a part or all of the alkyl groups are substituted with fluorine is more preferable. An oxygen atom may be contained in the alkyl chain, by which the transparency to the light at 220 nm or less is ensured, thus, sensitivity or resolving power are enhanced, and density dependency and exposure margin are improved.

Examples of the anion of the fluorine-substituted carboxylate include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

These onium carboxylate salts (G) can be synthesized by reacting sulfonium hydroxide, iodonium hydroxide, or ammonium hydroxide and carboxylic acid with silver oxide in an appropriate solvent.

The content of the onium carboxylate salt (G) in the composition is generally 0.1% to 20% by mass, preferably 0.5% to 10% by mass, and more preferably 1% to 7% by mass, with respect to the total solid contents of the actinic ray-sensitive or radiation-sensitive resin composition.

(H) Other Additives

The actinic ray-sensitive or radiation-sensitive resin composition of the present invention can further contain a dye, a plasticizer, a light sensitizer, a light absorbent, an alkali-soluble resin, a dissolution inhibitor, a compound that promotes solubility in a developer (for example, a phenol compound with a molecular weight of 1,000 or less, an alicyclic or aliphatic compound having a carboxyl group), and the like, as desired.

Such a phenol compound having a molecular weight of 1,000 or less may be easily synthesized by those skilled in the art with reference to the method described in, for example, JP1992-122938A (JP-H04-122938A), JP1990-28531A (JP-H02-28531A), U.S. Pat. No. 4,916,210A, EP219294B, and the like.

Specific examples of the alicyclic or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

[Method for Manufacturing Electronic Device]

Moreover, the present invention also relates to a method for manufacturing an electronic device, including the above-mentioned pattern forming method of the present invention.

The electronic device of the present invention, manufactured by the method for manufacturing an electronic device of the present invention, is suitably mounted in electrical or electronic equipments (household electronic appliance, Office Automation (OA)/media-related equipment, optical equipment, telecommunication equipment, and the like).

EXAMPLES

Hereinafter, the present invention will be described in more detail with reference to Examples, but the contents of the present invention are not limited thereto.

<<Resist Compositions>>

Synthesis Example 1: Synthesis of Resin (1)

102.3 parts by mass of cyclohexanone was heated at 80° C. under a nitrogen stream. While stirring this liquid, a mixed solution of 22.2 parts by mass of a monomer represented by Structural Formula LM-2, 22.8 parts by mass of a monomer represented by Structural Formula PM-1, 6.6 parts by mass of a monomer represented by Structural Formula PM-9, 189.9 parts by mass of cyclohexanone, and 2.40 parts by mass of dimethyl 2,2'-azobisisobutyrate [V-601, manufactured by Wako Pure Chemical Industries, Ltd.] was added dropwise to the liquid for 5 hours. After completion of the dropwise addition, the solution was further stirred at 80° C. for 2 hours. The obtained reaction solution was left to be cooled, then reprecipitated with a large amount of hexane/ethyl acetate (mass ratio of 9:1) and filtered, and the obtained solid was dried in vacuum to obtain 41.1 parts by mass of a resin (1).

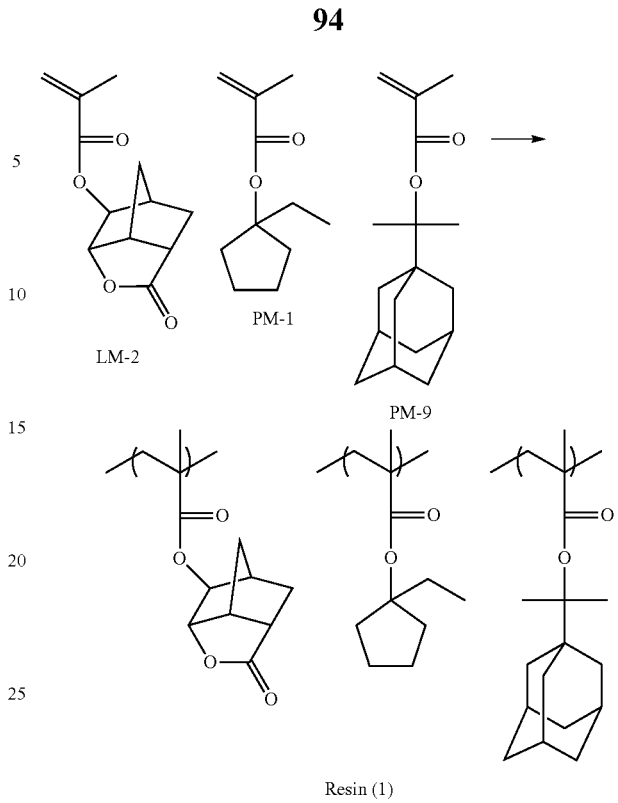

Resin (1)

The weight-average molecular weight (Mw: in terms of polystyrene) and the dispersity of the obtained resin (1), as determined by gel permeation chromatography (GPC) (carrier: tetrahydrofuran) were as follows: Mw=9,500 and Mw/Mn=1.62, respectively. The compositional ratio measured by $^{13}$C-NMR (Nuclear Magnetic Resonance) was 40/50/10 in terms of a molar ratio.

<Synthesis of Resins (2) to (13)>

The same procedure as in Synthesis Example 1 was carried out to synthesize the following resins (2) to (13) as an acid-decomposable resin.

Hereinbelow, the compositional ratios (molar ratios; corresponding to the repeating units in order from the left side), the weight-average molecular weights (Mw), and the dispersities (Mw/Mn) of the respective repeating units in the resins (1) to (13) are summarized in Table 1. These were determined by the same method as for the above-mentioned resin (1).

TABLE 1

| | Repeating unit | | | | Compositional ratio (molar ratio) | | | | Molecular weight (Mw) | Dispersity (Mw/Mn) |
|---|---|---|---|---|---|---|---|---|---|---|
| Resin (1) | LM-2 | PM-1 | PM-9 | — | 40 | 50 | 10 | — | 9,500 | 1.62 |
| Resin (2) | LM-2 | PM-12 | PM-13 | — | 40 | 40 | 20 | — | 17,000 | 1.70 |
| Resin (3) | LM-4 | PM-2 | IM-2 | — | 45 | 50 | 5 | — | 11,000 | 1.63 |
| Resin (4) | LM-2 | PM-10 | — | — | 40 | 60 | — | — | 15,000 | 1.66 |
| Resin (5) | LM-2 | PM-3 | PM-9 | IM-3 | 40 | 40 | 10 | 10 | 10,500 | 1.62 |
| Resin (6) | LM-1 | PM-10 | IM-4 | — | 40 | 50 | 10 | — | 15,500 | 1.68 |
| Resin (7) | LM-2 | PM-15 | PM-4 | — | 40 | 40 | 20 | — | 11,000 | 1.65 |
| Resin (8) | LM-3 | PM-3 | PM-14 | — | 40 | 40 | 20 | — | 10,000 | 1.64 |
| Resin (9) | LM-4 | PM-12 | PM-15 | PM-6 | 40 | 50 | 5 | 5 | 9,000 | 1.60 |
| Resin (10) | LM-2 | PM-7 | PM-8 | — | 40 | 30 | 30 | — | 8,000 | 1.63 |
| Resin (11) | LM-3 | PM-13 | IM-1 | PM-5 | 40 | 50 | 5 | 5 | 9,500 | 1.70 |
| Resin (12) | LM-2 | PM-12 | PM-9 | — | 40 | 50 | 10 | — | 17,000 | 1.65 |

TABLE 1-continued

| | Repeating unit | | | | Compositional ratio (molar ratio) | | | | Molecular weight (Mw) | Dispersity (Mw/Mn) |
|---|---|---|---|---|---|---|---|---|---|---|
| Resin (13) | LM-2 | PM-3 | PM-11 | — | 30 | 30 | 40 | — | 14,000 | 1.71 |

LM-1  LM-2  LM-3  LM-4

IM-1  IM-2  IM-3  IM-4

PM-1  PM-2  PM-3  PM-4  PM-5

PM-6  PM-7  PM-8  PM-9  PM-10

PM-11  PM-12  PM-13  PM-14  PM-15

<Preparation of Resist Compositions>

The components shown in Table 2 were dissolved in the solvents shown in the same table to prepare solutions having a concentration of the solid contents of 3.5% by mass, and the solutions were filtered through a polyethylene filter having a pore size of 0.03 μm to prepare resist compositions Re-1 to Re-16.

TABLE 2

| Resist | Acid-decomposable resin (parts by mass) | | Photoacid generator (parts by mass) | | Basic compound (parts by mass) | | Hydrophobic resin (parts by mass) | | Surfactant (parts by mass) | | Solvent (mass ratio) | | | |
|---|---|---|---|---|---|---|---|---|---|---|---|---|---|---|
| Re-1 | Resin (1) | 86.5 | B1 | 12.0 | D-1 | 1.5 | E-1 | 1.0 | | | SL-1 | 70 | SL-2 | 30 |
| Re-2 | Resin (2) | 88.7 | B2 | 10.0 | D-1 | 1.3 | E-1 | 1.5 | | | SL-1 | 95 | SL-4 | 5 |
| Re-3 | Resin (3) | 86.0 | B3 | 9.5 | D-1 | 4.5 | E-1 | 1.3 | W-1 | 0.3 | SL-1 | 60 | SL-2 | 40 |
| Re-4 | Resin (4) | 82.7 | B4 | 15.5 | D-3 | 1.8 | E-1 | 0.5 | | | SL-1 | 60 | SL-3 | 40 |
| Re-5 | Resin (5) | 90.7 | B5 | 8.5 | D-4 | 0.8 | E-1 | 0.8 | | | SL-1 | 90 | SL-3 | 10 |
| Re-6 | Resin (6) | 88.2 | B6 | 10.5 | D-5 | 1.3 | E-1 | 2.0 | | | SL-2 | 100 | | |
| Re-7 | Resin (7) | 87.8 | B7 | 11.0 | D-6 | 1.2 | E-1 | 1.7 | W-2 | 0.5 | SL-1 | 90 | SL-2 | 5 SL-4 5 |
| Re-8 | Resin (8) | 83.5 | B8 | 10.5 | D-2 | 6.0 | E-1 | 1.6 | | | SL-1 | 80 | SL-5 | 20 |
| Re-9 | Resin (9) | 87.5 | B2/B5 | 4.0/5.0 | D-1 | 3.5 | E-2 | 3.5 | | | SL-1 | 75 | SL-2 | 25 |
| Re-10 | Resin (1)/resin (10) | 43.1/40.0 | B3 | 16.0 | D-1 | 0.9 | E-2 | 1.8 | | | SL-1 | 80 | SL-3 | 20 |
| Re-11 | Resin (1) | 89.0 | B1 | 10.0 | D-5 | 1.0 | E-1 | 1.7 | | | SL-1 | 70 | SL-6 | 30 |
| Re-12 | Resin (10) | 86.5 | B1/B9 | 8.0/4.0 | D-3 | 1.5 | E-1 | 1.4 | | | SL-1 | 70 | SL-7 | 30 |
| Re-13 | Resin (11) | 88.7 | B1 | 10.0 | D-3 | 1.3 | E-2 | 2.6 | | | SL-1 | 95 | SL-4 | 5 |
| Re-14 | Resin (12) | 86.0 | B3 | 9.5 | D-1 | 4.5 | E-2 | 1.9 | W-3 | 1.0 | SL-1 | 60 | SL-3 | 40 |
| Re-15 | Resin (13) | 88.2 | B1 | 10.5 | D-5 | 1.3 | E-1 | 1.7 | | | SL-2 | 100 | | |
| Re-16 | Resin (10) | 88.2 | B10 | 10.5 | D-3 | 1.3 | | | | | SL-1 | 60 | SL-2 | 40 |

The abbreviations in Table 2 are as follows.

<Photoacid Generator>

The following compounds were used as the photoacid generator.

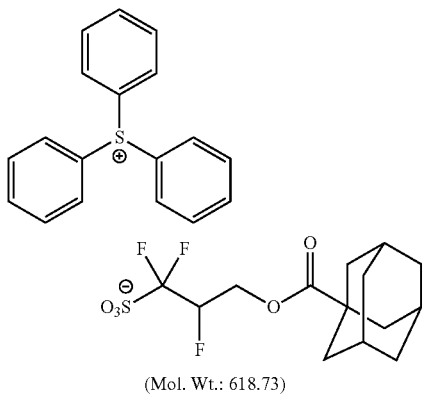

B1

(Mol. Wt.: 618.73)

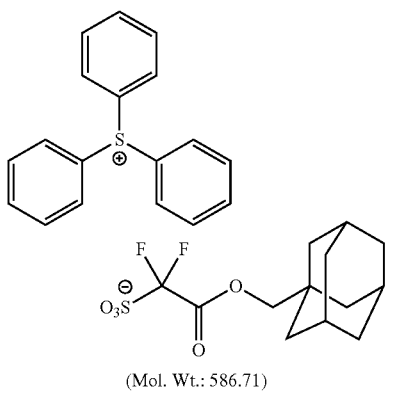

B2

(Mol. Wt.: 586.71)

-continued

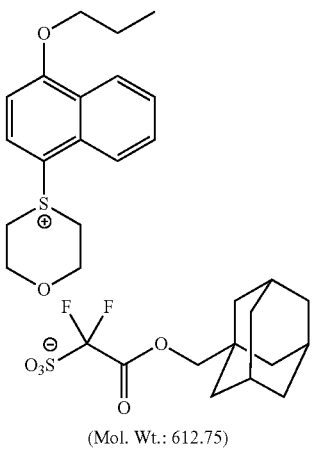

B3

(Mol. Wt.: 612.75)

B4

(Mol. Wt.: 654.71)

B5
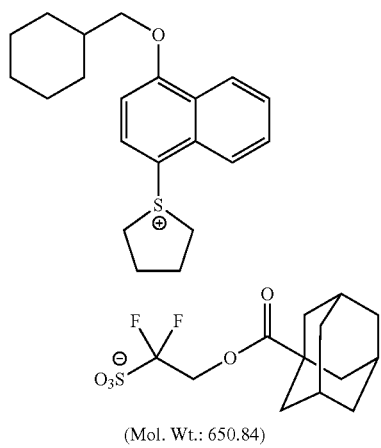
(Mol. Wt.: 650.84)
B6
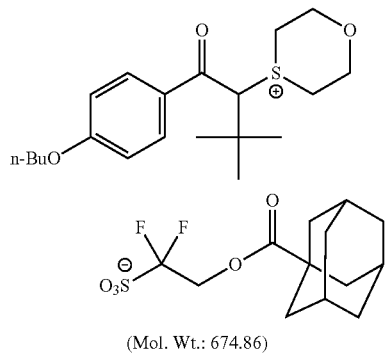
(Mol. Wt.: 674.86)
B7
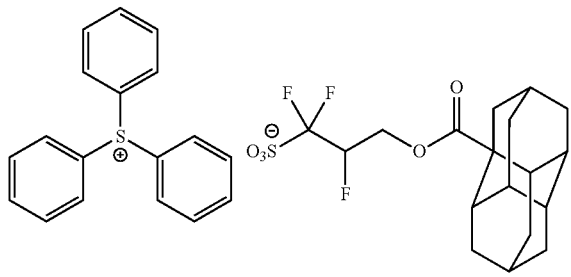
(Mol. Wt.: 670.80)
B8
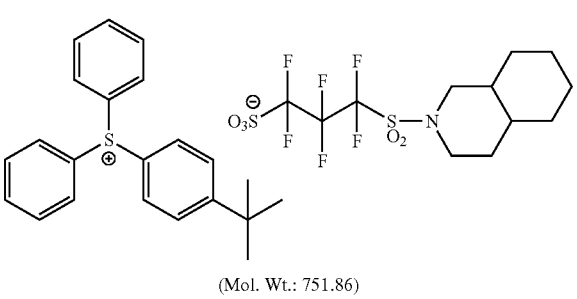
(Mol. Wt.: 751.86)
B9
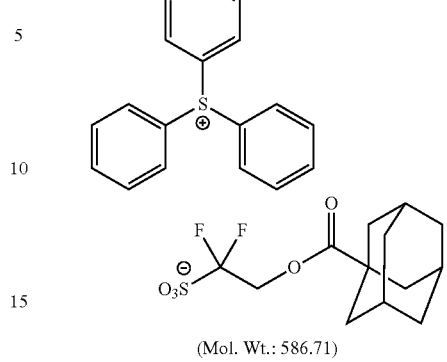
(Mol. Wt.: 586.71)
B10
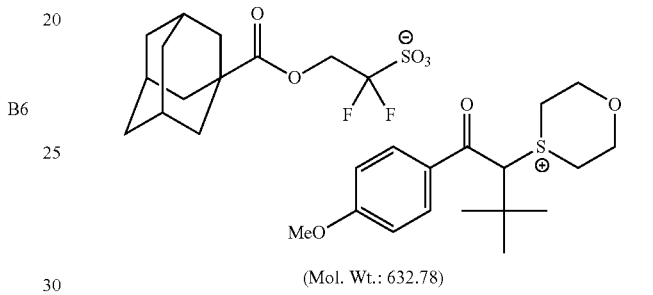
(Mol. Wt.: 632.78)
<Basic Compound>
The following compounds were used as the basic compound.
D-1
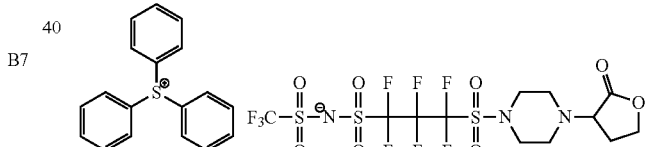
D-2
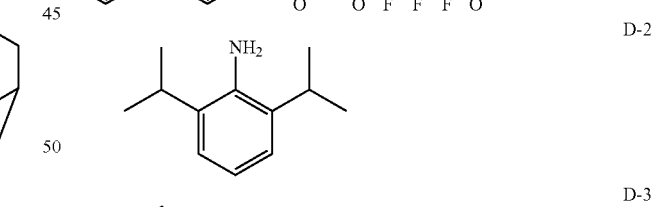
D-3
D-4
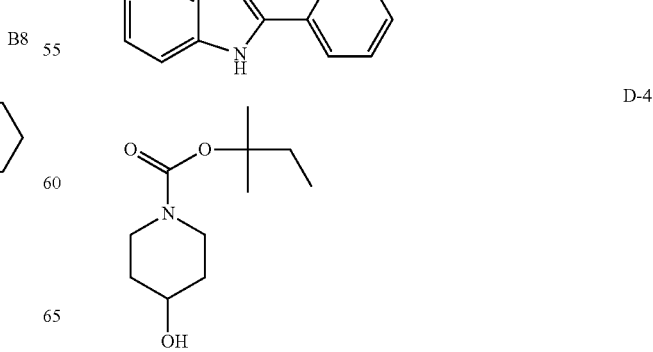

-continued

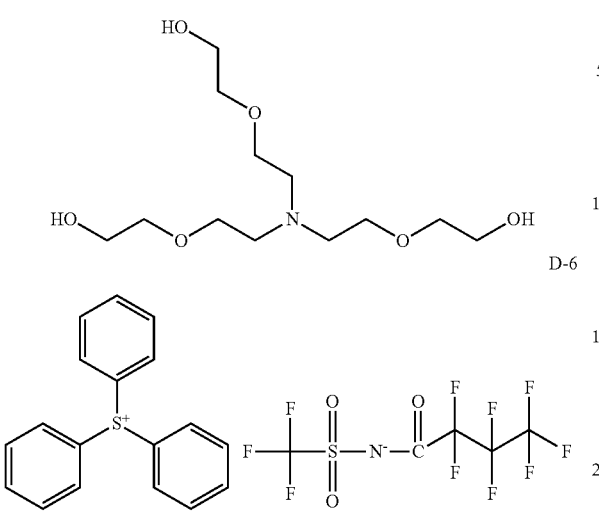

D-5

D-6

<Hydrophobic Resin>

The following resins were used as the hydrophobic resin. The compositional ratio, the weight-average molecular weight (Mw), and the dispersity (Mw/Mn) of the respective repeating units are shown together. These were determined by the same method as for the above-mentioned resin (1) in the above-mentioned resist composition.

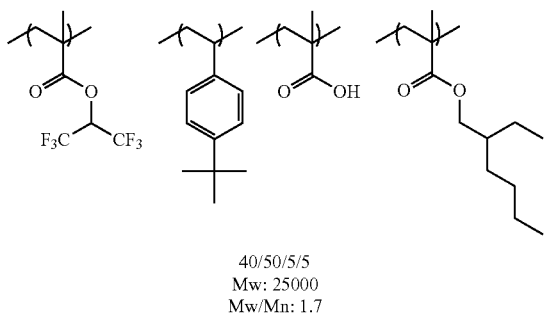

E-1

40/50/5/5
Mw: 25000
Mw/Mn: 1.7

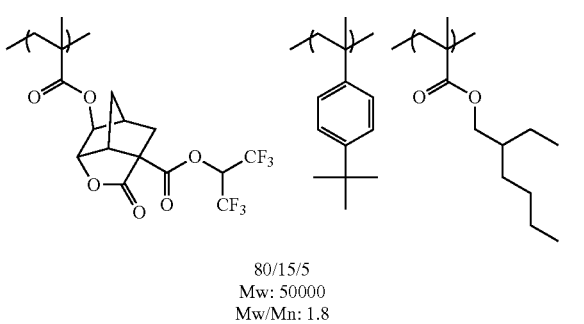

E-2

80/15/5
Mw: 50000
Mw/Mn: 1.8

<Surfactant>

The followings were used as the surfactant.

W-1: PF6320 (manufactured by OMNOVA Solutions Inc.; fluorine-based)

W-2: TROYSOL S-366 (manufactured by Troy Chemical Corp.; silicon-based)

W-3: Polysiloxane Polymer KP-341 (manufactured by Shin-Etsu Chemical Co., Ltd.; silicon-based)

<Solvent>

The followings were used as the solvent.

SL-1: Propylene glycol monomethyl ether acetate (PGMEA)

SL-2: Cyclohexanone

SL-3: Propylene glycol monomethyl ether (PGME)

SL-4: γ-Butyrolactone

SL-5: Propylene carbonate

SL-6: 2-Ethylbutanol

SL-7: Perfluorobutyl tetrahydrofuran

<<Composition for Forming Upper Layer Film>>

Synthesis Example 2: Synthesis of Resin X-1

26.1 g of cyclohexanone was put into a three-neck flask and heated at 85° C. under a nitrogen stream. A solution of 10.67 g of a monomer represented by Structural Formula XM-2, 10.71 g of a monomer represented by Structural Formula XM-3, 3.03 g of a monomer represented by Structural Formula XM-8, and a polymerization initiator, V-601 (manufactured by Wako Pure Chemical Industries, Ltd., 0.553 g), which had been dissolved in 47.6 g of cyclohexanone, was added dropwise thereto for 6 hours. The solution after the dropwise addition was further stirred at 85° C. for 2 hours to perform a reaction. The reaction solution was left to be cooled, and then 1,140 g of methanol was added dropwise thereto for 20 minutes. The precipitated powder was collected by filtration and dried to obtain a resin X-1 (20.9 g). The weight-average molecular weight in terms of standard polystyrene and the dispersity (Mw/Mn) of the obtained resin X-1 were 8,000 and 1.69, respectively. The compositional ratio measured by $^{13}$C-NMR was 40/30/30 in terms of a molar ratio.

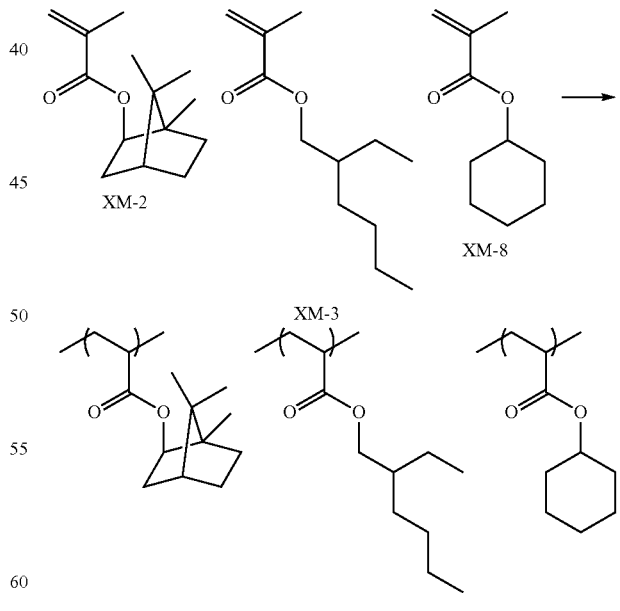

x-1

The same procedure as in Synthesis Example 2 was carried out to synthesize resins (X-2) to (X-29) described later, included in the upper layer film composition. The details thereof are shown in Table 3.

In Table 3, the resins (X-1) to (X-29) are resins having repeating units corresponding to any one of the respective monomers (XM-1) to (XM-26) at the molar ratios described in Table 3.

In addition, the content $R_F$ (% by mass) of fluorine atoms in each resin was determined by Equation (2) after the content $M_F$ of fluorine atoms in each monomer was determined by Equation (1).

Content $M_F$ (% by Mass) of Fluorine Atoms in Each Monomer $$[\text{Molecular weight of fluorine atoms in each monomer/Molecular weight of monomer}] \times 100 \quad \text{Equation (1)}$$

Content $R_F$ (% by Mass) of Fluorine Atoms in Each Resin $$= \Sigma(\text{Molecular weight of each monomer} \times \text{Content } M_F \text{ of fluorine atoms in each monomer} \times \text{Compositional ratio of each monomer})/(\text{Molecular weight of each monomer} \times \text{Compositional ratio of each monomer}) \quad \text{Equation (2)}$$

TABLE 3
| Monomer |  |  |  |  |  |  |  |  |
|---|---|---|---|---|---|---|---|---|
| | XM-1 | XM-2 | XM-3 | XM-4 | XM-5 | XM-6 | XM-7 | XM-8 |
| Molecular weight of monomer | 210.31 | 222.32 | 198.3 | 224.34 | 220.31 | 184.28 | 224.3 | 168.23 |
| Content $M_F$ (% by mass) of F in monomer | 0% | 0% | 0% | 0% | 0% | 0% | 0% | 0% |
| Monomer |  |  |  |  |  |  |  |
|---|---|---|---|---|---|---|---|
| | XM-9 | XM-10 | XM-11 | XM-12 | XM-13 | XM-14 | XM-15 |
| Molecular weight of monomer | 196.29 | 196.29 | 262.39 | 128.17 | 142.2 | 168.11 | 200.13 |
| Content $M_F$ (% by mass) of F in monomer | 0% | 0% | 0% | 0% | 0% | 34% | 38% |
| Resin | Compositional ratio (% by mole) | | | | | | | | | |
|---|---|---|---|---|---|---|---|---|---|---|
| | XM-1 | XM-2 | XM-3 | XM-4 | XM-5 | XM-6 | XM-7 | XM-8 | XM-9 | XM-10 |
| X-1 | | 40 | 30 | | | | | 30 | | |
| X-2 | | 89 | 9 | | | | | | | |
| X-3 | | | 30 | 70 | | | | | | |

TABLE 3-continued

| Resin | | | | | | XM-11 | XM-12 | XM-13 | XM-14 | XM-15 | Mw | Mw/Mn | Content $R_F$ of F in resin (% by mass) |
|---|---|---|---|---|---|---|---|---|---|---|---|---|---|
| X-1 | | | | | | | | | | | 8,000 | 1.69 | 0.0% |
| X-2 | | | | | | | | | | | 16,000 | 1.71 | 0.5% |
| X-3 | | | | | | | | | | | 10,000 | 1.68 | 0.0% |
| X-4 | | | | | | | | | | | 9,500 | 1.65 | 2.2% |
| X-5 | 80 | | | | | | | | | | 12,000 | 1.68 | 0.5% |
| X-6 | 50 | | | | | 38 | | | 2 | | 14,500 | 1.63 | 0.8% |
| X-7 | | | | | | 39 | | | | | 9,000 | 1.75 | 0.5% |
| X-8 | | 18 | | 74 | | | 29 | | 8 | | 10,000 | 1.73 | 0.0% |
| X-9 | | | 60 | | | | 40 | | 2 | | 10,000 | 1.73 | 0.0% |
| X-10 | | | | | 65 | 60 | | | 2 | 2 | 8,000 | 1.63 | 1.3% |
| X-11 | | | | | 98 | 76 | | | | | 27,000 | 2.05 | 2.3% |
| X-12 | | | 60 | | | | 30 | | | | 9,600 | 1.68 | 0.0% |
| X-13 | | | | 50 | 40 | | | | | | 11,000 | 1.59 | 1.6% |
| X-14 | | | | | 55 | 10 | | | 6 | | 9,500 | 1.70 | 0.0% |
| X-15 | | | | | | | 40 | | | | 15,000 | 1.65 | 0.0% |
| X-16 | | | | | | 39 | 29 | | | | 8,500 | 1.63 | 0.0% |
| X-17 | | 18 | | | | 35 | 50 | | 2 | 2 | 8,000 | 1.64 | 0.6% |
| X-18 | | 30 | | | | 30 | 50 | | 15 | 5 | 10,000 | 1.69 | 4.2% |
| | | 30 | | | | | | | 20 | | 9,500 | 1.70 | 5.7% |

TABLE 3-continued

| Monomer | XM-16 | XM-17 | XM-18 | XM-19 | XM-20 | XM-21 | XM-22 | XM-23 |
|---|---|---|---|---|---|---|---|---|
| Molecular weight of monomer | 294.19 | 236.11 | 220.11 | 236.11 | 240.15 | 300.22 | 218.12 | 128.17 |
| Content $M_F$ (% by mass) of F in monomer | 39% | 48% | 0% | 48% | 48% | 32% | 44% | 0% |

| Monomer | XM-24 | XM-25 | XM-26 |
|---|---|---|---|
| Molecular weight of monomer | 216.36 | 198.3 | 160.26 |
| Content $M_F$ (% by mass) of F in monomer | 0% | 0% | 0% |

| Resin | XM-16 | XM-17 | XM-18 | XM-19 | XM-20 | XM-21 | XM-22 | XM-23 |
|---|---|---|---|---|---|---|---|---|
| | | | | | Compositional ratio (% by mole) | | | |
| X-19 | | | | 40 | 35 | | | |
| X-20 | | | | | | | | 60 |

TABLE 3-continued

| Resin | Compositional ratio (% by mole) | | | | | | Mw | Mw/Mn | Content R_F (% by mass) of F in resin |
|---|---|---|---|---|---|---|---|---|---|
| | XM-24 | XM-25 | XM-26 | | | | | | |
| X-19 | | | | | | | 9,000 | 1.65 | 26.5% |
| X-20 | | 65 | | | | | 15,000 | 1.71 | 18.7% |
| X-21 | | 30 | | | | 70 | 23,000 | 1.56 | 15.8% |
| X-22 | | 20 | | | 25 | 35 | 10,000 | 1.72 | 18.6% |
| X-23 | | 10 | | | 20 | 50 | 12,000 | 1.58 | 15.5% |
| X-24 | 10 | 20 | | | | 35 | 8,000 | 1.60 | 25.1% |
| X-25 | | 40 | | | 20 | | 14,000 | 1.66 | 17.3% |
| X-26 | | | | 40 | | 50 | 28,000 | 1.57 | 28.4% |
| X-27 | 30 | | 70 | | | | 8,000 | 1.60 | 13.3% |
| X-28 | | 30 | | | | | 8,000 | 1.50 | 43.0% |
| X-29 | | 40 | | | 30 | | 6,400 | 1.50 | 29.4% |

<Preparation of Composition for Forming Upper Layer Film>

The components shown in Table 4 were dissolved in the solvents shown in the same table to prepare solutions having a concentration of the solid contents of 3.0% by mass, and the solutions were filtered through a polyethylene filter having a pore size of 0.04 μm to prepare compositions (T-1) to (T-31) and (TC-1) to (TC-5) for forming an upper layer film. In Table 4, the contents (% by mass) of the compounds and the surfactants are based on the total solid content of the composition for forming an upper layer film.

TABLE 4

| Composition for forming upper layer film | Resin XA | Resin XB | Mass ratio (XA/XB) | Basic compound XC Type | Content (% by mass) | Surfactant (% by mass) | Solvent XD |
|---|---|---|---|---|---|---|---|
| T-1 | X-1 | X-19 | 90/10 | XC-1 | 0.7% | — | 4-Methyl-2-pentanol |
| T-2 | X-2 | X-19 | 90/10 | XC-2 | 5.2% | — | Diisoamyl ether/4-methyl-2-pentanol (20% by mass/80% by mass) |
| T-3 | X-3 | X-19 | 90/10 | XC-3 | 0.8% | — | 4-Methyl-2-pentanol |
| T-4 | X-4 | X-19 | 90/10 | XC-4 | 3.6% | W-1 (0.5%) | 4-Methyl-2-pentanol |
| T-5 | X-5 | X-19 | 90/10 | XC-5 | 0.9% | — | 4-Methyl-1-pentanol |
| T-6 | X-6 | X-19 | 90/10 | XC-6 | 4.2% | — | 4-Methyl-1-pentanol |
| T-7 | X-7 | X-19 | 90/10 | XC-7 | 1.1% | — | 4-Methyl-1-pentanol |
| T-8 | X-8 | X-19 | 90/10 | XC-1 | 0.9% | — | 4-Methyl-2-pentanol |
| T-9 | X-9 | X-19 | 90/10 | XC-2 | 5.1% | — | 4-Methyl-2-pentanol |
| T-10 | X-10 | X-19 | 90/10 | XC-3 | 0.8% | — | 4-Methyl-2-pentanol |
| T-11 | X-11 | X-19 | 90/10 | XC-4 | 2.0% | — | Isobutyl isobutyrate/4-methyl-2-pentanol (60% by mass/40% by mass) |
| T-12 | X-12 | X-19 | 90/10 | XC-5 | 1.4% | — | 4-Methyl-2-pentanol |
| T-13 | X-13 | X-19 | 90/10 | XC-2 | 1.5% | — | Diisoamyl ether/4-methyl-2-pentanol (30% by mass/70% by mass) |
| T-14 | X-14 | X-19 | 90/10 | XC-2 | 1.2% | W-2 (0.8%) | Diisoamyl ether/4-methyl-2-pentanol (10% by mass/90% by mass) |
| T-15 | X-15 | X-19 | 90/10 | XC-7 | 3.2% | — | Diisoamyl ether/4-methyl-2-pentanol (40% by mass/60% by mass) |
| T-16 | X-16 | X-19 | 90/10 | XC-1 | 0.8% | — | Diisoamyl ether/4-methyl-2-pentanol (10% by mass/90% by mass) |
| T-17 | X-16 | X-20 | 90/10 | XC-1 | 0.7% | — | Diisoamyl ether/4-methyl-2-pentanol (10% by mass/90% by mass) |
| T-18 | X-16 | X-21 | 90/10 | XC-1 | 1.0% | — | 4-Methyl-2-pentanol |
| T-19 | X-16 | X-20/X-22 (50 mass %/50 mass %) | 90/10 | XC-1 | 1.2% | W-3 (1.0%) | Diisoamyl ether/4-methyl-2-pentanol (10% by mass/90% by mass) |
| T-20 | X-16 | X-23 | 90/10 | XC-1 | 0.8% | — | 4-Methyl-2-pentanol |
| T-21 | X-16 | X-24 | 90/10 | XC-1 | 7.3% | — | 4-Methyl-2-pentanol |
| T-22 | X-16 | X-25 | 90/10 | XC-1 | 0.9% | — | 4-Methyl-2-pentanol |
| T-23 | X-16 | X-26 | 90/10 | XC-1 | 8.6% | — | Diisoamyl ether/4-methyl-2-pentanol (10% by mass/90% by mass) |
| T-24 | X-16/X-15 (70 mass %/30 mass %) | X-19 | 90/10 | XC-1/XC-7 | 0.7%/0.2% | — | 4-Methyl-2-pentanol |
| T-25 | X-16 | X-19 | 95/5 | XC-1 | 0.8% | — | 4-Methyl-2-pentanol |
| T-26 | X-16 | X-19 | 85/15 | XC-1 | 0.8% | — | 4-Methyl-2-pentanol |
| T-27 | X-16 | X-19 | 81/19 | XC-1 | 0.8% | — | n-Decane/4-methyl-2-pentanol (25% by mass/75% by mass) |
| T-28 | X-16 | X-19 | 75/25 | XC-1 | 0.8% | — | Diisoamyl ether/n-decane (75% by mass/25% by mass) |
| T-29 | X-17 | X-19 | 90/10 | XC-1 | 0.8% | — | 4-Methyl-2-pentanol |
| T-30 | X-18 | X-19 | 90/10 | XC-1 | 0.8% | — | 4-Methyl-2-pentanol |
| T-31 | X-16 | X-27 | 90/10 | XC-1 | 0.8% | — | 4-Methyl-2-pentanol |
| T-32 | X-7 | X-19 | 90/10 | XC-7 | 1.1% | — | Diisoamyl ether/4-methyl-2-pentanol (10% by mass/90% by mass) |
| TC-1 | X-16 | — | 100/0 | — | — | — | 4-Methyl-2-pentanol |
| TC-2 | X-16 | X-19 | 90/10 | — | — | — | 4-Methyl-2-pentanol |
| TC-3 | X-16 | — | 100/0 | XC-1 | 0.8% | — | 4-Methyl-2-pentanol |
| TC-4 | X-29 | X-28 | 50/50 | — | — | — | Diisoamyl ether/4-methyl-2-pentanol (20% by mass/80% by mass) |
| TC-5 | X-28 | — | 100/0 | XC-8 | 0.5% | — | Diisoamyl ether/4-methyl-2-pentanol (20% by mass/80% by mass) |

The abbreviations in the tables are shown below.
<Basic Compound>
The followings are used as the basic compound.

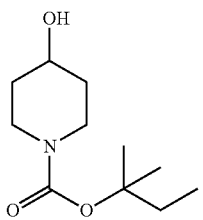
XC-1

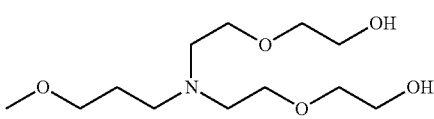
XC-2

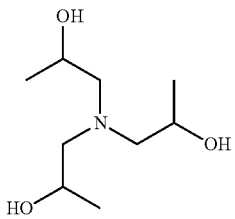
XC-3

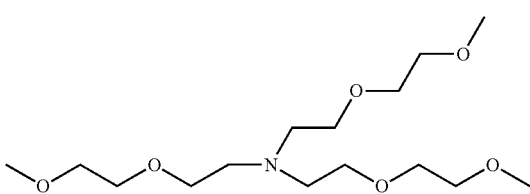
XC-4

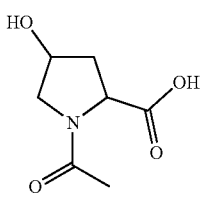
XC-5

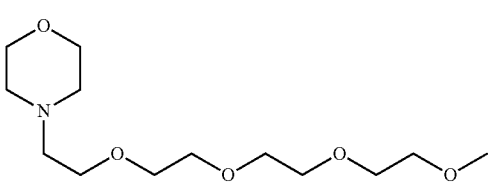
XC-6

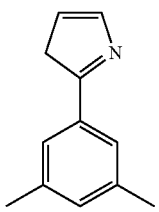
XC-7

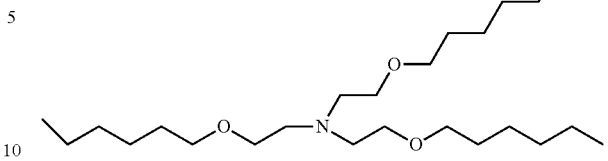
XC-8

<Surfactant>

The followings were used as the surfactant.

W-1: PF6320 (manufactured by OMNOVA Solutions Inc.; fluorine-based)

W-2: TROYSOL S-366 (manufactured by Troy Chemical Corp.; silicon-based)

W-3: Polysiloxane Polymer KP-341 (manufactured by Shin-Etsu Chemical Co., Ltd.; silicon-based)

[Receding Contact Angle]

The receding contact angles of the upper layer films with respect to water in a case of forming the upper layer films using the compositions for forming an upper layer film prepared above were measured by the following method.

Each of the compositions for forming an upper layer film was applied onto a silicon wafer by spin coating, and dried at 100° C. for 60 seconds to form a film (with a film thickness of 120 nm). With regard to the obtained film, the receding contact angles (RCA) of water droplets were measured using a dynamic contact angle meter (manufactured by Kyowa Interface Science Co., Ltd.) by an expansion-contraction method.

The liquid droplets (with an initial liquid droplet size of 35 μL) were added dropwise onto the film, and suctioned at a rate of 6 L/sec for 5 seconds, and the receding contact angle (RCA) at a time of the dynamic contact angle during suction being stabilized was determined with the measurement environments of 23° C. and a relative humidity of 45%.

[Image Performance Test]

Using the resist composition and the composition for forming an upper layer film, each prepared above, resist patterns were formed and evaluated by the following methods.

<Formation of Hole Pattern>

An organic antireflection film, ARC29SR (manufactured by Brewer Science, Inc.), was applied onto a silicon wafer and baked at 205° C. for 60 seconds to form an antireflection film having a film thickness of 86 nm. A resist composition shown in Table 5 was applied thereonto and baked at 100° C. for 60 seconds to form a resist film having a film thickness described in the same table.

Next, a composition for forming an upper layer film shown in Table 5 was applied on the resist film and then baked at a PB temperature (unit: ° C.) shown in the same table for 60 seconds to form an upper layer film having a film thickness shown in the same table.

Subsequently, the resist film having the upper layer film formed thereon was subjected to pattern exposure via a squarely arrayed halftone mask (in which the hole portions are shielded) with hole portions of 65 nm and pitches between holes of 100 nm, using an ArF excimer laser liquid immersion scanner (manufactured by ASML; XT1700i, NA1.20, C-Quad, outer sigma 0.730, inner sigma 0.630, and XY deflection). Ultrapure water was used as the immersion liquid.

Thereafter, heating (post-exposure bake: PEB) was carried out at 90° C. for 60 seconds. Then, development was carried out by puddling for 30 seconds using an organic developer described in Table 5, and rinsing was carried out by puddling for 30 seconds using a rinsing liquid described in the same table. Subsequently, a hole pattern with a hole diameter of 50 nm was obtained by rotating the wafer at a rotation speed of 2,000 rpm for 30 seconds.

<Depth of Focus (DOF)>

Exposure and development were carried out by changing the conditions of the exposure focus at an interval of 20 nm in the focus direction, in the exposure dose for forming a hole pattern with a hole diameter of 50 nm in the conditions for exposure and development of (Formation of Hole Pattern) above. The hole diameter (CD) of each of the obtained patterns was measured using a line-width critical dimension scanning electron microscope SEM (S-9380, Hitachi High-Technologies Corporation), and a focus corresponding to the minimum value or the maximum value in a curve obtained by plotting the respective CDs was defined as the best focus. In a case where the focus was changed around the best focus, a variation width of the focus tolerating a hole diameter of 50 nm±10%, that is, the depth of focus (DOF, unit: nm) was calculated. A value thereof indicates better performance. The results are shown in Table 6.

<Exposure Latitude (EL)>

The hole size was observed using a critical dimension scanning electron microscope (SEM, S-9380II, Hitachi High-Technologies Corporation), and the optimal exposure dose at which a contact hole pattern with a hole portion of 50 nm on average was resolved was defined as a sensitivity ($E_{opt}$) (mJ/cm$^2$). Then, the exposure dose at a time of the line width reaching ±10% of 50 nm (that is, 45 nm and 55 nm) which were desired values was determined, based on the determined optimal exposure dose ($E_{opt}$). Then, an exposure latitude (EL, unit: %) defined by the following equation was calculated. As the value of EL is higher, the change in performance due to a change in the exposure dose is smaller, which is thus good. The results are shown in Table 6.

[EL (%)]=[(Exposure dose at a time of the hole portion reaching 45 nm)−(Exposure dose at a time of the hole portion reaching 55 nm)]/$E_{opt}$×100

TABLE 5

| No. | Resist composition | Film thickness (nm) of resist | Composition for forming upper layer film | Film thickness (nm) of upper layer film | PB after forming upper layer film | PEB | Organic developer | Rinsing liquid | EL (%) | DOF (nm) | Receding contact angle (°) |
|---|---|---|---|---|---|---|---|---|---|---|---|
| Example 1 | Re-15 | 90 | T-1 | 90 | 90° C./60 s | 90° C./60 s | Butyl acetate | 4-Methyl-2-heptanol | 17.1 | 110 | 85 |
| Example 2 | Re-5 | 90 | T-2 | 60 | 90° C./60 s | 90° C./60 s | Butyl acetate | 4-Methyl-2-heptanol | 16.9 | 110 | 84 |
| Example 3 | Re-9 | 90 | T-3 | 70 | 90° C./60 s | 90° C./60 s | Butyl acetate | 4-Methyl-2-heptanol | 17.2 | 110 | 85 |
| Example 4 | Re-13 | 90 | T-4 | 30 | 100° C./60 s | 90° C./60 s | Butyl acetate | 4-Methyl-2-heptanol | 16 | 100 | 84 |
| Example 5 | Re-15 | 85 | T-5 | 60 | 90° C./60 s | 90° C./60 s | Butyl acetate | 4-Methyl-2-heptanol | 14.2 | 80 | 84 |
| Example 6 | Re-11 | 90 | T-6 | 50 | 90° C./60 s | 90° C./60 s | Butyl acetate | 4-Methyl-2-heptanol | 13.8 | 80 | 84 |
| Example 7 | Re-15 | 70 | T-7 | 70 | 100° C./60 s | 90° C./60 s | Butyl acetate | 4-Methyl-2-heptanol | 14.1 | 80 | 84 |
| Example 8 | Re-12 | 90 | T-8 | 50 | 90° C./60 s | 90° C./60 s | Butyl acetate | 4-Methyl-2-heptanol | 17.3 | 110 | 85 |
| Example 9 | Re-6 | 90 | T-9 | 90 | 90° C./60 s | 90° C./60 s | Butyl acetate | 4-Methyl-2-heptanol | 16.2 | 100 | 84 |
| Example 10 | Re-1 | 90 | T-10 | 90 | 90° C./60 s | 90° C./60 s | Butyl acetate | 4-Methyl-2-heptanol | 16.1 | 100 | 84 |
| Example 11 | Re-5 | 85 | T-11 | 60 | 90° C./60 s | 90° C./60 s | Butyl acetate | — | 14.9 | 110 | 85 |
| Example 12 | Re-13 | 90 | T-12 | 70 | 90° C./60 s | 90° C./60 s | 2-Heptanone | 4-Methyl-2-heptanol | 15.8 | 100 | 84 |
| Example 13 | Re-2 | 90 | T-13 | 30 | 90° C./60 s | 90° C./60 s | Butyl acetate | 4-Methyl-2-heptanol | 18.2 | 120 | 85 |
| Example 14 | Re-16 | 90 | T-14 | 60 | 100° C./60 s | 90° C./60 s | Butyl acetate | 4-Methyl-2-heptanol | 18.1 | 120 | 85 |
| Example 15 | Re-2 | 90 | T-15 | 50 | 90° C./60 s | 90° C./60 s | Butyl acetate | — | 17.3 | 110 | 85 |
| Example 16 | Re-14 | 85 | T-16 | 70 | 90° C./60 s | 90° C./60 s | Butyl acetate | 4-Methyl-2-heptanol | 16.9 | 110 | 84 |
| Example 17 | Re-13 | 70 | T-17 | 50 | 90° C./60 s | 90° C./60 s | Butyl acetate | 4-Methyl-2-heptanol | 17 | 110 | 84 |
| Example 18 | Re-7 | 85 | T-18 | 100 | 100° C./60 s | 90° C./60 s | Butyl acetate | 4-Methyl-2-heptanol | 16 | 100 | 84 |
| Example 19 | Re-7 | 100 | T-19 | 90 | 90° C./60 s | 90° C./60 s | Butyl acetate | 4-Methyl-2-heptanol | 16.9 | 110 | 84 |
| Example 20 | Re-17 | 90 | T-20 | 60 | 90° C./60 s | 90° C./60 s | Butyl acetate | 4-Methyl-2-heptanol | 16.4 | 100 | 84 |
| Example 21 | Re-3 | 90 | T-21 | 70 | 90° C./60 s | 90° C./60 s | Butyl acetate | 4-Methyl-2-heptanol | 16.3 | 100 | 84 |
| Example 22 | Re-15 | 90 | T-22 | 30 | 100° C./60 s | 90° C./60 s | Butyl acetate | 4-Methyl-2-heptanol | 15.9 | 100 | 84 |
| Example 23 | Re-1 | 90 | T-23 | 60 | 90° C./60 s | 90° C./60 s | Butyl propionate | 4-Methyl-2-heptanol | 17 | 110 | 84 |
| Example 24 | Re-8 | 90 | T-24 | 50 | 90° C./60 s | 90° C./60 s | Butyl acetate | 4-Methyl-2-heptanol | 16.2 | 100 | 84 |
| Example 25 | Re-11 | 90 | T-25 | 70 | 90° C./60 s | 90° C./60 s | Butyl acetate | 4-Methyl-2-heptanol | 15.7 | 100 | 84 |
| Example 26 | Re-4 | 90 | T-26 | 50 | 90° C./60 s | 90° C./60 s | Butyl acetate | n-decane | 16.1 | 100 | 84 |
| Example 27 | Re-15 | 90 | T-27 | 90 | 90° C./60 s | 90° C./60 s | Butyl acetate | 4-Methyl-2-heptanol | 15.8 | 100 | 84 |
| Example 28 | Re-10 | 90 | T-28 | 90 | 90° C./60 s | 90° C./60 s | Butyl acetate | 4-Methyl-2-heptanol | 12.2 | 60 | 85 |
| Example 29 | Re-15 | 90 | T-29 | 90 | 90° C./60 s | 90° C./60 s | Butyl acetate | 4-Methyl-2-heptanol | 15.6 | 100 | 84 |
| Example 30 | Re-15 | 90 | T-30 | 90 | 90° C./60 s | 90° C./60 s | Butyl acetate | 4-Methyl-2-heptanol | 15.1 | 90 | 83 |
| Example 31 | Re-15 | 90 | T-31 | 90 | 90° C./60 s | 90° C./60 s | Butyl acetate | 4-Methyl-2-heptanol | 14.8 | 90 | 83 |
| Example 32 | Re-15 | 70 | T-32 | 70 | 100° C./60 s | 90° C./60 s | Butyl acetate | 4-Methyl-2-heptanol | 15.1 | 90 | 84 |
| Comparative Example 1 | Re-14 | 90 | TC-1 | 90 | 90° C./60 s | 90° C./60 s | Butyl acetate | 4-Methyl-2-heptanol | 11.3 | 50 | 78 |
| Comparative Example 2 | Re-9 | 90 | TC-2 | 90 | 90° C./60 s | 90° C./60 s | Butyl acetate | 4-Methyl-2-heptanol | 10.9 | 50 | 78 |
| Comparative Example 3 | Re-15 | 90 | TC-3 | 90 | 90° C./60 s | 90° C./60 s | Butyl acetate | 4-Methyl-2-heptanol | 11.4 | 50 | 78 |
| Comparative Example 4 | Re-15 | 90 | TC-4 | 90 | 90° C./60 s | 90° C./60 s | 2-Heptanone | — | 10.8 | 50 | 83 |
| Comparative Example 5 | Re-15 | 90 | TC-5 | 90 | 90° C./60 s | 90° C./60 s | 2-Heptanone | — | 11.1 | 50 | 83 |

What is claimed is:

1. A pattern forming method comprising:
   a step of forming an actinic ray-sensitive or radiation-sensitive film on a substrate, using an actinic ray-sensitive or radiation-sensitive resin composition;
   a step of forming an upper layer film on the actinic ray-sensitive or radiation-sensitive film, using a composition for forming an upper layer film;
   a step of exposing a laminate film including the actinic ray-sensitive or radiation-sensitive film and the upper layer film, through a mask; and
   a step of subjecting the exposed laminate film to development using a developer including an organic solvent in an amount of from 90% to 100% by mass with respect to the total amount of the developer, thereby forming a negative tone pattern,
   wherein the composition for forming an upper layer film contains a resin (XA), a resin (XB) containing fluorine atoms, a basic compound (XC), and a solvent (XD), and the resin (XA) is a resin not containing fluorine atoms or is a resin containing fluorine atoms wherein the resin (XA) is a resin having a lower content of fluorine atoms based on the mass of the resin (XA) than the content of fluorine atoms in the resin (XB), based on the mass of the resin (XB), and
   the basic compound (XC) is at least one selected from the group consisting of the following compounds (1) to (5):
   (1) a compound represented by General Formula (BS-1):

(BS-1)

in General Formula (BS-1),
   R's each independently represent a hydrogen atom or an organic group, provided that at least one of three R's is a linear or branched alkyl group having an alkoxy group as a substituent;
   (2) a compound having nitrogen-containing heterocyclic structure, wherein the compound is selected from the group consisting from a compound having a piperidine structure, a compound having a pyridine structure, a compound having an antipyrine structure, and a compound having two or more ring structures;
   (3) an amine compound having a phenoxy group;
   (4) an ammonium salt, wherein the anion of the ammonium salt is halide, sulfonate, borate or phosphate; and
   (5) a low molecular compound having a nitrogen atom and a group capable of leaving by action of an acid, wherein the compound has an acetal group, a carbonate group, a tertiary hydroxyl group or a hemiaminal ether group.

2. The pattern forming method according to claim 1, wherein the content of the resin (XB) is 20% by mass or less with respect to the total solids content of the composition for forming an upper layer film.

3. The pattern forming method according to claim 1, wherein the composition for forming an upper layer film contains at least one secondary alcohol solvent as the solvent (XD).

4. The pattern forming method according to claim 1, wherein the composition for forming an upper layer film contains as the solvent (XD) at least one secondary alcohol solvent and at least one ether-based solvent selected from the group consisting of ethylene glycol monomethyl ether, propylene glycol monomethyl ether, diethylene glycol monomethyl ether, triethylene glycol monoethyl ether, methoxymethylbutanol, dioxane, tetrahydrofuran, isoamyl ether and diisoamyl ether.

5. The pattern forming method according to claim 1, wherein the content of fluorine atoms in the resin (XA) is 0% by mass to 5% by mass.

6. The pattern forming method according to claim 1, wherein the content of fluorine atoms in the resin (XB) is 15% by mass or more.

7. The pattern forming method according to claim 1, wherein the difference between the content of fluorine atoms in the resin (XA) and the content of fluorine atoms in the resin (XB) is 10% by mass or more.

8. The pattern forming method according to claim 1, wherein the resin (XA) is a resin not containing fluorine atoms.

9. The pattern forming method according to claim 1, wherein the exposure is liquid immersion exposure.

10. A method for manufacturing an electronic device, comprising the pattern forming method according to claim 1.

* * * * *